(12) United States Patent
Deng et al.

(10) Patent No.: US 12,378,262 B2
(45) Date of Patent: Aug. 5, 2025

(54) ORGANIC COMPOUND AND APPLICATION THEREOF

(71) Applicant: Wuhan Tianma Micro-Electronics Co., Ltd., Wuhan (CN)

(72) Inventors: Dongyang Deng, Wuhan (CN); Ying Liu, Wuhan (CN); Lei Zhang, Wuhan (CN); Wei Gao, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 802 days.

(21) Appl. No.: 17/583,266

(22) Filed: Jan. 25, 2022

(65) Prior Publication Data

US 2022/0144862 A1    May 12, 2022

(30) Foreign Application Priority Data

Sep. 24, 2021    (CN) .................. 202111122111.6

(51) Int. Cl.
| | |
|---|---|
| C07F 5/02 | (2006.01) |
| H10K 50/11 | (2023.01) |
| H10K 85/30 | (2023.01) |
| H10K 85/40 | (2023.01) |
| H10K 85/60 | (2023.01) |
| H10K 101/10 | (2023.01) |
| H10K 101/20 | (2023.01) |
| H10K 101/30 | (2023.01) |
| H10K 101/40 | (2023.01) |

(52) U.S. Cl.
CPC ........... *C07F 5/027* (2013.01); *H10K 85/322* (2023.02); *H10K 85/40* (2023.02); *H10K 85/615* (2023.02); *H10K 85/636* (2023.02); *H10K 85/654* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 2101/20* (2023.02)

(58) Field of Classification Search
CPC ..... C07F 5/027; C07F 7/0816; H10K 85/322; H10K 85/40; H10K 85/615; H10K 85/636; H10K 85/654; H10K 85/6572; H10K 85/6574; H10K 85/6576; H10K 50/11; H10K 2101/10; H10K 2101/30; H10K 2101/40; H10K 2101/20; H10K 85/631; H10K 85/657; H10K 85/658; C09K 11/06; C09K 2211/1007; C09K 2211/1011; C09K 2211/1014; C09K 2211/1029; C09K 2211/1033; C09K 2211/1037; C09K 2211/104; C09K 2211/1044; C09K 2211/1059; C09K 2211/1088; C09K 2211/1092; C09K 2211/1096

See application file for complete search history.

(56) References Cited

U.S. PATENT DOCUMENTS

| | | | |
|---|---|---|---|
| 2015/0031896 A1* | 1/2015 | Vestweber | C07C 13/62 564/429 |
| 2015/0236274 A1* | 8/2015 | Hatakeyama | H10K 85/631 548/405 |
| 2020/0020866 A1 | 1/2020 | Sakamoto et al. | |

FOREIGN PATENT DOCUMENTS

| | | |
|---|---|---|
| KR | 20180112722 A | 10/2018 |
| KR | 20190037174 A | 4/2019 |

OTHER PUBLICATIONS

Hirai, M., Tanaka, N., Sakai, M., & Yamaguchi, S. (2019). Structurally constrained boron-, nitrogen-, silicon-, and phosphorus-centered polycyclic π-conjugated systems. Chemical reviews, 119(14), 8291-8331. (Year: 2019).*
Lee, Y. H., Lee, W., Lee, T., Lee, D., Jung, J., Yoo, S., & Lee, M. H. (2021). Blue TADF emitters based on B-heterotriangulene acceptors for highly efficient OLEDs with reduced efficiency roll-off. ACS Applied Materials & Interfaces, 13(38), 45778-45788. (Year: 2021).*

\* cited by examiner

*Primary Examiner* — Dawn L Garrett
(74) *Attorney, Agent, or Firm* — KDW FIRM PLLC

(57) ABSTRACT

Provided are an organic compound and use thereof. The organic compound has a structure shown in Formula I. Through molecular structure design, the organic compound is endowed with suitable HOMO and LUMO energy levels, which is conducive to matching energy levels of compounds in adjacent layers and achieving efficient exciton recombination. The organic compound has small overlap of HOMO/LUMO energy level, high singlet energy level $E_S$, high triplet energy level $E_T$ and small energy level difference $\Delta E_{ST}$, which is conducive to reverse intersystem crossing and achieving higher luminescence efficiency. The organic compound molecule has high stability and low stacking degree, which is conducive to reducing concentration quenching and has excellent thermal and film stability. The organic compound is suitable as TADF materials, which is use for OLED devices, conducive to preparing OLED devices, can improve luminescence efficiency and stability of devices, reduce turn-on voltage and extend lifetime of devices.

16 Claims, 1 Drawing Sheet

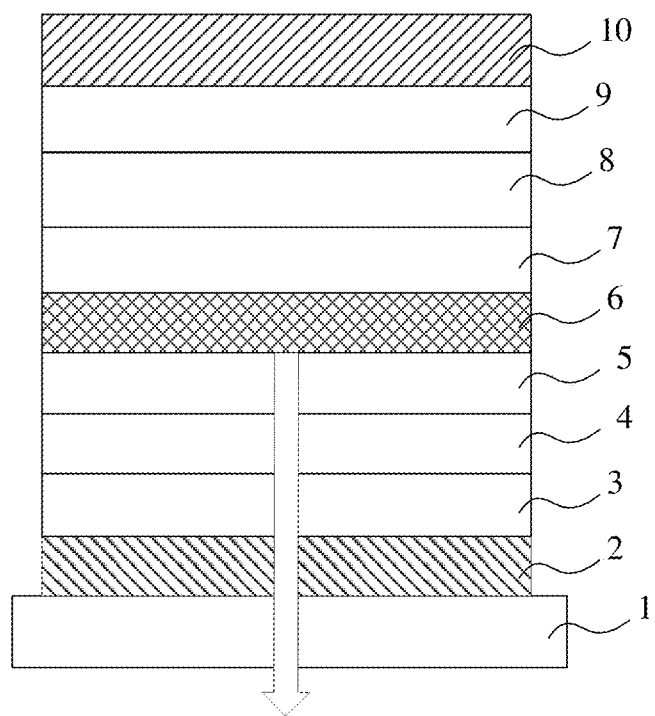

ORGANIC COMPOUND AND APPLICATION THEREOF

CROSS-REFERENCE TO RELATED APPLICATION(S)

This application claims priority to Chinese Patent Application No. CN 202111122111.6 filed Sep. 24, 2021, the disclosure of which is incorporated herein by reference in its entirety.

TECHNICAL FIELD

The present disclosure belongs to the technical field of organic electroluminescent materials and, in particular, to an organic compound and an application thereof.

BACKGROUND

Organic electroluminescence technology is one of the most promising photovoltaic technologies. Since the emergence of organic light-emitting diodes (OLEDs) in 1987, the organic light-emitting diodes have attracted high attention from scientific and industrial circles. Compared with inorganic electroluminescent devices, the organic light-emitting diodes, which have the advantages of self-luminescence, a high contrast, a wide color gamut, flexibility, low power consumption and the like, have been successfully applied commercially and widely used in various fields such as flexible display, flat panel display and solid-state lighting.

An OLED device typically has a sandwich-like laminated structure and includes a cathode, an anode and an organic layer sandwiched between two electrodes. The organic layer includes a light-emitting layer and functional layers having an auxiliary transport property such as an electron transport layer, a hole transport layer, a hole injection layer, an electron injection layer, an electron blocking layer and a hole blocking layer. When a voltage is applied across the two electrodes of the OLED device, holes generated by the anode and electrons generated by the cathode are injected into the light-emitting layer, and the holes and the electrons are recombined in the light-emitting layer to generate excitons so that light emission is achieved. In the organic layer of the OLED device, the property of the light-emitting layer is very important, which directly determines luminescence performance of the OLED device.

Studies have shown that according to a luminescence mechanism, materials used for the light-emitting layer of the OLED mainly include four types: a fluorescent material, a phosphorescent material, a triplet-triplet annihilation (TTA) material and a thermally activated delayed fluorescence (TADF) material. A singlet excited state $S_1$ of the fluorescent material returns to a ground state $S_0$ through radiation transition. According to spin-statistics, a ratio of singlet excitons to triplet excitons among the excitons is 1:3, so a maximum internal quantum yield of the fluorescent material is not more than 25%. According to the Lambertian emission pattern, the light extraction efficiency is about 20%, so the external quantum efficiency (EQE) of the OLED device based on the fluorescent material is generally not more than 5%. A triplet excited state $T_1$ of the phosphorescent material directly decays to the ground state $S_0$ through radiation. Due to a heavy atom effect, intersystem crossing inside a molecule can be improved through spin coupling effect, and 75% of the triplet excitons can be directly used, achieving emission with both $S_1$ and $T_1$ involved in at room temperature. Theoretically, a maximum internal quantum yield can reach 100%. According to the Lambertian emission pattern, the light extraction efficiency is about 20%, so that the EQE of the OLED device based on the phosphorescent material can reach 20%. However, the phosphorescent material is basically complexes of heavy metals such as Ir, Pt, Os, Re and Ru, which have a relatively high production cost and are not conducive to large-scale production. Moreover, at a high current density, the phosphorescent material has severe efficiency roll-off, and a phosphorescent OLED device has poor stability. In the TTA material, two triplet excitons interact to generate one singlet exciton which returns to the ground state $S_0$ through the radiation transition. Two adjacent triplet excitons are recombined to generate one molecule in the singlet excited state with a higher energy level and one molecule in the ground state. However, since two triplet excitons generate one singlet exciton, a theoretical maximum internal quantum yield can only reach 62.5%. To prevent relatively severe efficiency roll-off, the concentration of the triplet excitons needs to be regulated in this process.

In the TADF material, when an energy level difference between the state $S_1$ and the state $T_1$ is relatively small, at a certain temperature, reverse intersystem crossing (RISC) occurs inside the molecule, excitons in the state $T_1$ are converted to the state $S_1$ by absorbing ambient heat, and then the excitons decay from the state $S_1$ to the ground state $S_0$ through radiation. The TADF material can utilize the 75% triplet excitons and the 25% singlet excitons simultaneously. A theoretical maximum internal quantum yield can reach 100%. The TADF material is mainly organic compounds and requires no rare metal elements, resulting in a low production cost. Moreover, the TADF material can be chemically modified by various methods to achieve further optimization of performance.

Since the theoretical maximum internal quantum yields of the fluorescent material and the TTA material are low and the phosphorescent material has a high cost, the TADF material is favored in the development of the light-emitting layer of the OLED. However, a few TADF materials have been found so for and the luminescence performance of the TADF materials has a lot of room for improvement. Therefore, it is urgent to develop TADF material with more types, better performance and lower costs in the art to further improve the comprehensive performance of the OLED device.

SUMMARY

In order to develop TADF material with more types, better performance and lower costs, a first aspect of the present disclosure is to provide an organic compound having a structure represented by Formula I:

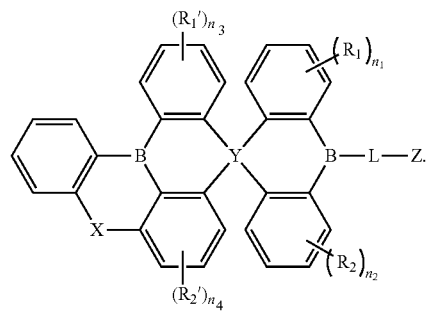

Formula I

In Formula I, X is selected from O, S, NR$_3$, CR$_4$R$_5$ or SiR$_6$R$_7$.

In Formula I, Y is C or Si.

In Formula I, L is selected from any one of a single bond, substituted or unsubstituted C6-C30 arylene, or substituted or unsubstituted C3-C30 heteroarylene. When L is the single bond, it means that the group Z is linked to a B atom by the single bond.

In Formula I, Z is selected from any one of substituted or unsubstituted C6-C30 aryl, substituted or unsubstituted C3-C30 heteroaryl, substituted or unsubstituted C6-C30 arylamine, or substituted or unsubstituted C6-C30 heteroarylamine.

In Formula I, R$_1$, R$_2$, R$_1$' and R$_2$' are each independently selected from any one of deuterium, halogen, cyano, substituted or unsubstituted C1-C30 linear or branched alkyl, substituted or unsubstituted C3-C30 cycloalkyl, C1-C30 alkoxy, substituted or unsubstituted C6-C30 aryl, substituted or unsubstituted C3-C30 heteroaryl, substituted or unsubstituted C6-C30 arylamine, or substituted or unsubstituted C6-C30 heteroarylamine.

R$_3$, R$_4$, R$_5$, R$_6$ and R$_7$ are each independently selected from any one of hydrogen, deuterium, substituted or unsubstituted C1-C30 linear or branched alkyl, substituted or unsubstituted C6-C30 aryl, or substituted or unsubstituted C3-C30 heteroaryl.

In Formula I, $n_1$, $n_2$, $n_3$ and $n_4$ each represent the number of groups, wherein $n_1$, $n_2$ and $n_3$ are each independently selected from an integer from 0 to 4, for example, may be 0, 1, 2, 3 or 4, and $n_4$ is selected from an integer from 0 to 3, for example, may be 0, 1, 2 or 3.

The organic compound provided by the present disclosure, through a design of its molecular structure, has a suitable HOMO energy level and LUMO energy level, which is conducive to matching energy levels of compounds in adjacent layers and achieving efficient exciton recombination. Moreover, the organic compound has a relatively high singlet energy level E$_S$, a relatively high triplet energy level E$_T$ and a relatively small energy level difference $\Delta E_{ST}$ between a singlet state and a triplet state, which is conducive to reverse intersystem crossing (RISC). The organic compound is suitable for use as a thermally activated delayed fluorescence (TADF) material to achieve higher luminescence efficiency.

In the present disclosure, C6-C30 may each independently be C6, C8, C9, C10, C12, C13, C14, C15, C16, C18, C20, C22, C24, C26, C28 or the like.

C3-C30 may each independently be C3, C4, C5, C6, C8, C9, C10, C12, C13, C14, C15, C16, C18, C20, C22, C24, C26, C28 or the like.

C1-C30 may each independently be C2, C3, C4, C5, C6, C8, C9, C10, C12, C13, C14, C15, C16, C18, C20, C22, C24, C26, C28 or the like.

In the present disclosure, halogen includes fluorine, chlorine, bromine or iodine.

A second aspect of the present disclosure is to provide an OLED device. The OLED device includes an anode, a cathode and an organic thin film disposed between the anode and the cathode, where the organic thin film includes at least one of the organic compounds according to the first aspect.

A third aspect of the present disclosure is to provide a display panel. The display panel includes the OLED device according to the second aspect.

Compared with the related art, the present disclosure has beneficial effects described below.

The organic compound provided by the present disclosure is a new boron-containing aromatic compound. Through the design of the molecular structure, especially interaction between a skeletal structure and a linked group, the organic compound is endowed with the suitable HOMO energy level and LUMO energy level, which is conducive to matching the energy levels of compounds in adjacent layers and achieving the efficient exciton recombination. The organic compound has a relatively small overlap of the HOMO/LUMO energy levels, a relatively high singlet energy level E$_S$, a relatively high triplet energy level E$_T$ and a relatively small energy level difference $\Delta E_{ST}$, which is conducive to the reverse intersystem crossing and achieving the higher luminescence efficiency. Moreover, a molecule of the organic compound has high stability and a low degree of stacking, which is conducive to reducing concentration quenching, and the organic compound has excellent thermal stability and film stability. The organic compound is suitable for use as the TADF material. An application of the organic compound to the OLED device is conducive to preparing the OLED device, improving luminescence efficiency and stability of the device, reducing a turn-on voltage and extending a lifetime of the device.

BRIEF DESCRIPTION OF DRAWINGS

The FIGURE is a structure diagram of an OLED device according to an embodiment of the present disclosure.

REFERENCE LIST 1 substrate
2 anode
3 hole injection layer
4 hole transport layer
electron blocking layer
6 light-emitting layer
7 hole blocking layer
8 electron transport layer
9 electron injection layer
10 cathode

DETAILED DESCRIPTION

Technical solutions of the present disclosure are further described below through the embodiments. Those skilled in the art are to understand that the embodiments described herein are merely used for understanding the present disclosure and are not to be construed as specific limitations to the present disclosure.

A first aspect of the present disclosure is to provide an organic compound having a structure represented by Formula I:

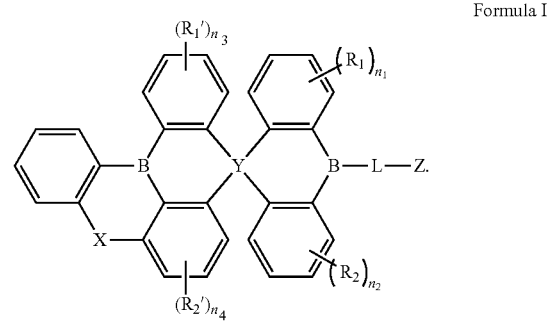

Formula I

In Formula I, X is selected from O, S, NR$_3$, CR$_4$R$_5$ or SiR$_6$R$_7$.

In Formula I, Y is C or Si.

In Formula I, L is selected from any one of a single bond, substituted or unsubstituted C6-C30 arylene, or substituted or unsubstituted C3-C30 heteroarylene. When L is the single bond, it means that the group Z is linked to a B atom by the single bond.

In Formula I, Z is selected from any one of substituted or unsubstituted C6-C30 aryl, substituted or unsubstituted C3-C30 heteroaryl, substituted or unsubstituted C6-C30 arylamine, or substituted or unsubstituted C6-C30 heteroarylamine.

In Formula I, R$_1$, R$_2$, R$_1$' and R$_2$' are each independently selected from any one of deuterium, halogen, cyano, substituted or unsubstituted C1-C30 linear or branched alkyl, substituted or unsubstituted C3-C30 cycloalkyl, C1-C30 alkoxy, substituted or unsubstituted C6-C30 aryl, substituted or unsubstituted C3-C30 heteroaryl, substituted or unsubstituted C6-C30 arylamine, or substituted or unsubstituted C6-C30 heteroarylamine.

R$_3$, R$_4$, R$_5$, R$_6$ and R$_7$ are each independently selected from any one of hydrogen, deuterium, substituted or unsubstituted C1-C30 linear or branched alkyl, substituted or unsubstituted C6-C30 aryl, or substituted or unsubstituted C3-C30 heteroaryl.

In Formula I, n$_1$, n$_2$, n$_3$ and n$_4$ each represent the number of groups, wherein n$_1$, n$_2$ and n$_3$ are each independently selected from an integer from 0 to 4, for example, may be 0, 1, 2, 3 or 4, and n$_4$ is selected from an integer from 0 to 3, for example, may be 0, 1, 2 or 3.

When n$_1$≥2, multiple (at least two) R$_1$ are the same group or different groups; the same is true for n$_2$, n$_3$ and n$_4$, which is not repeated here.

The organic compound provided by the present disclosure has a structure represented by Formula I and is a boron-containing aromatic compound. Through a design of a molecular structure, the organic compound has a suitable HOMO energy level and LUMO energy level, which is conducive to matching energy levels of compounds in adjacent layers and achieving efficient exciton recombination. The molecular structure of the compound is relatively twisted so that the organic compound has a relatively small overlap between the HOMO energy and the LUMO energy level and a relatively small energy level difference $\Delta E_{ST}$ between a singlet state and a triplet state ($\Delta E_{ST} \leq 0.30$ eV, which may be as low as 0.05-0.3 eV), which achieves efficient reverse intersystem crossing (RISC) so that more triplet excitons cross to the singlet state to emit fluorescence and higher luminescence efficiency is achieved. Moreover, B-containing units of the organic compound are joined to form a spiro ring, which not only improves molecular stability but also reduces a degree of stacking between molecules, which is conducive to reducing concentration quenching. The organic compound is applicable to an OLED device as a TADF material, is suitable for use as a material of a light-emitting layer, and has excellent thermal stability and film stability. Therefore, the organic compound is conducive to preparing the OLED device so that the device is more stable during operation. Moreover, the organic compound significantly improves luminescence efficiency of the device, reduces a turn-on voltage and energy consumption and extends a lifetime of the device.

In the present disclosure, C6-C30 may each independently be C6, C8, C9, C10, C12, C13, C14, C15, C16, C18, C20, C22, C24, C26, C28 or the like.

C3-C30 may each independently be C3, C4, C5, C6, C8, C9, C10, C12, C13, C14, C15, C16, C18, C20, C22, C24, C26, C28 or the like.

C1-C30 may each independently be C2, C3, C4, C5, C6, C8, C9, C10, C12, C13, C14, C15, C16, C18, C20, C22, C24, C26, C28 or the like.

In the present disclosure, halogen includes fluorine, chlorine, bromine or iodine. The same description hereafter has the same meaning.

In the present disclosure, the term "aryl" includes monocyclic aryl or polycyclic aryl (for example, a ring formed by fusing two, three, four, five or the like benzene rings) and illustratively includes, but is not limited to, phenyl, biphenyl, terphenyl, naphthyl, fluorenyl, spirobifluorenyl, anthryl, indenyl, phenanthryl, pyrenyl, acenaphthenyl, triphenylene, chrysenyl, acenaphthylenyl, perylenyl or the like. The same description hereafter has the same meaning.

A heteroatom in the term "heteroaryl" includes O, S, N, P, B, Si or the like. Heteroaryl includes monocyclic heteroaryl or polycyclic heteroaryl (a ring formed by fusing heteroaryl to at least one aromatic group) and illustratively includes, but is not limited to, pyridyl, pyrazinyl, pyrimidyl, pyridazinyl, triazinyl, quinolinyl, isoquinolinyl, quinoxalinyl, quinazolinyl, acridinyl, phenanthrolinyl, benzofuranyl, benzothienyl, dibenzofuranyl, dibenzothienyl, carbazolyl and derivative groups thereof (N-phenylcarbazolyl, N-pyridylcarbazolyl, N-naphthylcarbazolyl, benzocarbazolyl, dibenzocarbazolyl, indolocarbazolyl, azacarbazolyl or the like), furanyl, thienyl, pyrrolyl, phenothiazinyl, phenoxazinyl, hydroacridinyl, silaspirobifluorenyl or the like. The same description hereafter has the same meaning.

The term "arylene" is a divalent group based on the aforementioned aryl; and the term "heteroarylene" is a divalent group based on the aforementioned heteroaryl. Specific examples are not repeated.

The term "arylamine" refers to a monovalent group formed through substitution of at least one hydrogen in amino (—NH$_2$) by the aforementioned aryl and illustratively includes, but is not limited to, phenylamino, biphenylamino, naphthylamino or the like.

The term "heteroarylamine" refers to a monovalent group formed through substitution of at least one hydrogen in amino (—NH$_2$) by the aforementioned heteroaryl and illustratively includes, but is not limited to, pyridylamino, pyrazinylamino, pyrimidylamino or the like.

In an embodiment, the substituted substituents in L, Z, R$_1$, R$_2$, R$_1$', R$_2$', R$_3$, R$_4$, R$_5$, R$_6$ and R$_7$ are each independently selected from at least one of deuterium, halogen, cyano, unsubstituted or halogenated C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, unsubstituted or halogenated C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

In an embodiment, L is selected from a single bond, any one of the following groups or any one of the following groups substituted with a substituent:

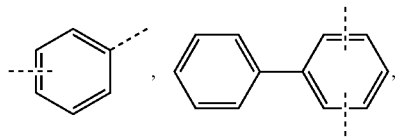

-continued

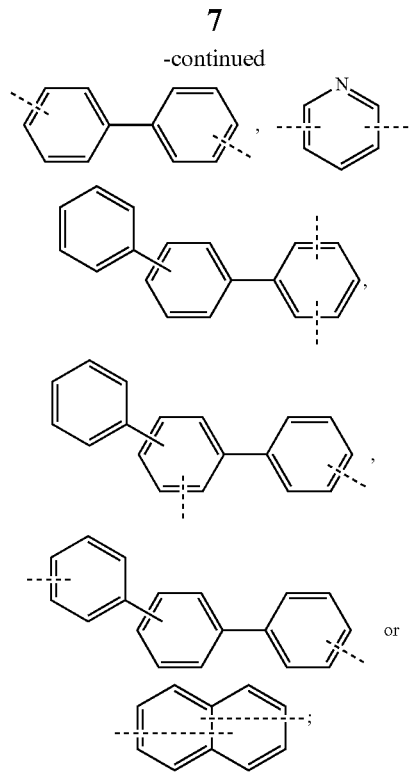

wherein the dashed line represents a linkage site of the group.

The substituents are each independently selected from at least one of deuterium, C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

In an embodiment, Z is selected from any one of the following groups or any one of the following groups substituted with a substituent:

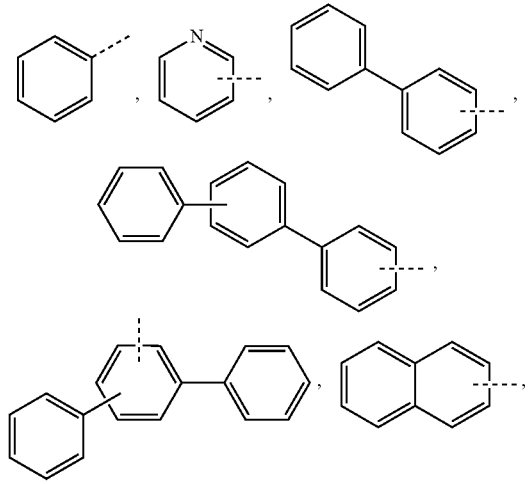

-continued

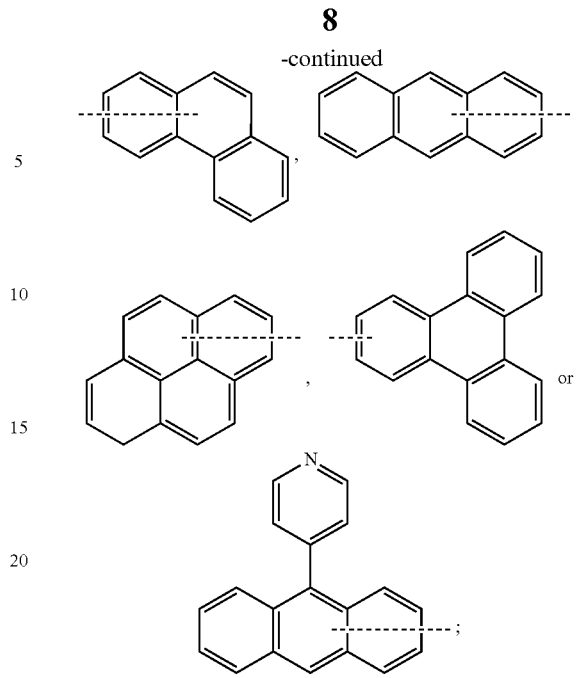

wherein the dashed line represents a linkage site of the group.

The substituents are selected from at least one of deuterium, halogen, cyano, unsubstituted or halogenated C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, unsubstituted or halogenated C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

In an embodiment, Z is selected from any one of the following groups:

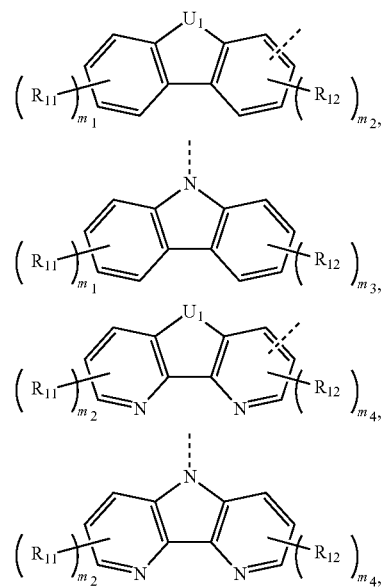

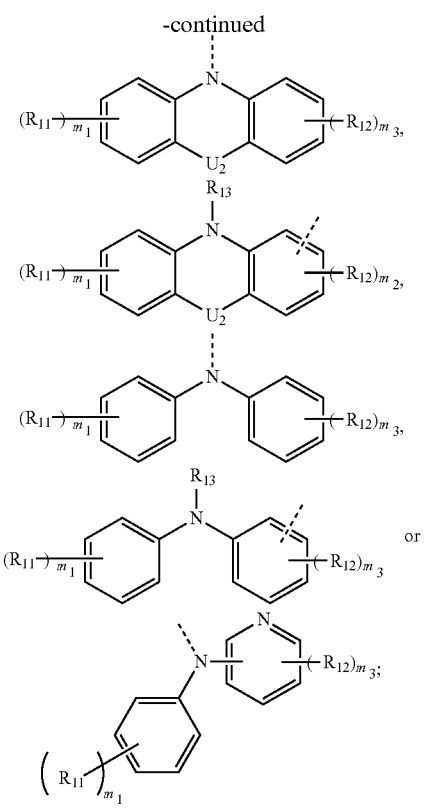

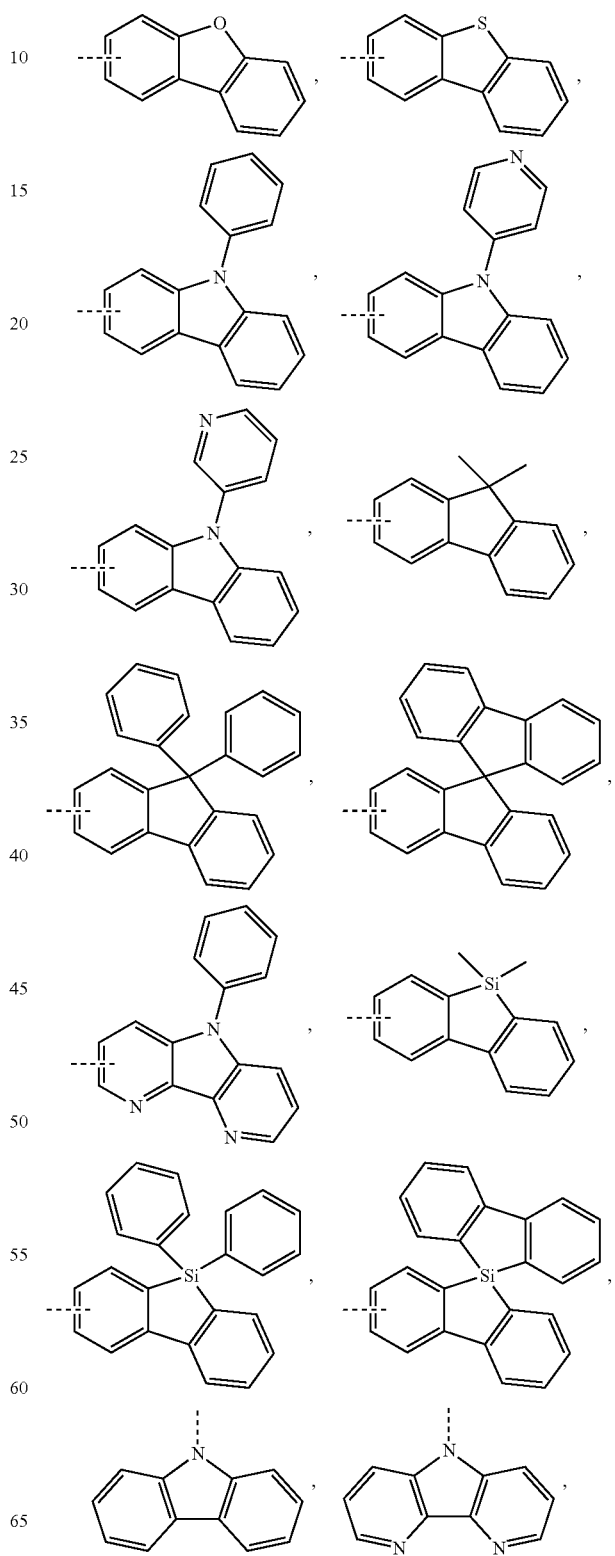

wherein the dashed line represents a linkage site of the group.

$U_1$ and $U_2$ are each independently selected from O, S, $NR_{14}$, $CR_{15}R_{16}$ or $SiR_{17}R_{18}$.

$R_{11}$ and $R_{12}$ are each independently selected from any one of deuterium, halogen, cyano, unsubstituted or halogenated C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, unsubstituted or halogenated C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

$R_{13}$, $R_{14}$, $R_{15}$, $R_{16}$, $R_{17}$ and $R_{18}$ are each independently selected from any one of hydrogen, deuterium, halogen, cyano, unsubstituted or halogenated C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, unsubstituted or halogenated C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

$R_{15}$ and $R_{16}$ are not linked or linked by a chemical bond to form a ring, and $R_{17}$ and $R_{18}$ are not linked or linked by a chemical bond to form a ring.

$m_1$ and $m_3$ are each independently selected from an integer from 0 to 4, for example, may be 0, 1, 2, 3 or 4.

$m_2$ is selected from an integer from 0 to 3, for example, may be 0, 1, 2 or 3.

$m_4$ is selected from an integer from 0 to 2, for example, may be 0, 1 or 2.

In an embodiment, Z is selected from any one of the following groups or any one of the following groups substituted with a substituent:

-continued

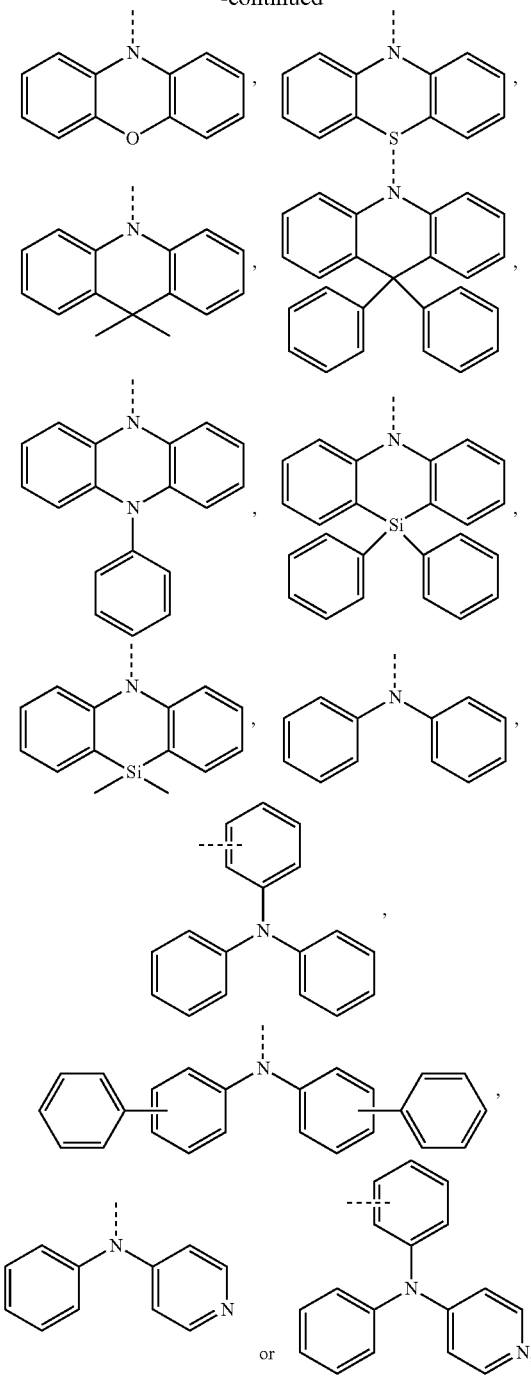

wherein the dashed line represents a linkage site of the group.

The substituents are selected from at least one of deuterium, C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

In an embodiment, $R_1$, $R_2$, $R_1'$ and $R_2'$ are each independently selected from anyone of deuterium, halogen, cyano, C1-C10 (for example, C1, C2, C3, C4, C5, C6, C7, C8, C9 or the like) linear or branched alkyl, C1-C10 (for example, C1, C2, C3, C4, C5, C6, C7, C8, C9 or the like) alkoxy, substituted or unsubstituted C6-C20 (for example, C6, C9, C10, C12, C14, C16, C18 or the like) aryl, substituted or unsubstituted C3-C20 (for example, C3, C4, C5, C6, C8, C10, C12, C14, C16, C18 or the like) heteroaryl, substituted or unsubstituted C6-C20 (for example, C6, C9, C10, C12, C14, C16, C18 or the like) arylamine, or substituted or unsubstituted C6-C20 (for example, C6, C9, C10, C12, C14, C16, C18 or the like) heteroarylamine.

The substituted substituents in $R_1$, $R_2$, $R_1'$ and $R_2'$ are each independently selected from at least one of deuterium, C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

In an embodiment, $R_1$, $R_2$, $R_1'$ and $R_2'$ are each independently selected from any one of the following groups:

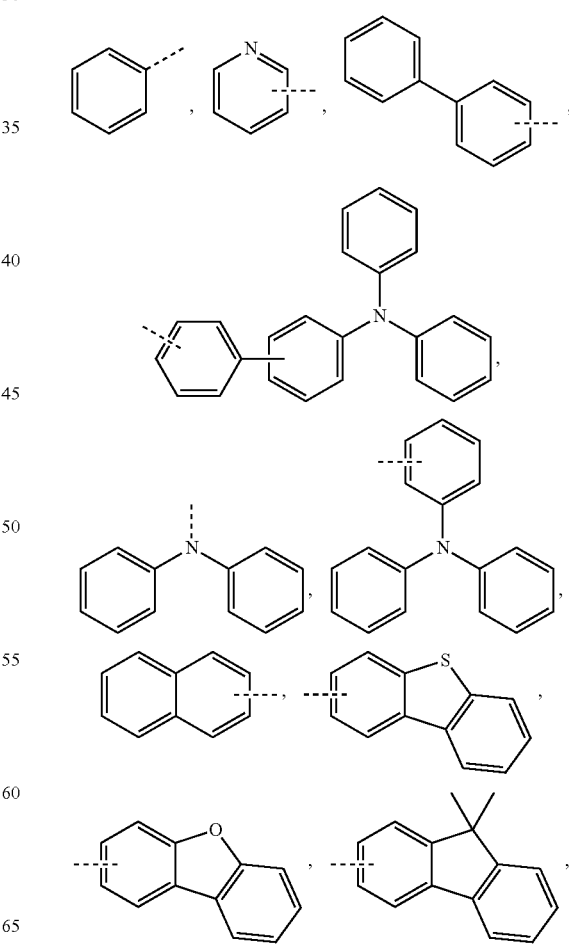

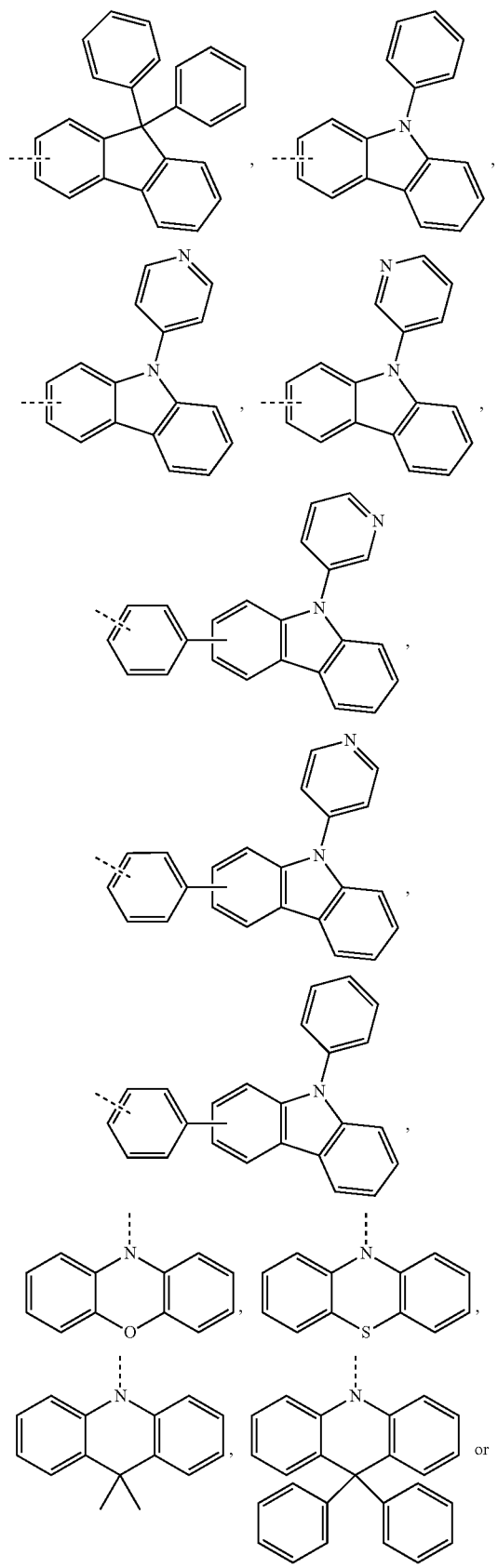

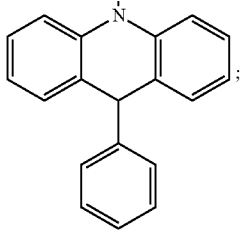

wherein the dashed line represents a linkage site of the group.

In an embodiment, at least one (for example, one, two or three) of Z, $R_1$ or $R_2$ is an electron-donating group.

In a preferred embodiment of the present disclosure, the organic compound has a D-A type molecular structure, where D represents an electron donor and A represents an electron acceptor. A B-containing spiro structure in the organic compound has an electron withdrawing property and collaborates, as A in the molecular structure, with a specific electron-donating group (at least one of Z, $R_1$ or $R_2$) which serves as D. The formed D-A type structural framework is more conducive to achieving excellent TADF characteristics so that the organic compound has higher luminescence efficiency.

In the present disclosure, the "electron-donating group" refers to a group capable of increasing an electron cloud density on a benzene ring and illustratively includes, but is not limited to, carbazolyl and derivative groups thereof (N-phenylcarbazolyl, N-pyridylcarbazolyl, N-naphthylcarbazolyl, benzocarbazolyl, dibenzocarbazolyl, indolocarbazolyl, azacarbazolyl or the like), phenothiazinyl, phenoxazinyl, hydroacridinyl, diphenylamino, phenylpyridylamino or the like.

In an embodiment, Z is the electron-donating group.

In an embodiment, at least one (one or two) of $R_1$ or $R_2$ is the electron-donating group.

In an embodiment, $R_3$, $R_4$, $R_5$, $R_6$ and $R_7$ are each independently selected from any one of C1-C10 (for example, C1, C2, C3, C4, C5, C6, C7, C8, C9 or the like) linear or branched alkyl, substituted or unsubstituted C6-C20 (for example, C6, C9, C10, C12, C14, C16, C18 or the like) aryl, or substituted or unsubstituted C3-C20 (for example, C3, C4, C5, C6, C8, C10, C12, C14, C16, C18 or the like) heteroaryl.

The substituted substituents are each independently selected from at least one of deuterium, C1-C10 (for example, C1, C2, C3, C4, C5, C6, C7, C8, C9 or the like) linear or branched alkyl, C3-C10 (for example, C3, C4, C5, C6, C7, C8, C9 or the like) cycloalkyl, C1-C10 (for example, C1, C2, C3, C4, C5, C6, C7, C8, C9 or the like) alkoxy, C6-C20 (for example, C6, C9, C10, C12, C14, C16, C18 or the like) aryl, C2-C20 (for example, C2, C3, C4, C5, C6, C8, C10, C12, C14, C16, C18 or the like) heteroaryl, or C6-C20 (for example, C6, C9, C10, C12, C14, C16, C18 or the like) arylamine.

In an embodiment, $R_3$, $R_4$, $R_5$, $R_6$ and $R_7$ are each independently selected from any one of methyl, phenyl, biphenyl, terphenyl, naphthyl or pyridyl.

In an embodiment, $n_1$, $n_2$, $n_3$ and $n_4$ are each independently 0, 1 or 2.

In a specific embodiment, the organic compound is selected from any one of the following Compound M1 to Compound M140:

M1
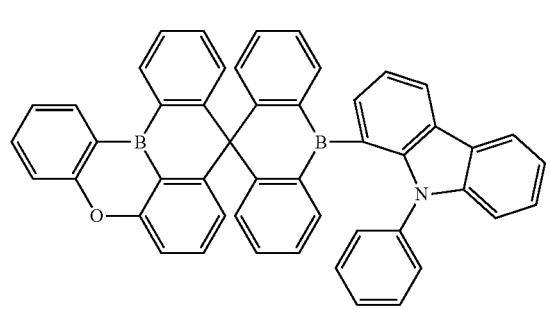
M2
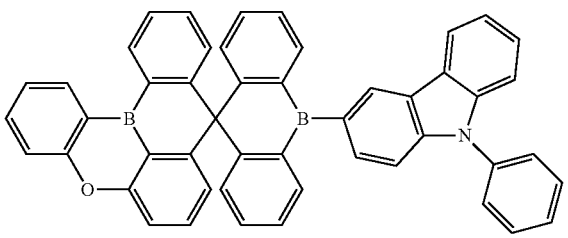
M3
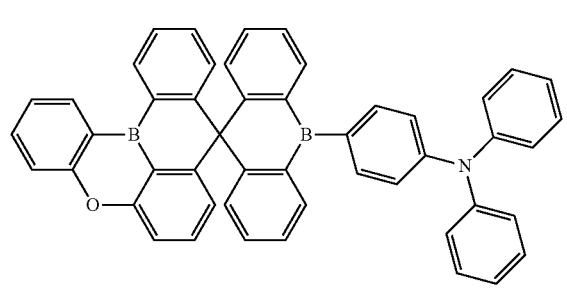
M4
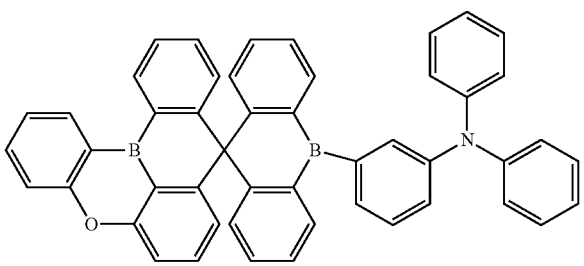
M5
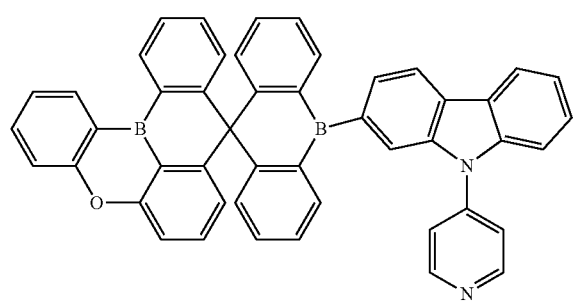
M6
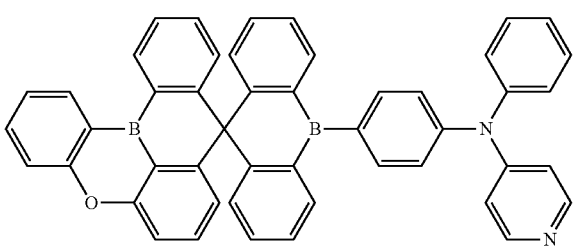
M7
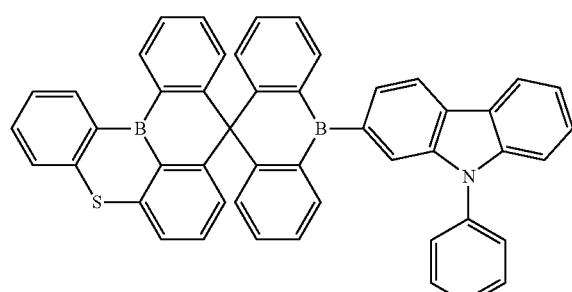
M8
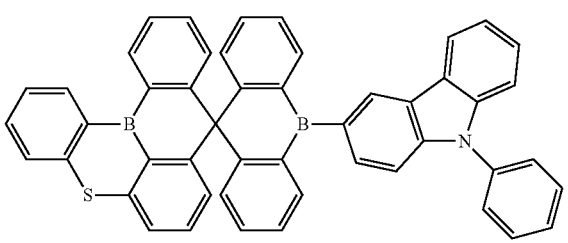
M9
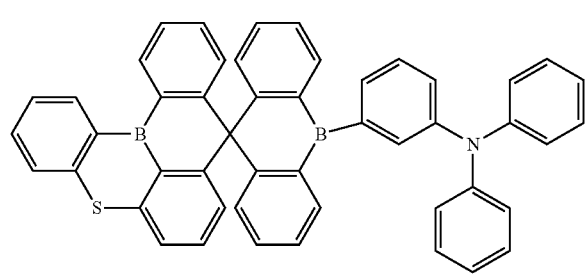
M10
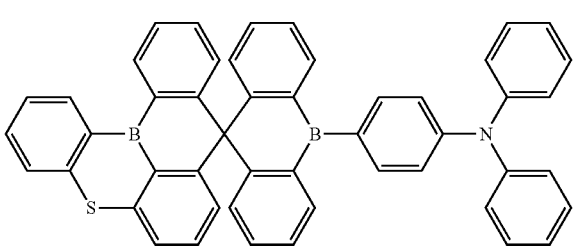

-continued
M11
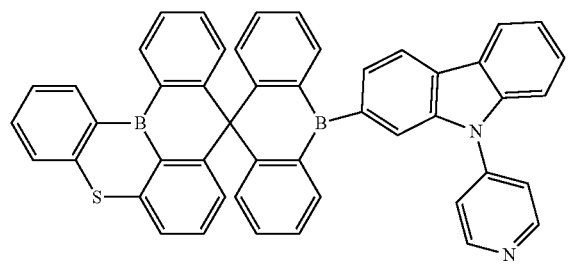
M12
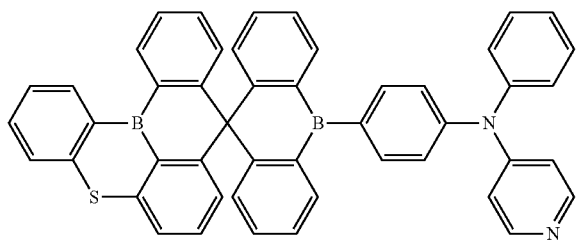
M13
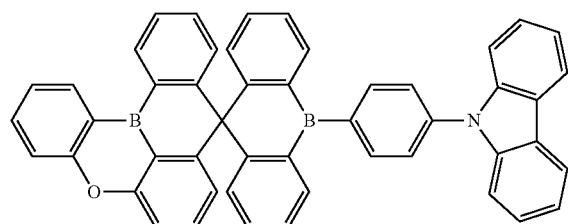
M14
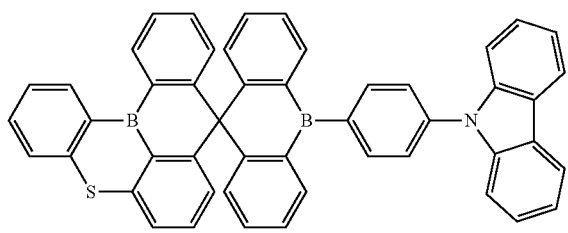
M15
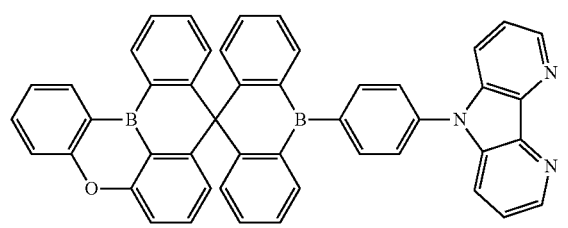
M16
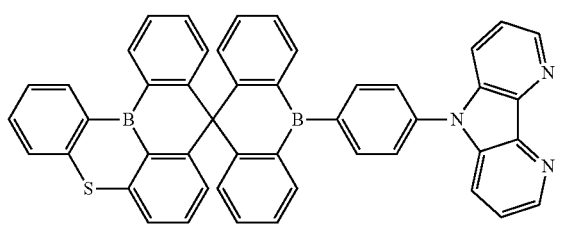
M17
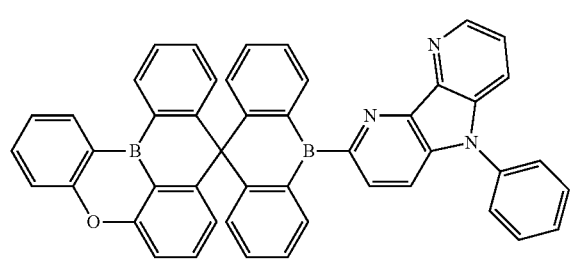
M18
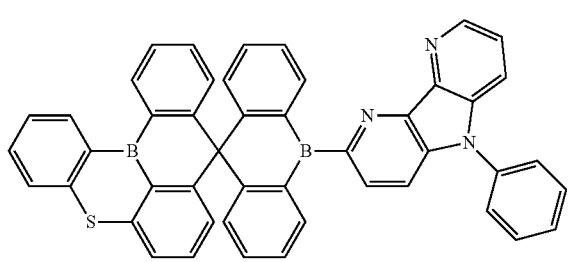
M19
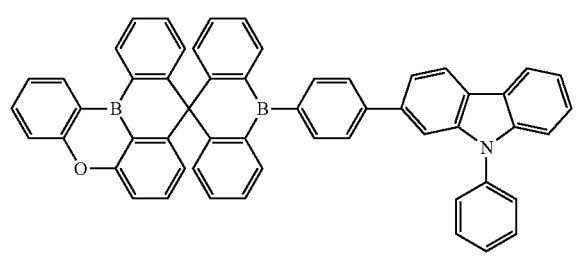
M20
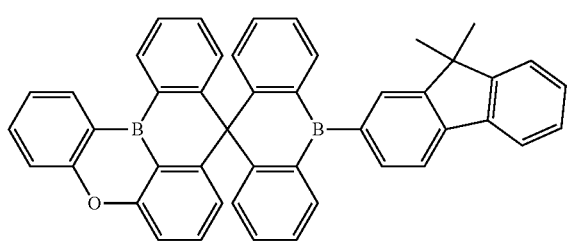
M21
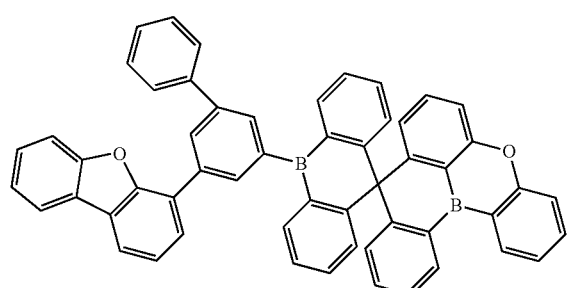
M22
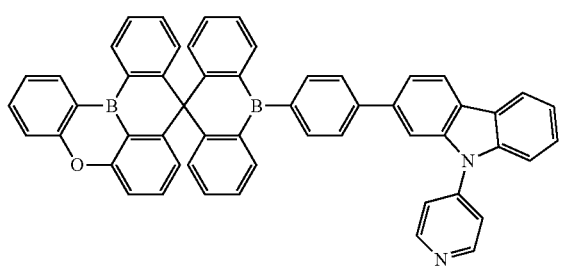

-continued
M23
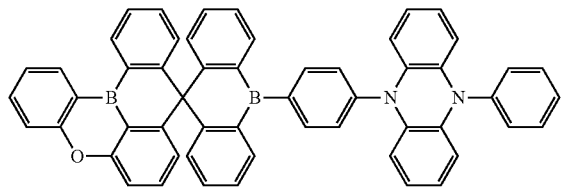
M24
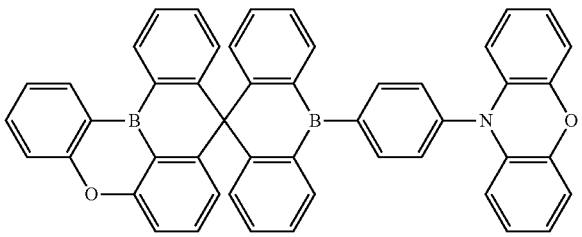
M25
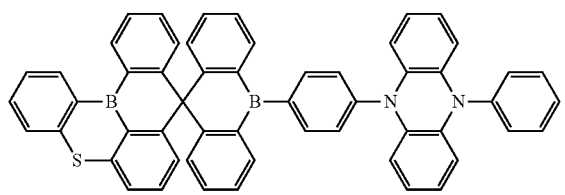
M26
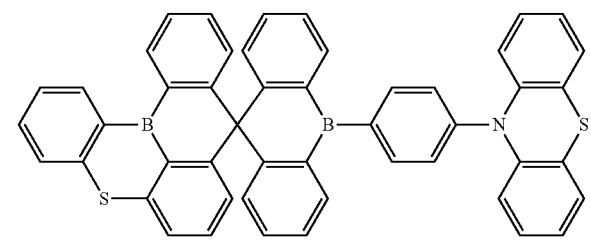
M27
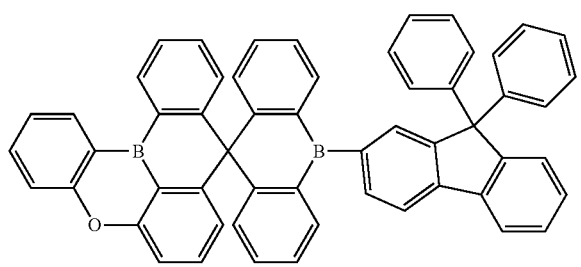
M28
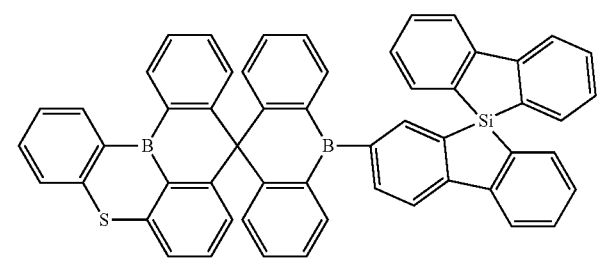
M29
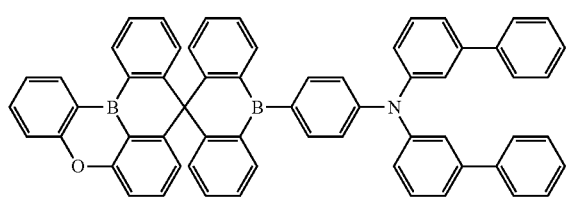
M30
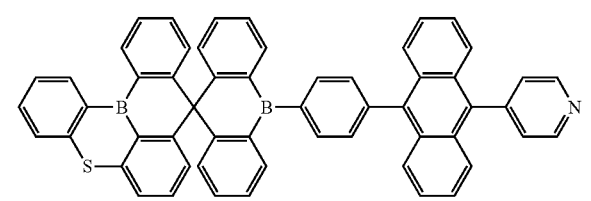
M31
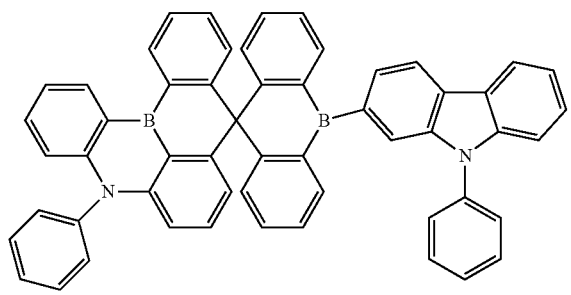
M32
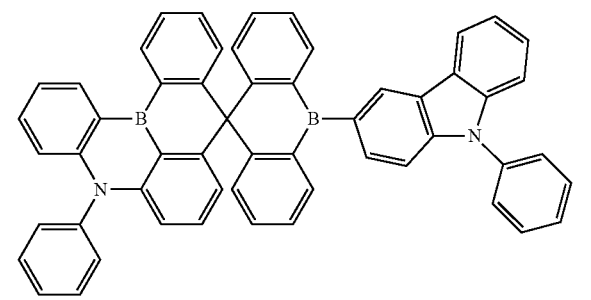

-continued
M33
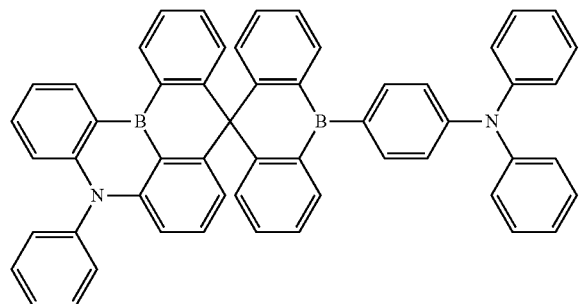
M34
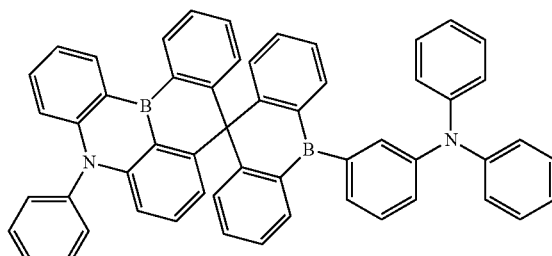
M35
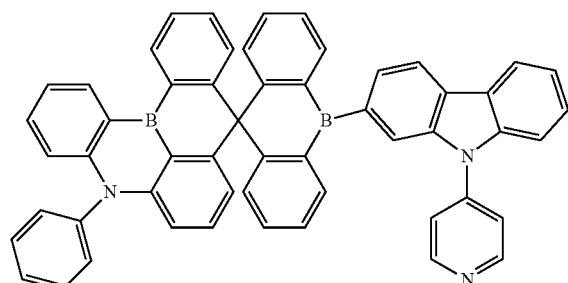
M36
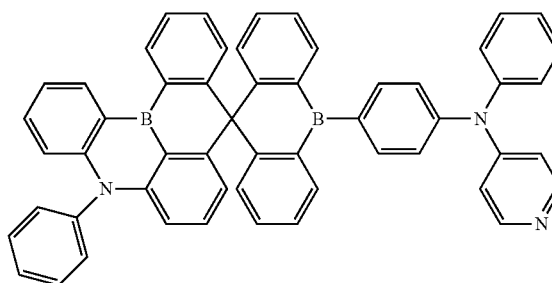
M37
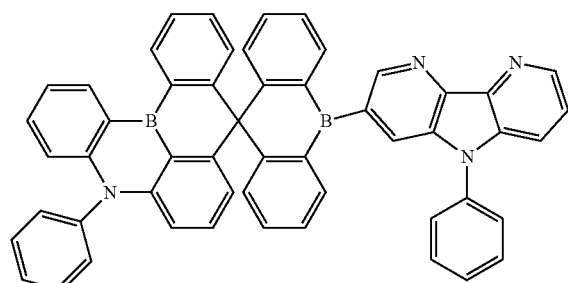
M38
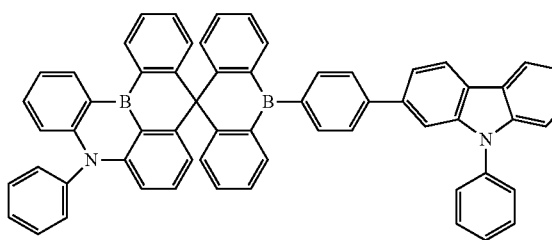
M39
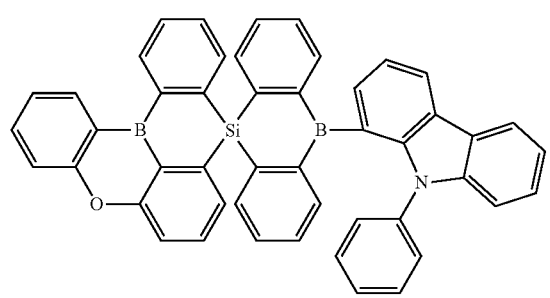
M40
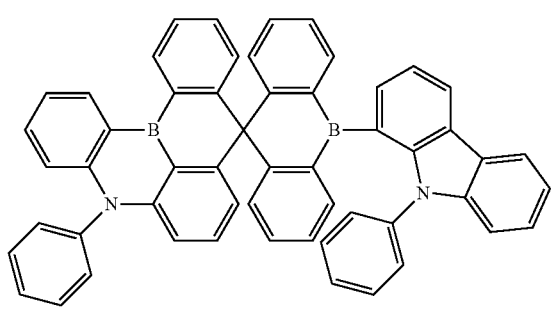
M41
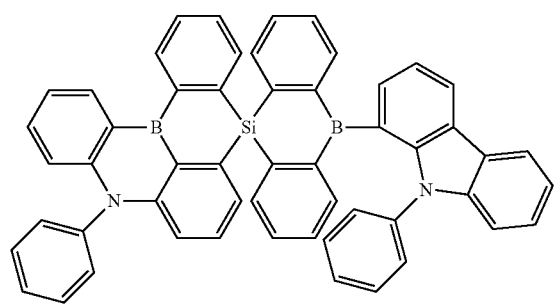

-continued
M42
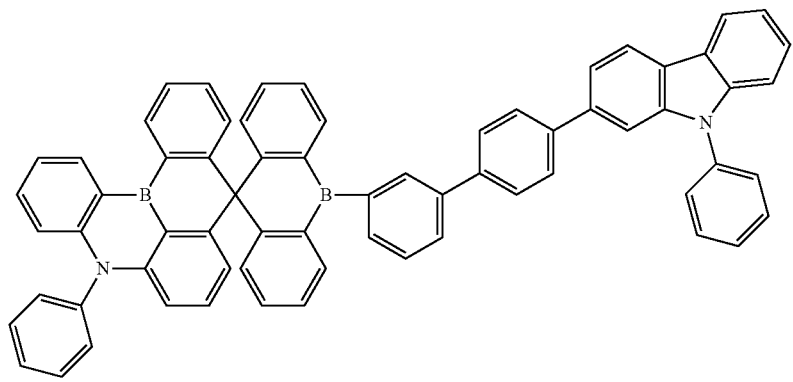
M43
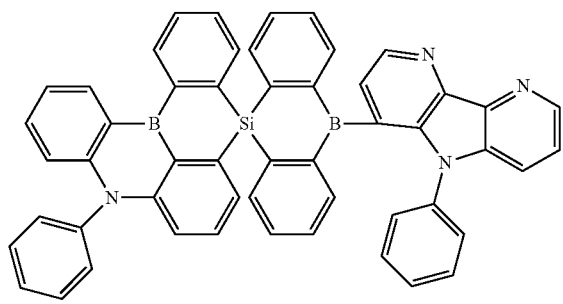
M44
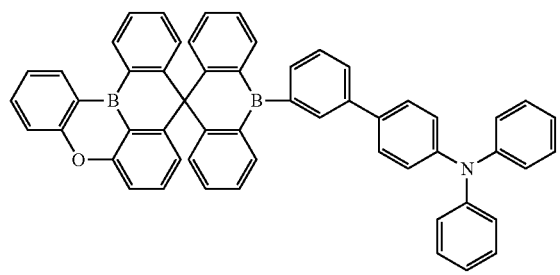
M45
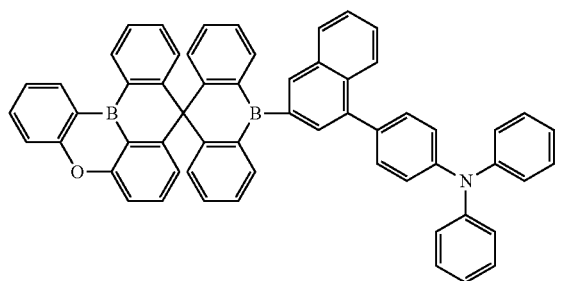
M46
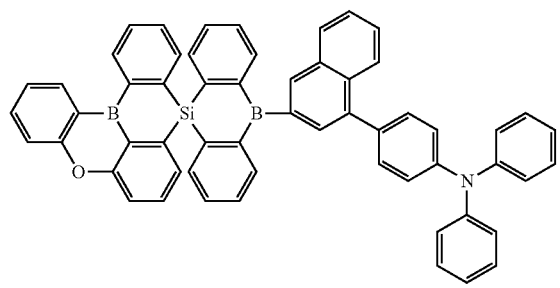
M47
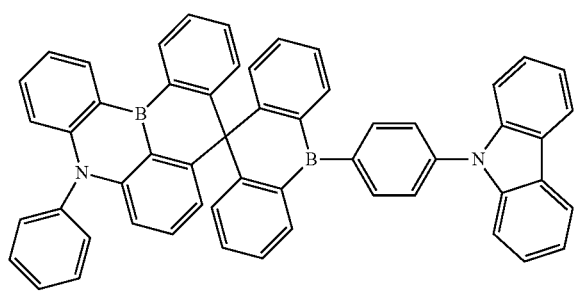
M48
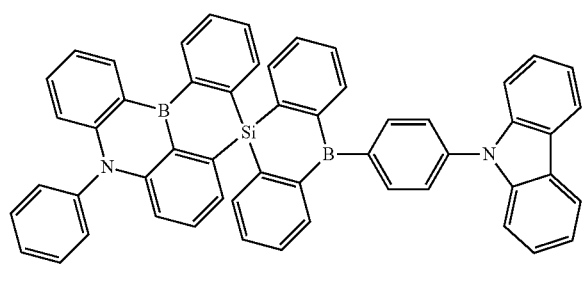
M49
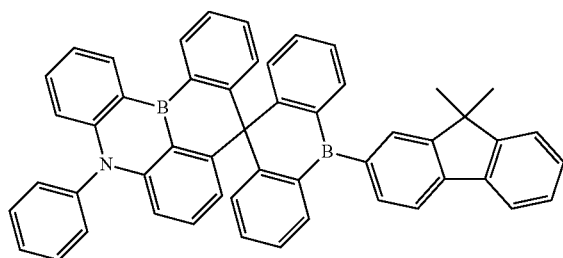
M50
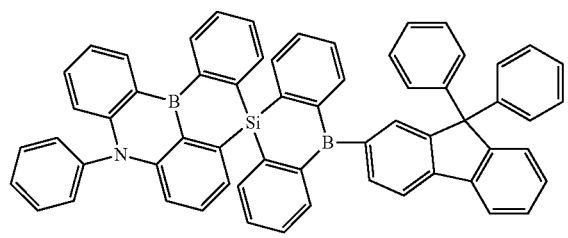

M51
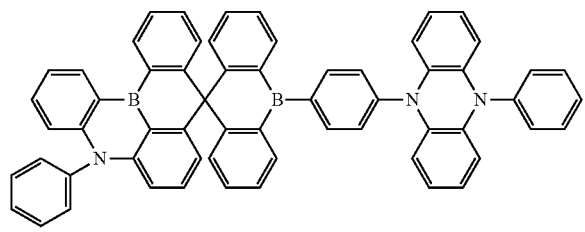
M52
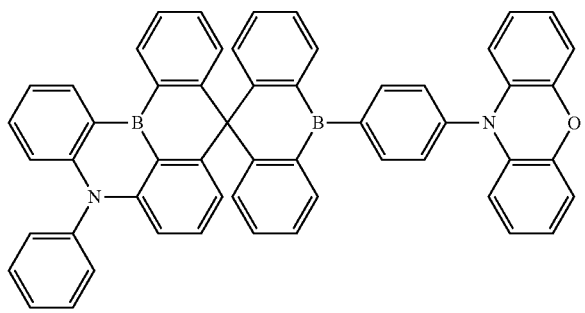
M53
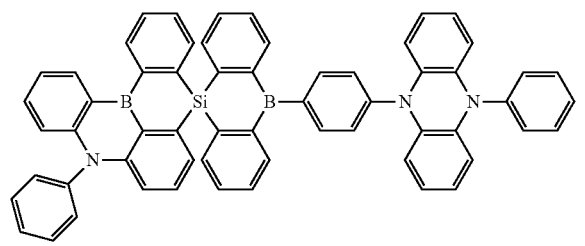
M54
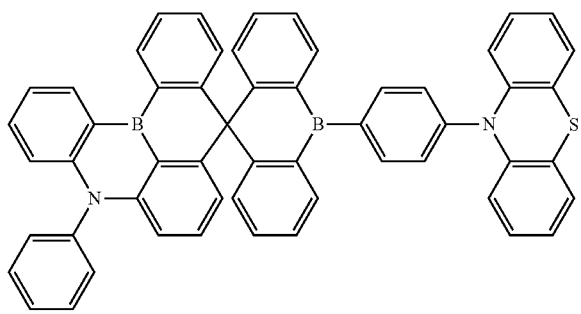
M55
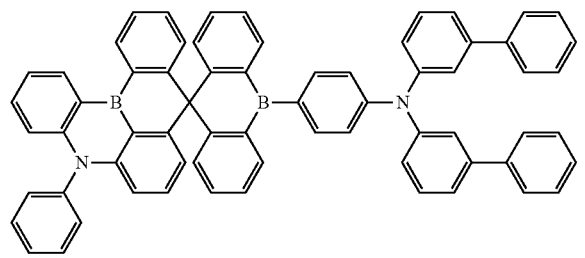
M56
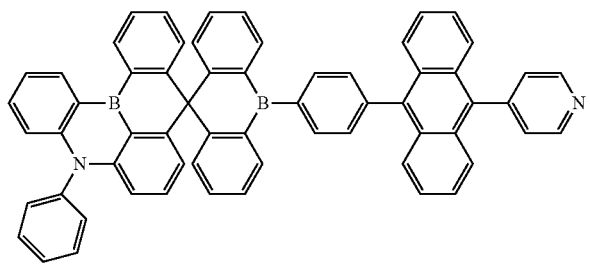
M57
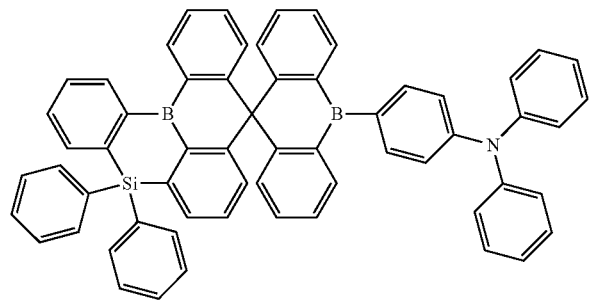
M58
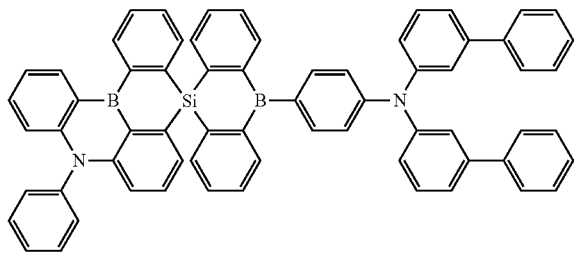
M59
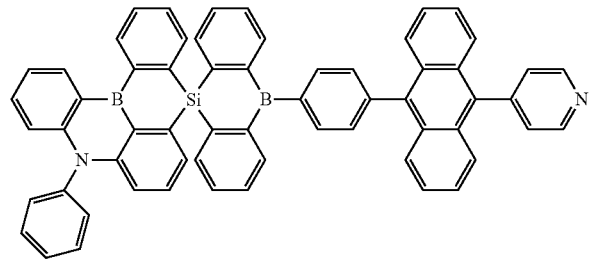
M60
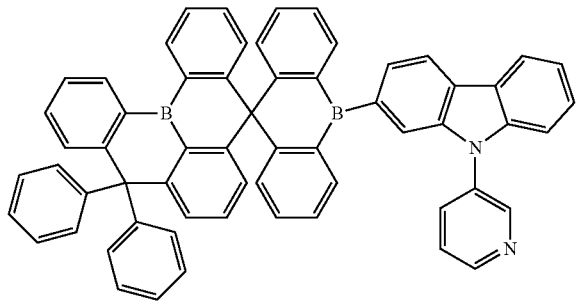

-continued
M61
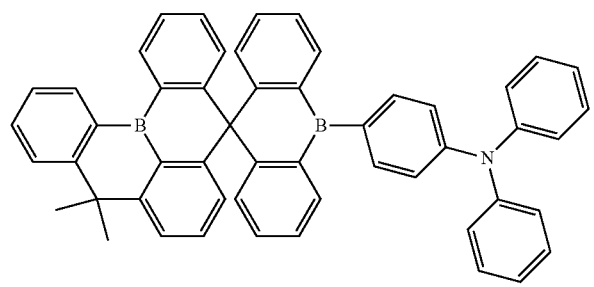
M62
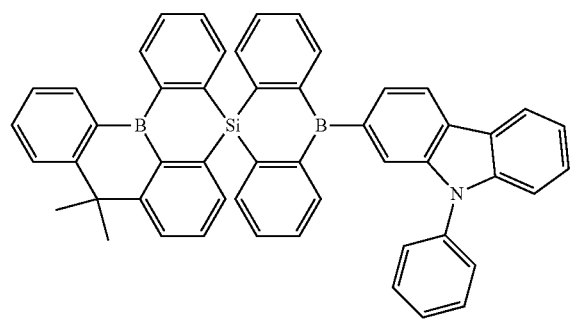
M63
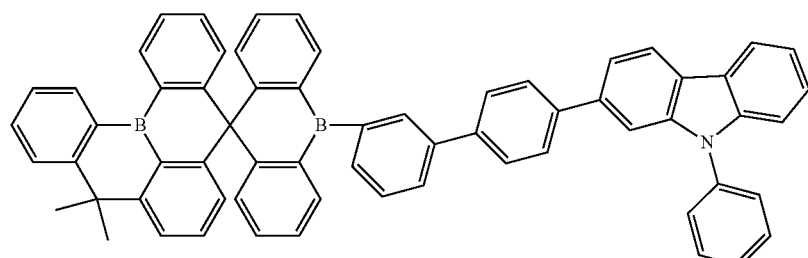
M64
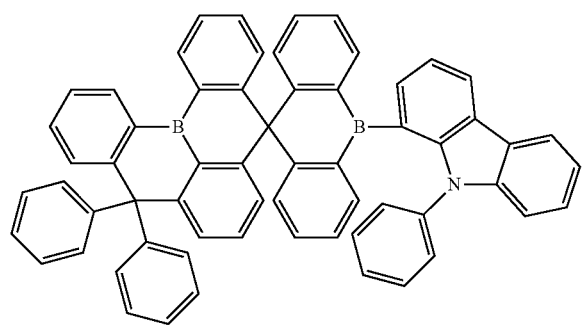
M65
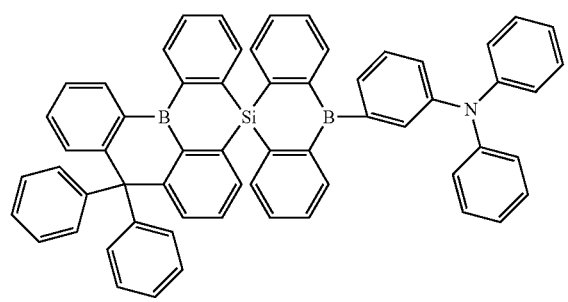
M66
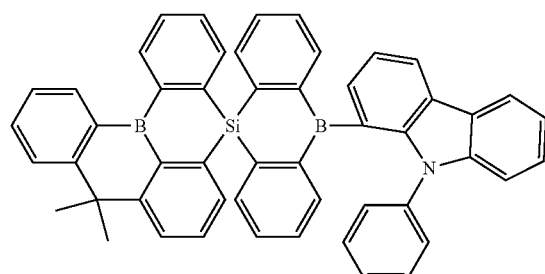
M67
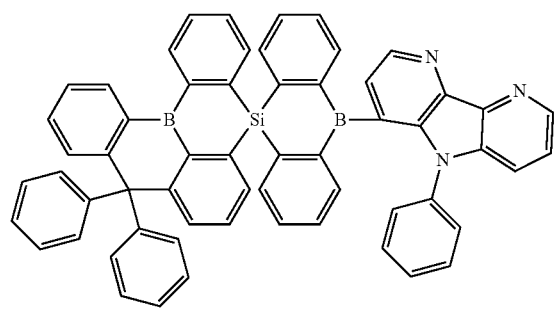
M68
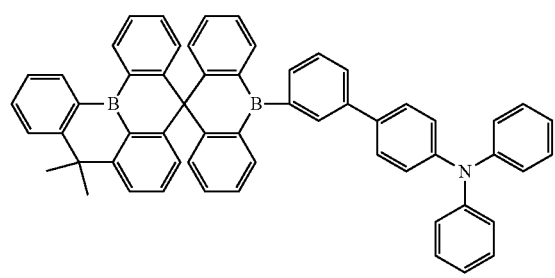
M69
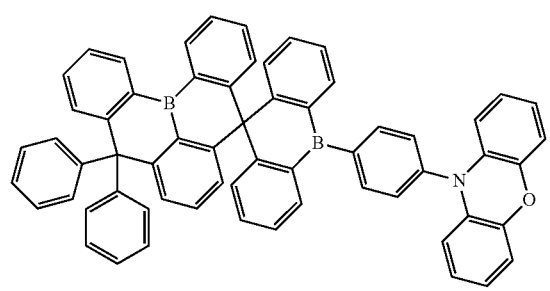

-continued
M70
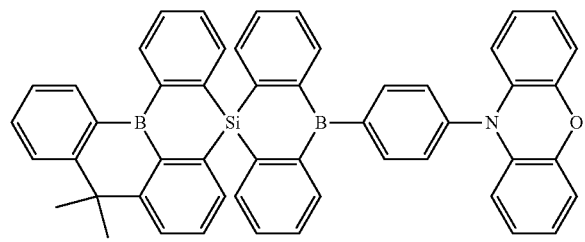
M71
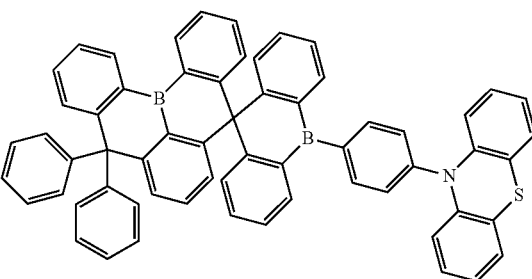
M72
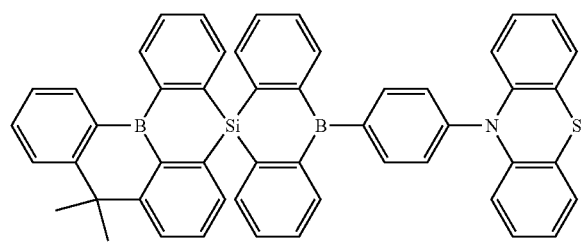
M73
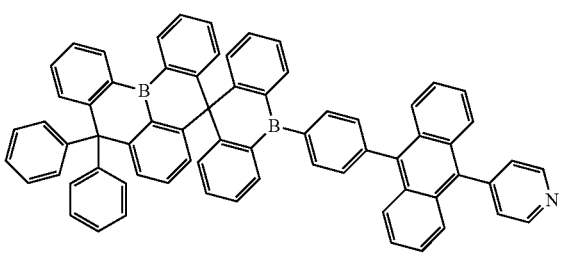
M74
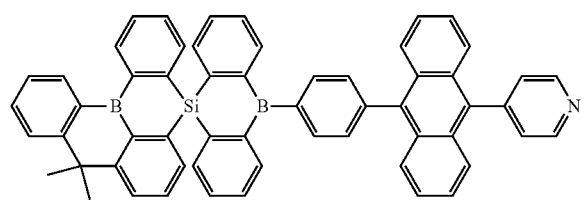
M75
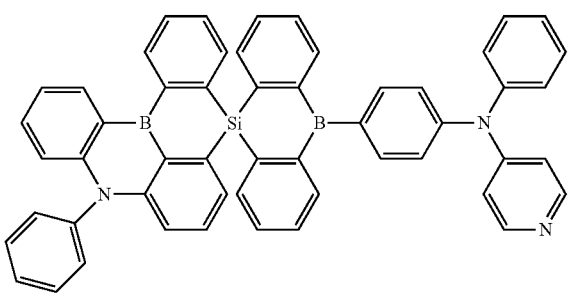
M76
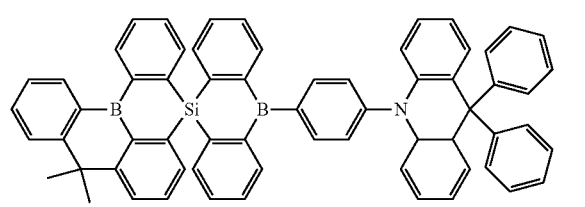
M77
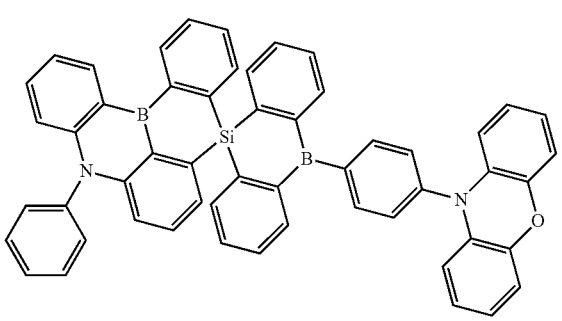
M78
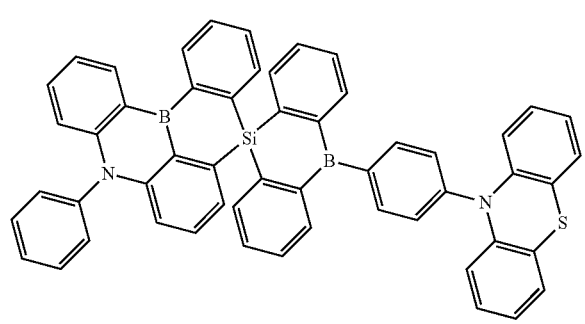
M79
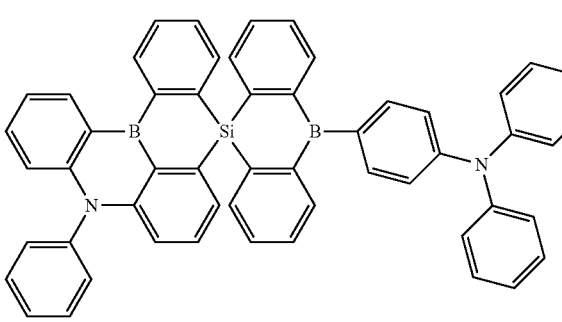

-continued
M80
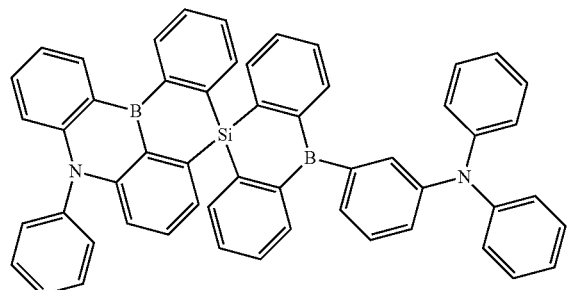
M81
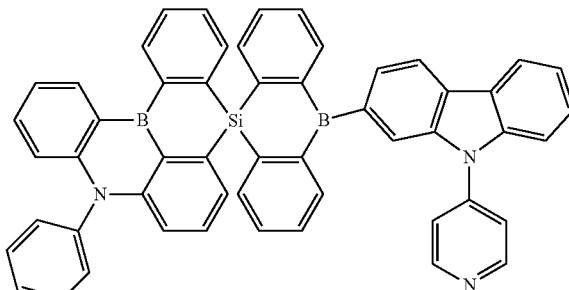
M82
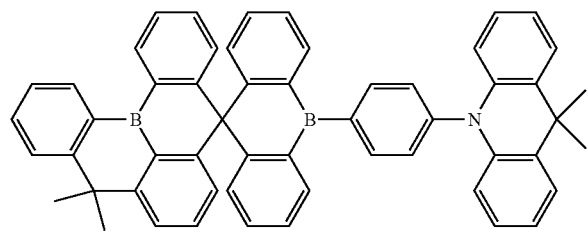
M83
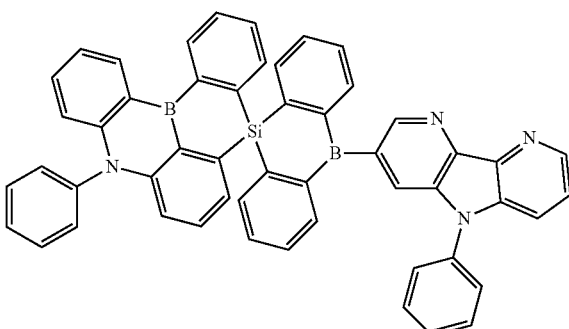
M84
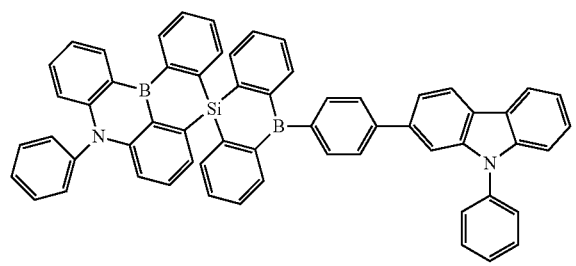
M85
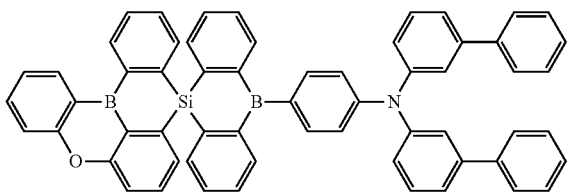
M86
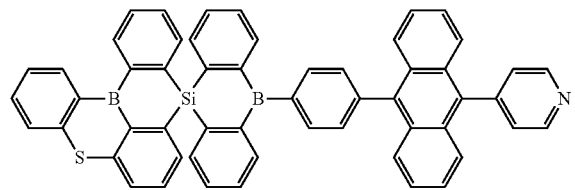
M87
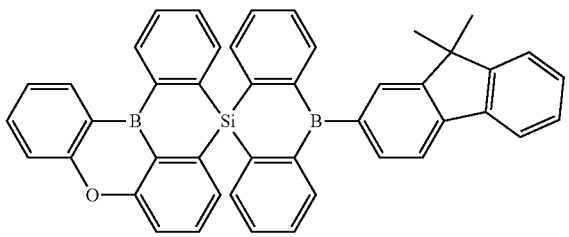
M88
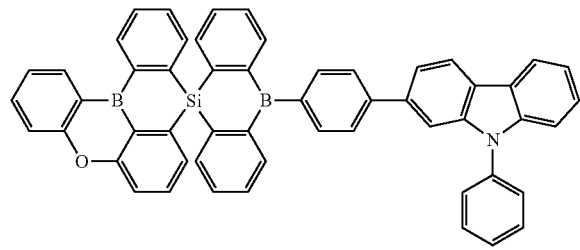
M89
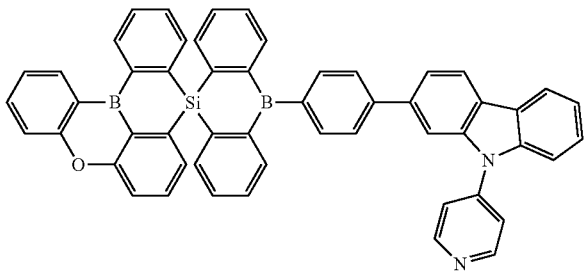

M90
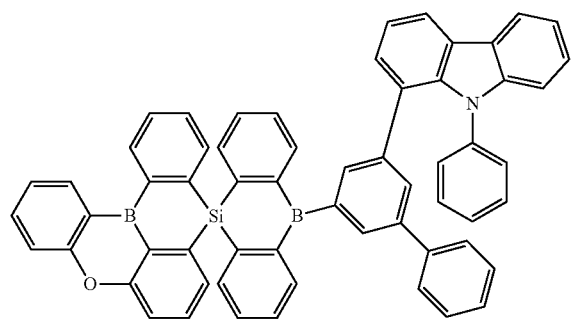
M91
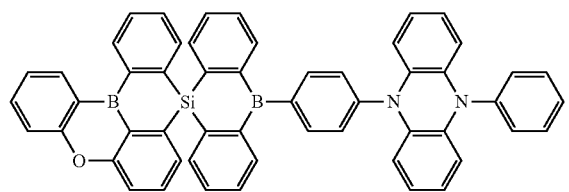
M92
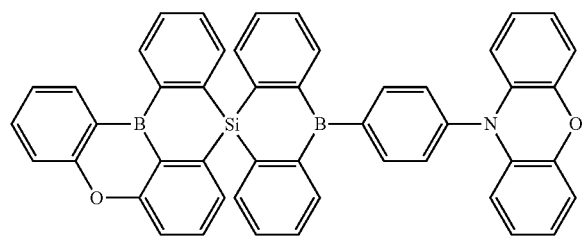
M93
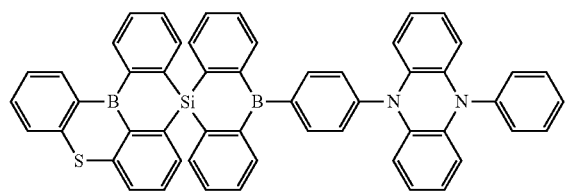
M94
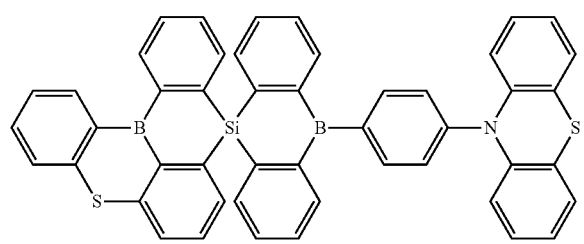
M95
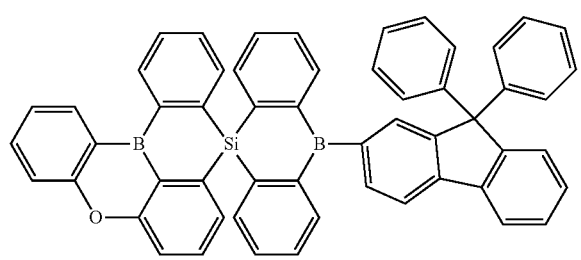
M96
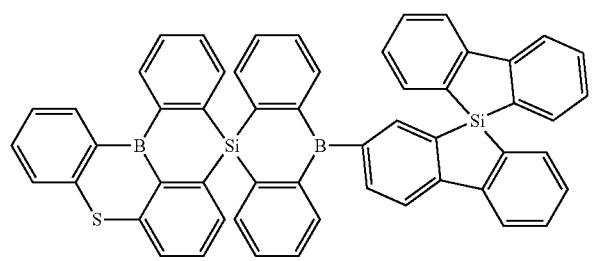
M97
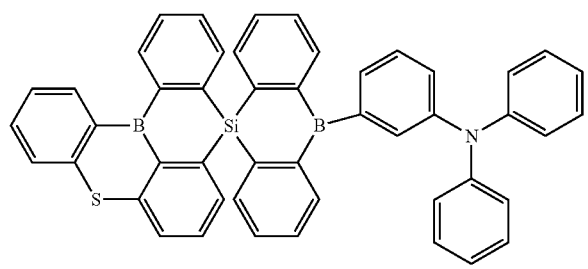
M98
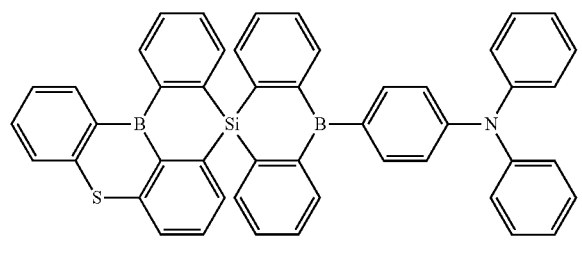
M99
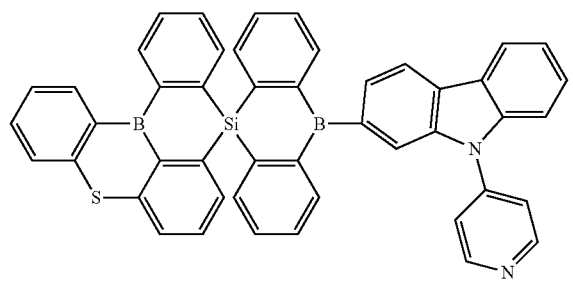

-continued
M100
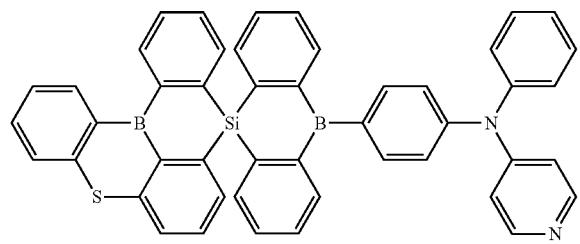
M101
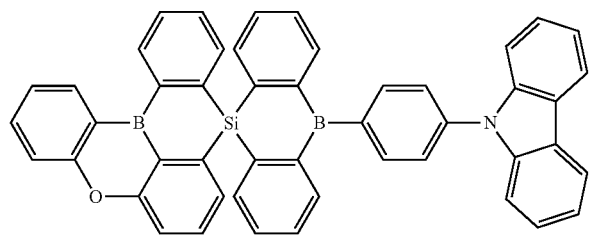
M102
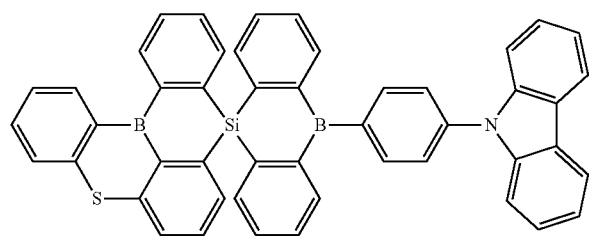
M103
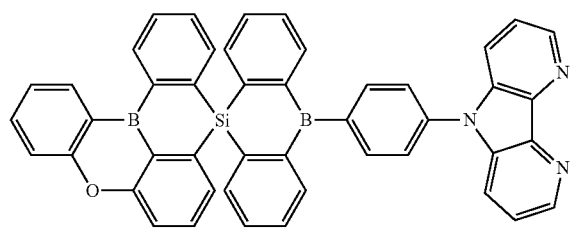
M104
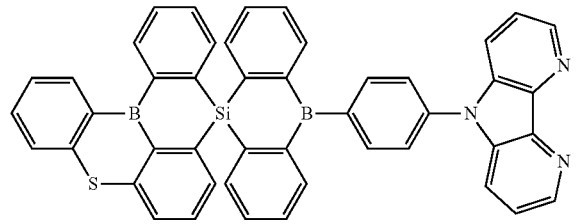
M105
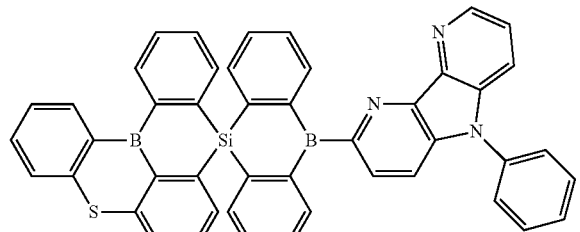
M106
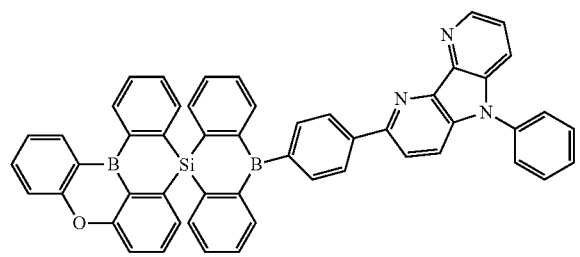
M107
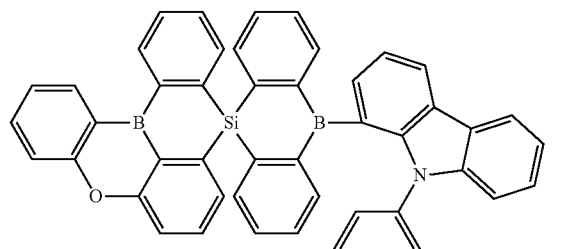
M108
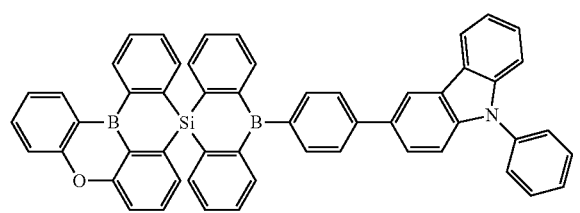
M109
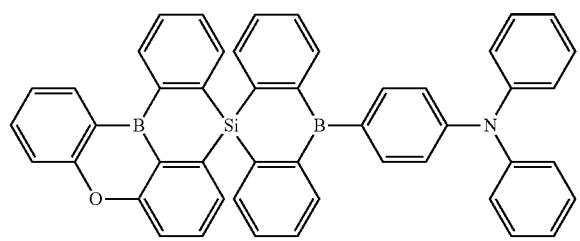

-continued
M110
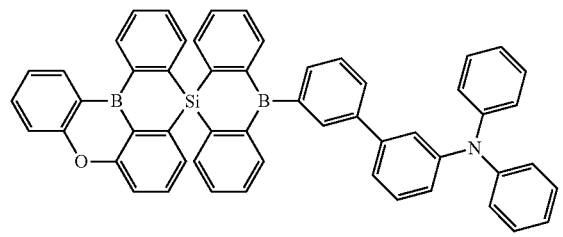
M111
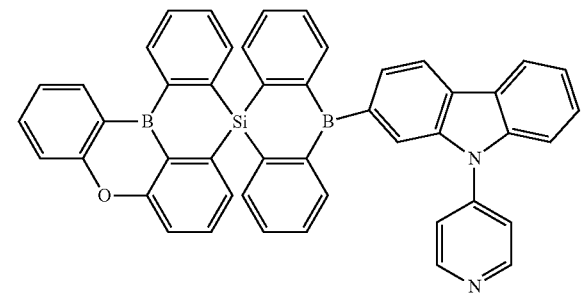
M112
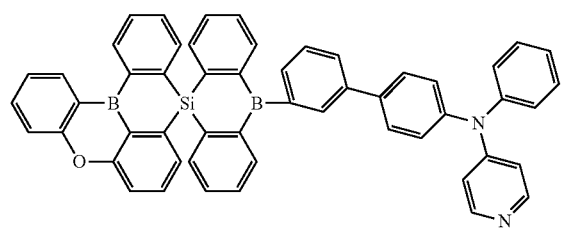
M113
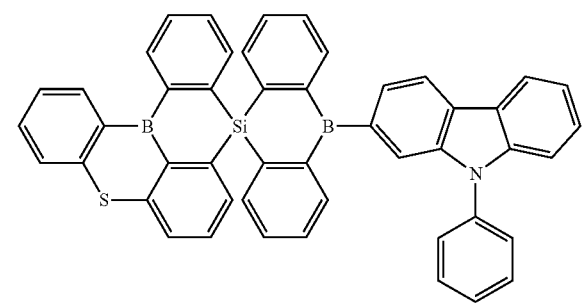
M114
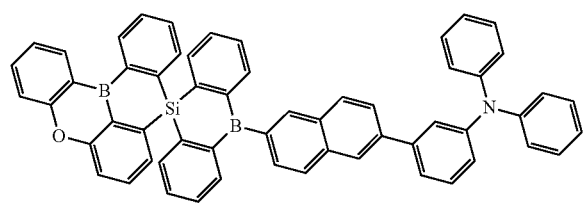
M115
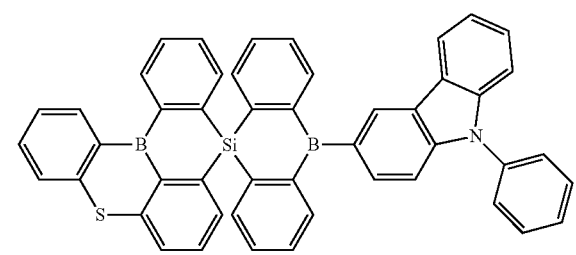
M116
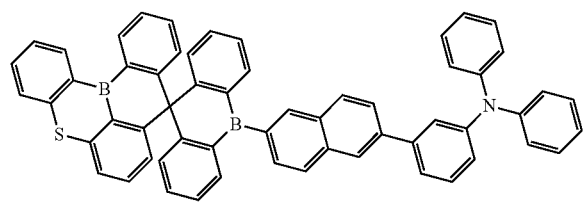
M117
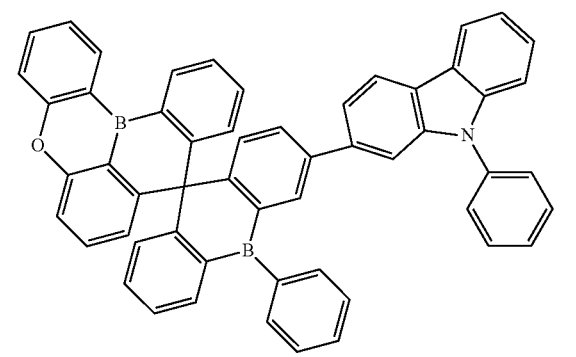

-continued
M118
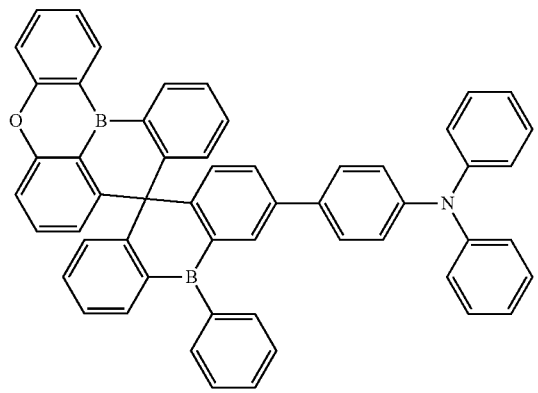
M119
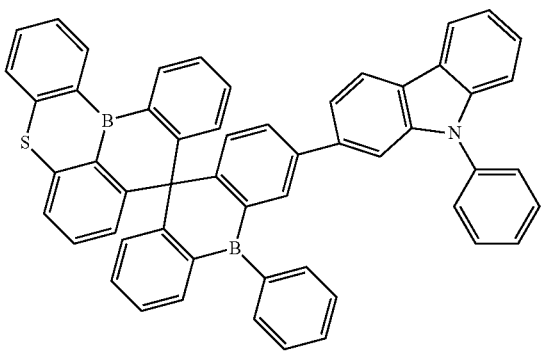
M120
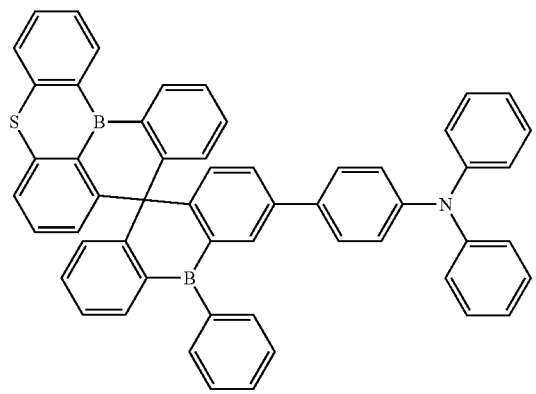
M121
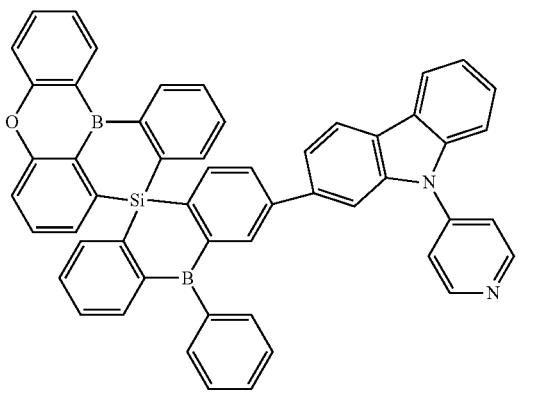
M122
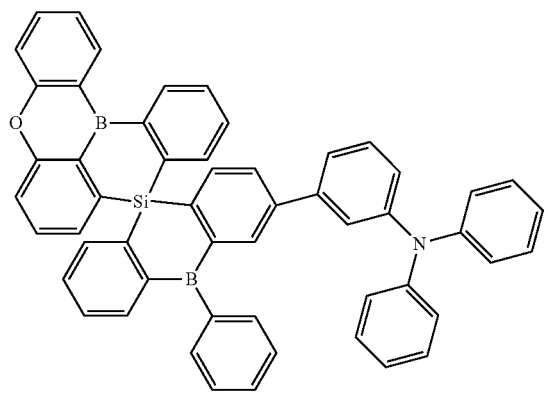
M123
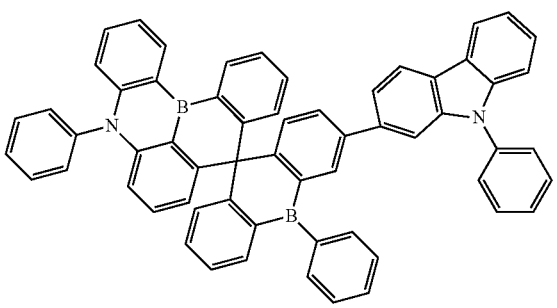
M124
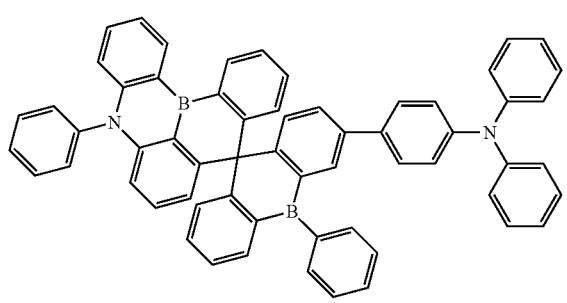
M125
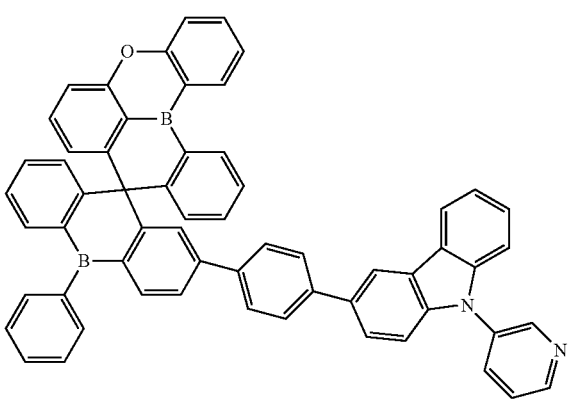

-continued
M126
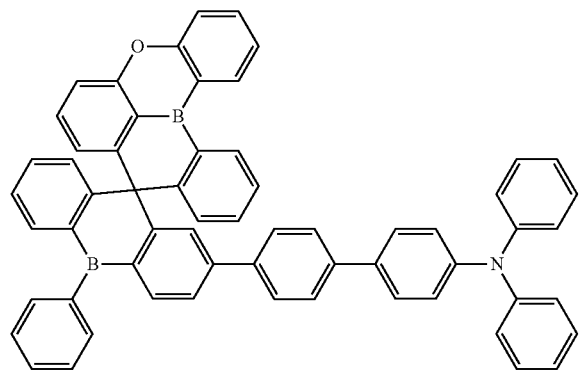
M127
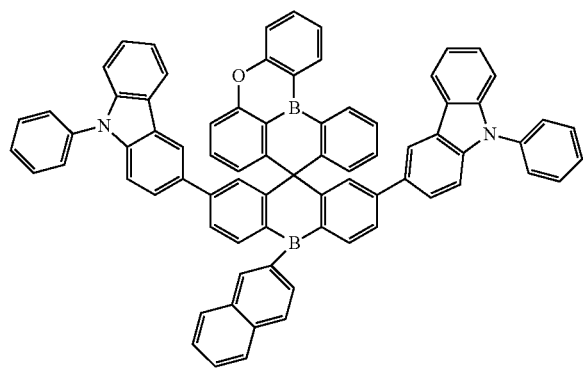
M128
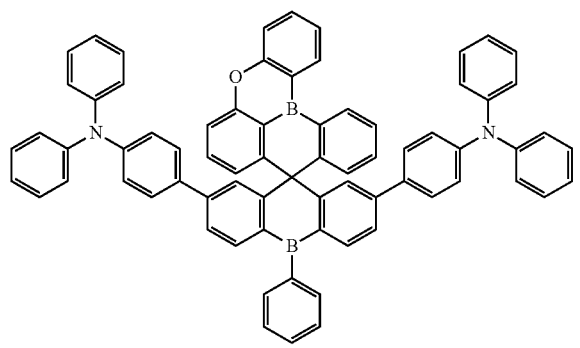
M129
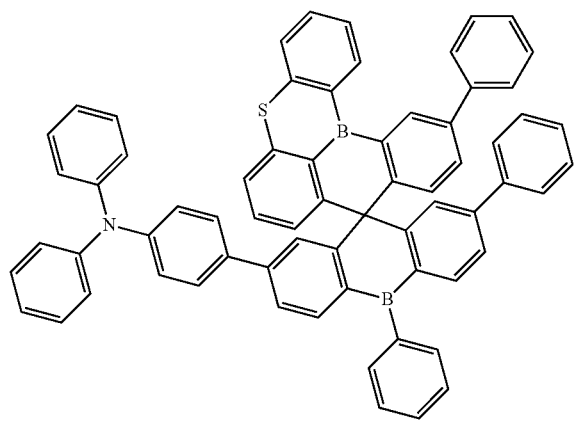
M130
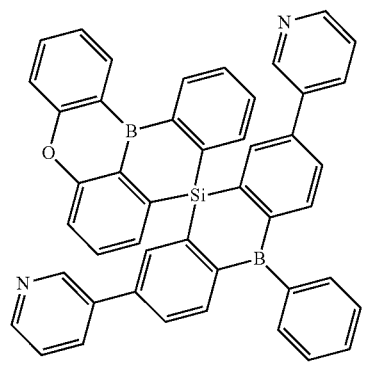
M131
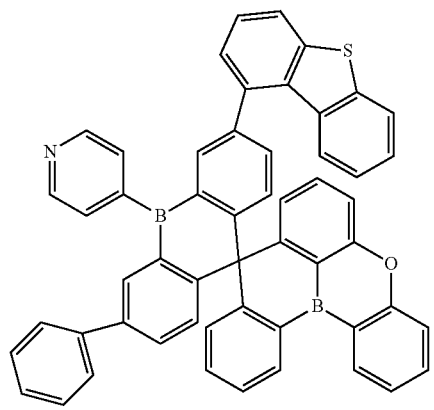

-continued
M132
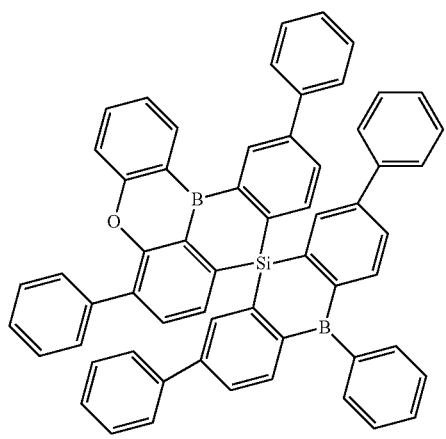
M133
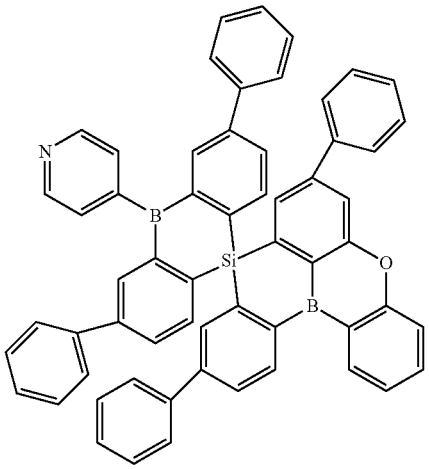
M134
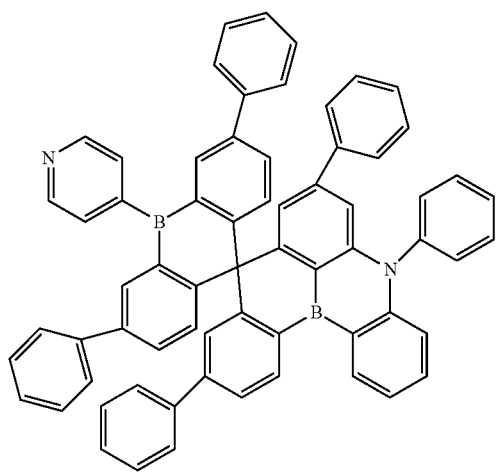
M135
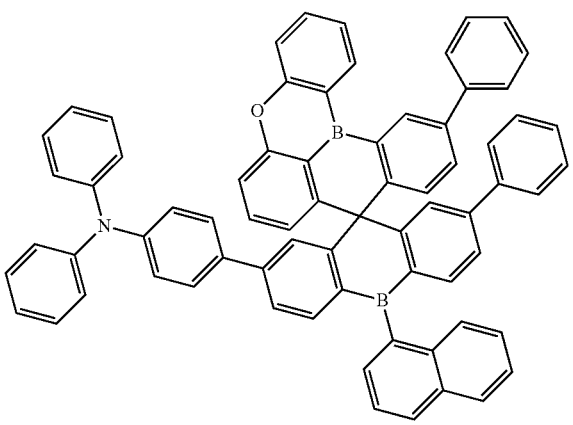
M136
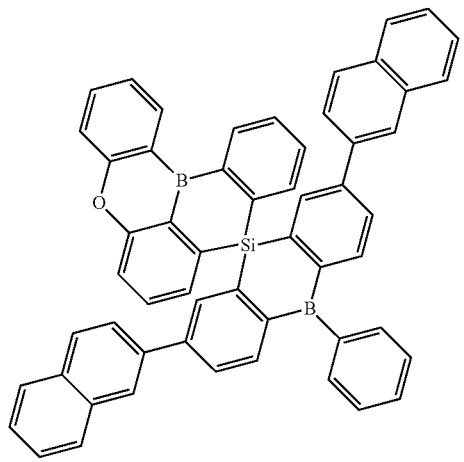
M137
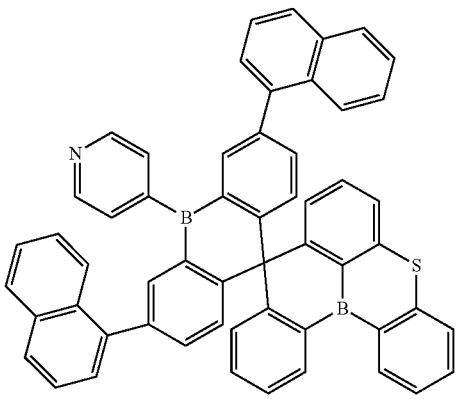

-continued

M138

M139

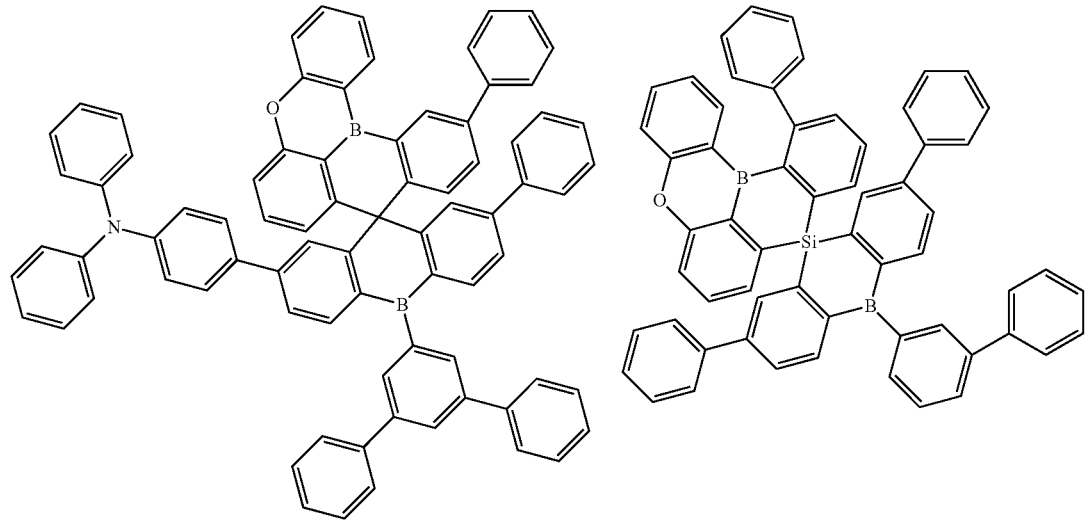

M140

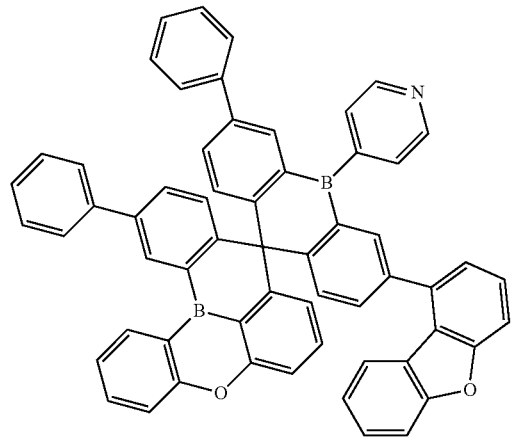

A second aspect of the present disclosure is to provide an OLED device. The OLED device includes an anode, a cathode and an organic thin film disposed between the anode and the cathode, where the organic thin film includes at least one of the organic compounds according to the first aspect.

In an embodiment, the organic thin film includes a light-emitting layer. The light-emitting layer includes at least one of the organic compounds according to the first aspect.

In an embodiment, the organic compound is used as a host material or a guest material of the light-emitting layer.

In an embodiment, the organic compound is used as the guest material of the light-emitting layer.

In an embodiment, an anode material of the OLED device may be a metal, a metal oxide or a conductive polymer. The metal includes copper, gold, silver, iron, chromium, nickel, manganese, palladium, platinum or the like and alloys thereof. The metal oxide includes indium tin oxide (ITO), indium zinc oxide (IZO), zinc oxide, indium gallium zinc oxide (IGZO) or the like. The conductive polymer includes polyaniline, polypyrrole, poly (3-methylthiophene) or the like. In addition to the above materials that facilitate hole injection and combinations thereof, the anode material further includes known materials suitable for use as the anode.

A cathode material of the OLED device may be a metal or a multilayer metal material.

The metal includes aluminum, magnesium, silver, indium, tin, titanium or the like and alloys thereof. The multilayer metal material includes LiF/Al, LiO$_2$/Al, BaF$_2$/Al or the like. In addition to the above materials that facilitate electron injection and combinations thereof, the cathode material further includes known materials suitable for use as the cathode.

The organic thin film of the OLED device includes at least one light-emitting layer (EML) and any one or a combination of at least two of an electron transport layer (ETL), a hole transport layer (HTL), a hole injection layer (HIL), an electron blocking layer (EBL), a hole blocking layer (HBL) and an electron injection layer (EIL) disposed on both sides of the light-emitting layer. A capping layer (CPL) may also be optionally disposed on the cathode of the OLED device (on a side of the cathode facing away from the anode).

In a specific embodiment, as shown in the FIGURE which is a structure diagram of the OLED device, the OLED device includes a substrate 1 and an anode 2, a hole injection layer 3, a hole transport layer 4, an electron blocking layer 5, a light-emitting layer 6, a hole blocking layer 7, an electron transport layer 8, an electron injection layer 9 and a cathode 10 which are stacked on the substrate 1 in sequence. An arrow represents a direction of light emission. The light-emitting layer 6 includes at least one of the organic compounds according to the first aspect.

The OLED device may be prepared by the following method: forming the anode on a transparent or opaque smooth substrate, forming an organic thin layer on the anode, and forming the cathode on the organic thin layer. The organic thin layer may be formed by a known film formation method such as evaporation deposition, sputtering, spin coating, impregnation and ion plating.

A third aspect of the present disclosure is to provide a display panel. The display panel includes the OLED device according to the second aspect.

In an embodiment, the organic compound having a structure represented by Formula I and provided by the present disclosure may be prepared by one of the following synthesis routes one to four:

(1) when Y is C, route one is as follows:

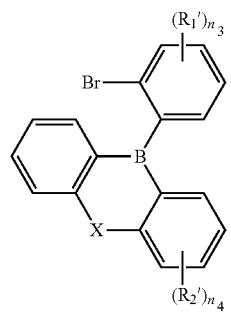

+

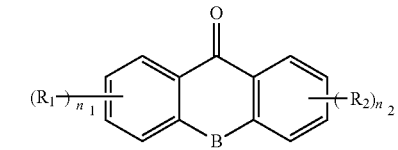

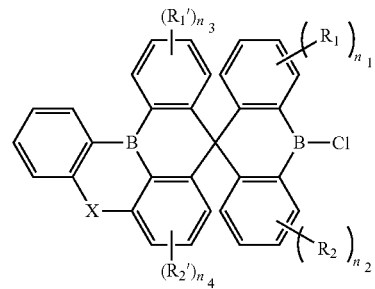

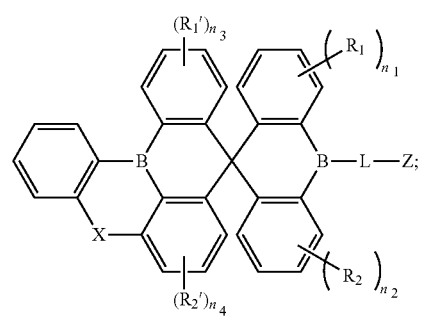

(2) when Y is C, route two is as follows:

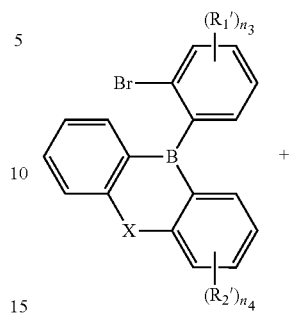

+

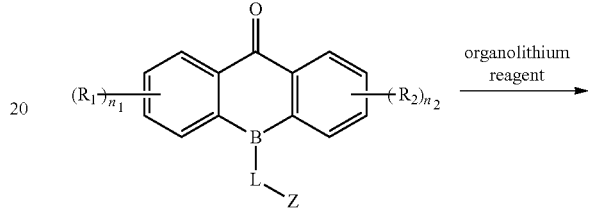

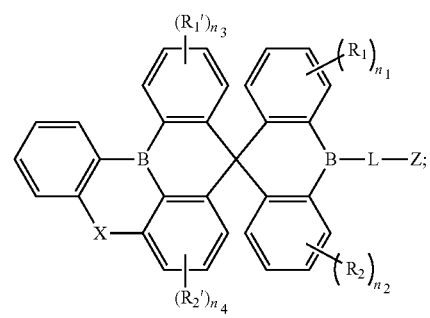

(3) when Y is Si, route three is as follows:

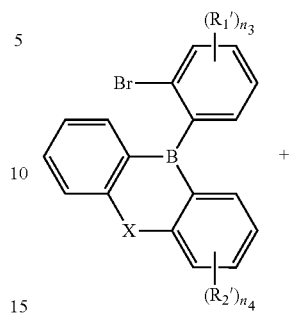

+

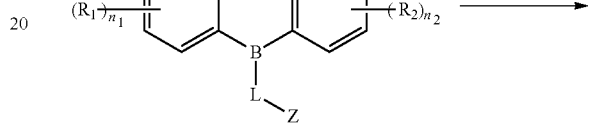

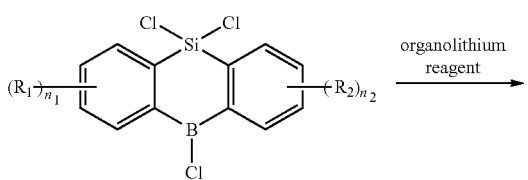

-continued

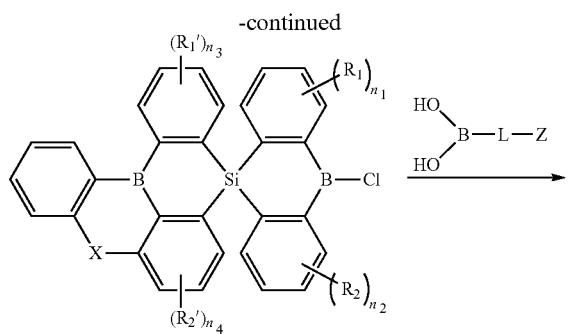

(4) when Y is Si, route four is as follows:

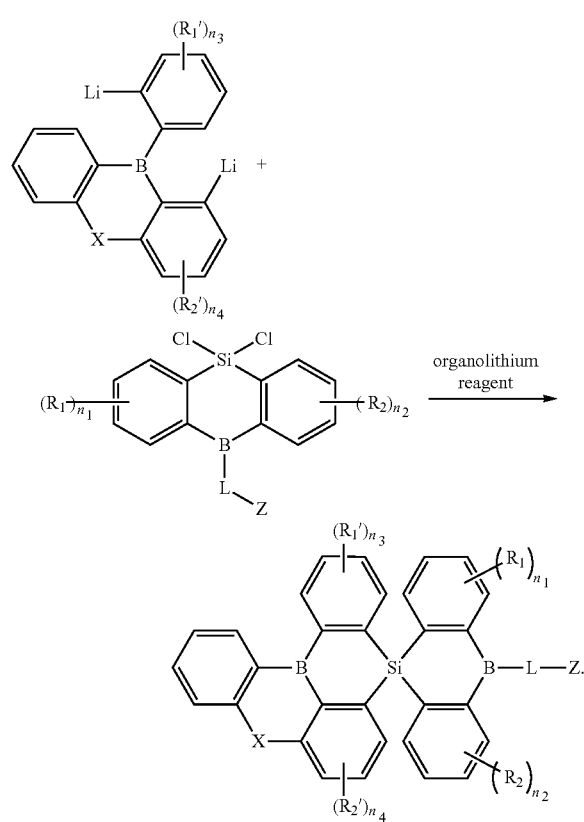

In the above synthesis routes, X, L, Z, $R_1$, $R_2$, $R_1'$, $R_2'$, $n_1$, $n_2$, $n_3$ and $n_4$ are limited within the same range as in Formula I. Moreover, the groups such as $R_1$ and $R_2$ may be introduced into the organic compound by using a raw material containing corresponding substituents (as shown above) or by reacting halogen on a skeletal structure with

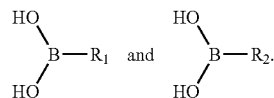

Example 1

Organic Compound M1 has the following structure:

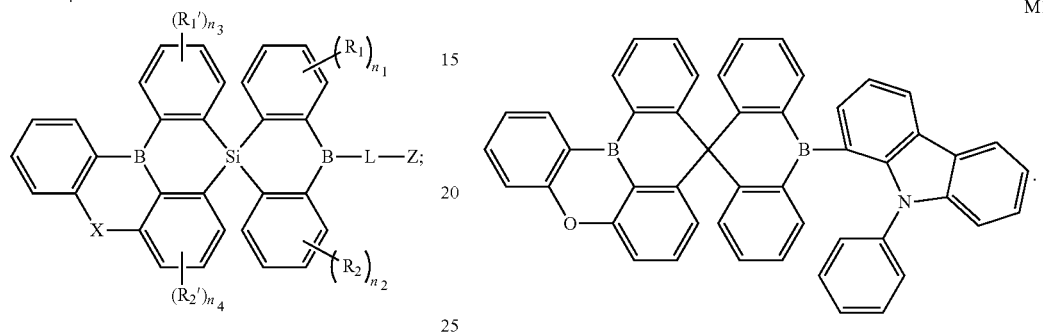

A method for preparing Organic Compound M1 includes the steps below.

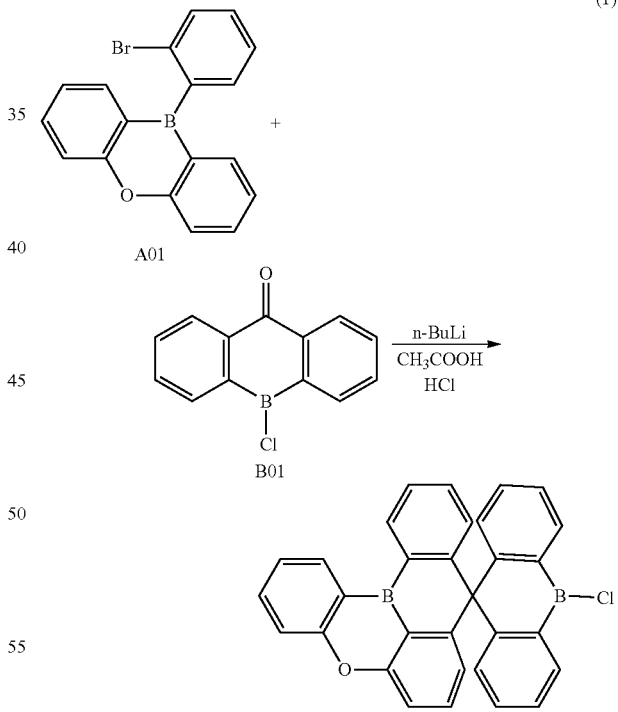

Compound A01 (30 mmol) was added to a three-necked flask and dissolved in tetrahydrofuran (200 mL) through stirring. Under nitrogen protection, the solution was cooled to −78° C. Then a 2 M solution of n-butyllithium (n-BuLi) (15 mL) was slowly added dropwise and then the system was stirred for 0.5 h. Then a solution of Compound B01 (30 mmol) in tetrahydrofuran (THF) was added dropwise to the reaction solution. After dropping, the reaction solution was warmed to room temperature and stirred for 2 h. A saturated solution of ammonium chloride was added to quench the reaction, water was added and layers were separated, and an organic phase was concentrated to obtain an oily substance. A mixture of acetic acid (100 mL) and HCl (20 mL) was added to the oily substance, and the system was stirred and refluxed for 12 h. The reaction solution was cooled, added with saturated salt solution, and extracted with dichloromethane to obtain the organic phase. The organic phase was washed three times with water, evaporated to remove the solvent. The residue was recrystallized from dichloromethane/petroleum ether to obtain Compound M01-1.

(2)

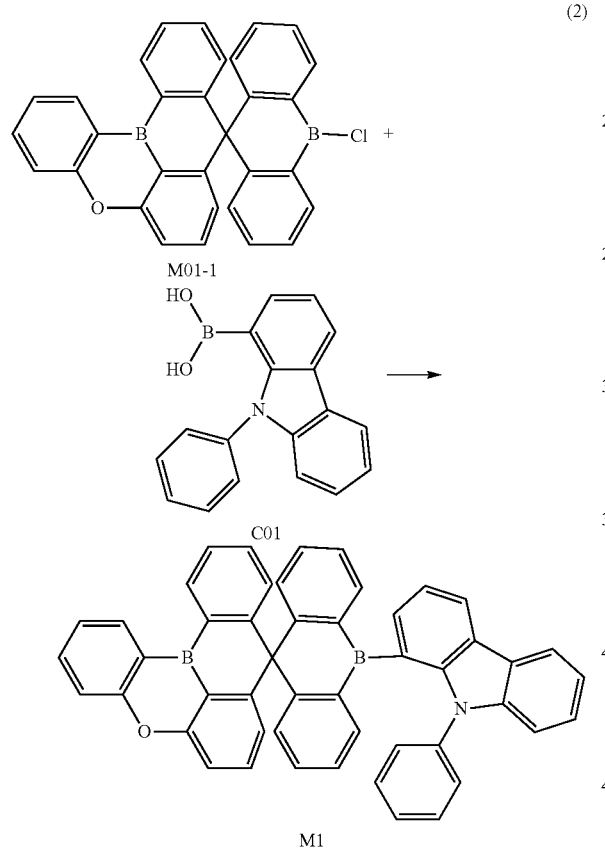

In a 250 mL round-bottom flask, M01-1 (10 mmol), C01 (12 mmol) and $Na_2CO_3$ (80 mmol) were separately added to the solvent of toluene/absolute ethyl alcohol (EtOH)/$H_2O$ (75/25/50, mL) to form a mixed solution. Then tetrakis (triphenylphosphine)palladium ($Pd(PPh_3)_4$) (0.48 mmol) was added to the above mixed solution and the system was refluxed for 20 h in a nitrogen atmosphere to obtain an intermediate. The intermediate was cooled to room temperature, added to water, filtered through a Celite pad, extracted with dichloromethane, washed with water, dried over anhydrous magnesium sulfate, filtered and evaporated. The crude product was purified through silica gel column chromatography to obtain the target product M1.

Results of an elemental analysis of Organic Compound M1 (molecular formula $C_{49}H_{31}B_2NO$): theoretical values: C 87.66, H 4.65, B 3.22, N 2.09, O 2.38; measured values: C 87.66, H 4.65, B 3.22, N 2.09, O 2.38. A relative molecular mass obtained through liquid chromatography-mass spectrometry: theoretical value: 671.26; measured value: 671.28.

Example 2

Organic Compound M19 has the following structure:

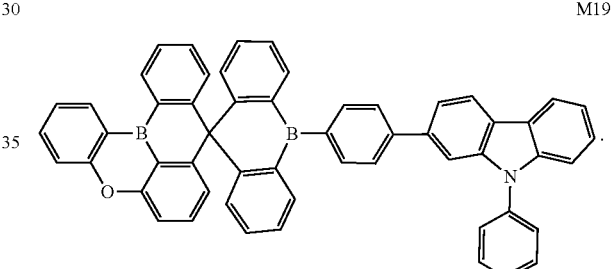

A method for preparing Organic Compound M19 includes the following step:

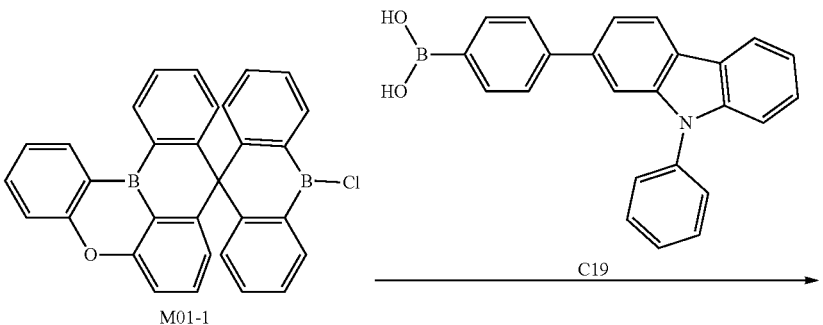

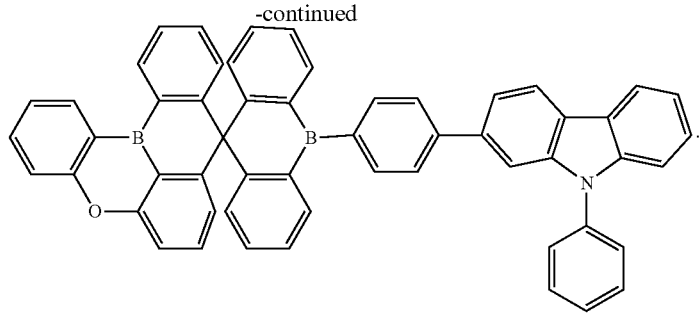

M19

In a 250 mL round-bottom flask, M01-1 (10 mmol), C19 (12 mmol) and Na$_2$CO$_3$ (80 mmol) were separately added to the solvent of toluene/EtOH/H$_2$O (75/25/50, mL) to form a mixed solution. Then Pd(PPh$_3$)$_4$ (0.48 mmol) was added to the above mixed solution and the system was refluxed for 20 h in a nitrogen atmosphere to obtain an intermediate. The intermediate was cooled to room temperature, added to water, filtered through a Celite pad, extracted with dichloromethane, washed with water, dried over anhydrous magnesium sulfate, filtered and evaporated. The crude product was purified through silica gel column chromatography to obtain the target product M19.

Results of an elemental analysis of Organic Compound M19 (molecular formula C$_{55}$H$_{35}$B$_2$NO): theoretical values: C 88.37, H 4.72, B 2.89, N 1.87, O 2.14; measured values: C 88.37, H 4.72, B 2.89, N 1.87, O 2.14. A relative molecular mass obtained through liquid chromatography-mass spectrometry: theoretical value: 747.29; measured value: 747.28.

Example 3

Organic Compound M39 has the following structure:

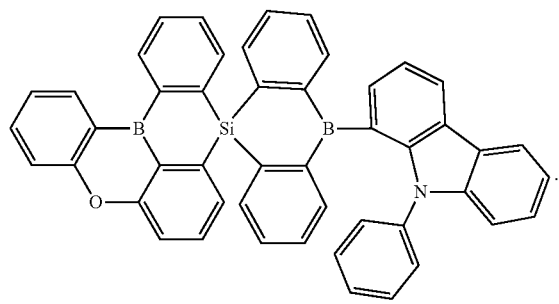

M39

A method for preparing Organic Compound M39 includes the steps below.

(1)

B39 (50 mmol) was dissolved in THF (250 mL), A39 (50 mmol) was dissolved in THF (750 mL), and the solution of B39 was added dropwise to the solution of A39. The obtained mixture was stirred for 16 h at room temperature. After the solvent was removed in vacuum, the residue was dissolved in dichloromethane (250 mL), washed three times with distilled water (200 mL) and dried over sodium sulfate. An organic phase was evaporated, and the residue was recrystallized five times from dioxane to obtain Compound M39-1.

(2)

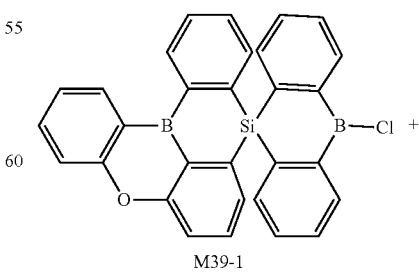

M39-1

-continued

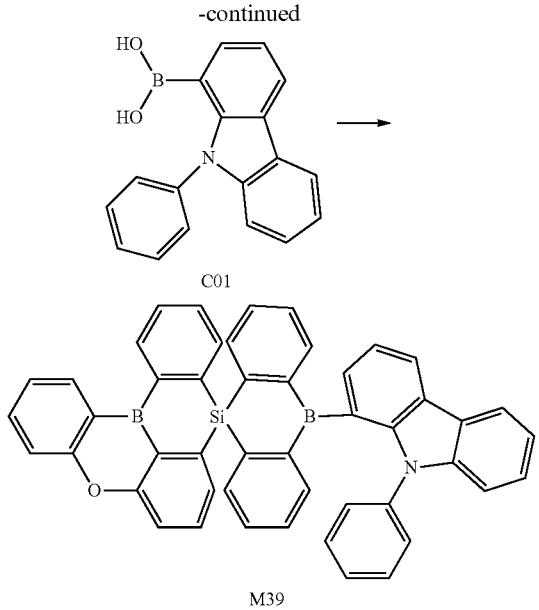

In a 250 mL round-bottom flask, M39-1 (10 mmol), C01 (12 mmol) and Na$_2$CO$_3$ (80 mmol) were separately added to the solvent of toluene/EtOH/H$_2$O (75/25/50, mL) to form a mixed solution. Then Pd(PPh$_3$)$_4$ (0.48 mmol) was added to the above mixed solution and the system was refluxed for 20 h in a nitrogen atmosphere to obtain an intermediate. The intermediate was cooled to room temperature, added to water, filtered through a Celite pad, extracted with dichloromethane, washed with water, dried over anhydrous magnesium sulfate, filtered and evaporated. The crude product was purified through silica gel column chromatography to obtain the target product M39.

Results of an elemental analysis of Organic Compound M39 (molecular formula C$_{48}$H$_{31}$B$_2$NOSi): theoretical values: C 83.86, H 4.55, B 3.15, N 2.04, O 2.33, Si 4.09; measured values: C 83.86, H 4.55, B 3.15, N 2.04, O 2.33, Si 4.09. A relative molecular mass obtained through liquid chromatography-mass spectrometry: theoretical value: 687.24; measured value: 687.25.

Example 4

Organic Compound M40 has the following structure:

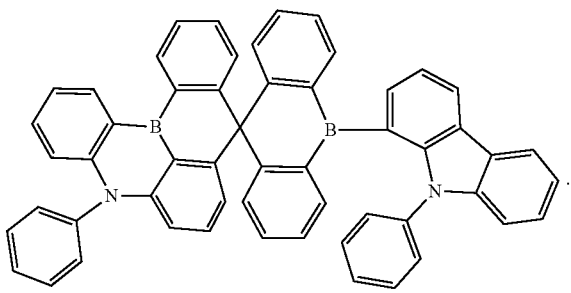

M40

A method for preparing Organic Compound M40 includes the steps below.

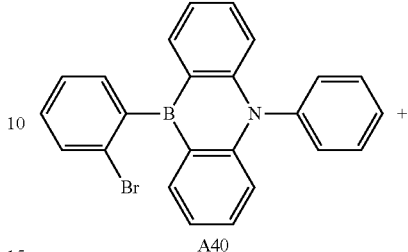

(1)

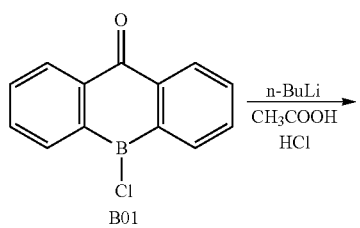

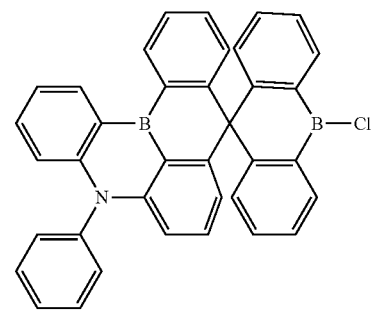

M40-1

Compound A40 (30 mmol) was added to a three-necked flask and dissolved in tetrahydrofuran (200 mL) through stirring. Under nitrogen protection, the solution was cooled to −78° C. Then a 2 M solution of n-BuLi (15 mL) was slowly added dropwise and then the system was stirred for 0.5 h. Then a solution of Compound B01 (30 mmol) in tetrahydrofuran was added dropwise to the reaction solution. After dropping, the reaction solution was warmed to room temperature and stirred for 2 h. A saturated solution of ammonium chloride was added to quench the reaction, water was added and layers were separated, and an organic phase was concentrated to obtain an oily substance. A mixture of acetic acid (100 mL) and HCl (20 mL) was added to the oily substance, and the system was stirred and refluxed for 12 h. The reaction solution was cooled, added with saturated salt solution, and extracted with dichloromethane to obtain the organic phase. The organic phase was washed three times with water, evaporated to remove the solvent. The residue was recrystallized from dichloromethane/petroleum ether to obtain Compound M40-1.

(2)

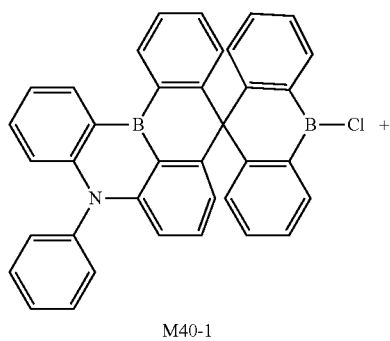

M40-1

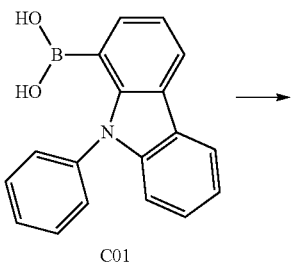

C01

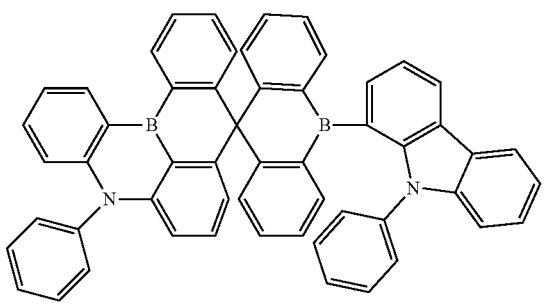

M40

In a 250 mL round-bottom flask, M40-1 (10 mmol), C01 (12 mmol) and Na$_2$CO$_3$ (80 mmol) were separately added to the solvent of toluene/EtOH/H$_2$O (75/25/50, mL) to form a mixed solution. Then Pd(PPh$_3$)$_4$ (0.48 mmol) was added to the above mixed solution and the system was refluxed for 20 h in a nitrogen atmosphere to obtain an intermediate. The intermediate was cooled to room temperature, added to water, filtered through a Celite pad, extracted with dichloromethane, washed with water, dried over anhydrous magnesium sulfate, filtered and evaporated. The crude product was purified through silica gel column chromatography to obtain the target product M40.

Results of an elemental analysis of Organic Compound M40 (molecular formula C$_{55}$H$_{36}$B$_2$N$_2$): theoretical values: C 88.49, H 4.86, B 2.90, N 3.75; measured values: C 88.49, H 4.86, B 2.90, N 3.75. A relative molecular mass obtained through liquid chromatography-mass spectrometry: theoretical value: 746.31; measured value: 746.30.

Example 5

Organic Compound M41 has the following structure:

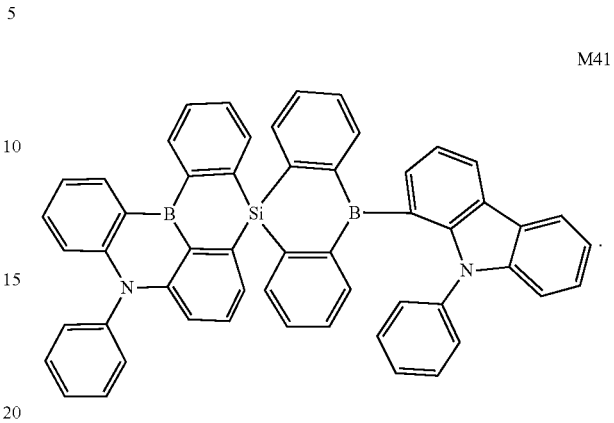

M41

A method for preparing Organic Compound M41 includes the steps below.

(1)

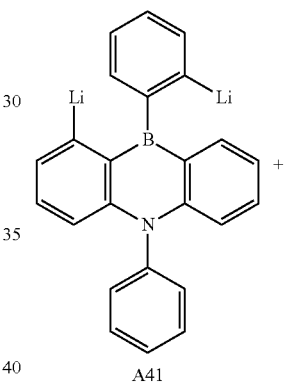

A41

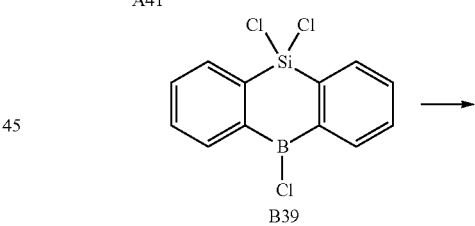

B39

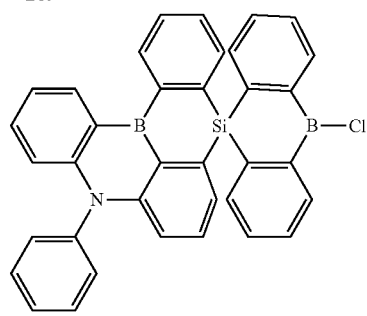

M41-1

This step differs from step (1) in Example 3 only in that A39 was replaced with A41 in an equimolar amount, and other raw materials and process parameters were the same so that Compound M41-1 was obtained.

(2)

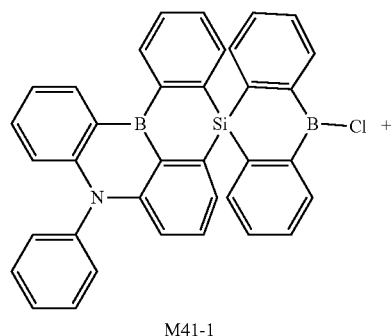

M41-1

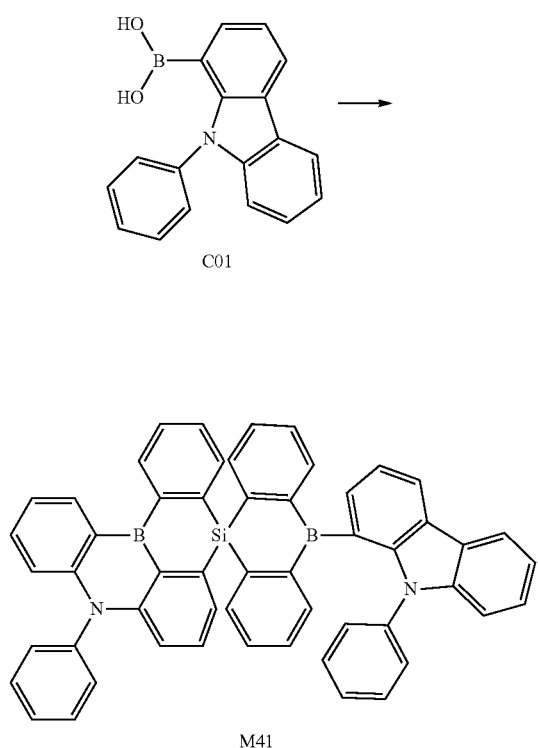

This step differs from step (2) in Example 3 only in that M39-1 was replaced with M41-1 in an equimolar amount, and other raw materials and process parameters were the same so that the target product M41 was obtained.

Results of an elemental analysis of Organic Compound M41 (molecular formula $C_{54}H_{36}B_2N_2Si$): theoretical values: C 85.05, H 4.76, B 2.84, N 3.67, Si 3.68; measured values: C 85.05, H 4.76, B 2.84, N 3.67, Si 3.68. A relative molecular mass obtained through liquid chromatography-mass spectrometry: theoretical value: 762.28; measured value: 762.30.

Example 6

Organic Compound M43 has the following structure:

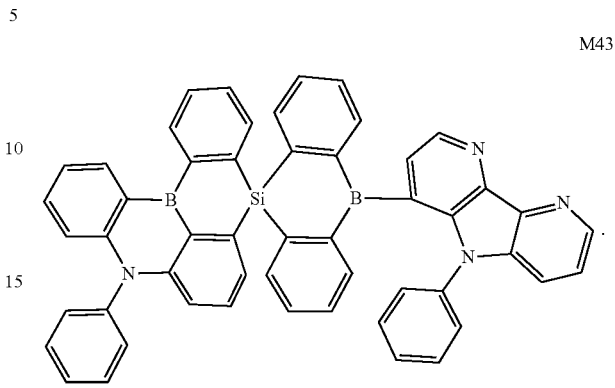

M43

A method for preparing Organic Compound M43 includes the following step:

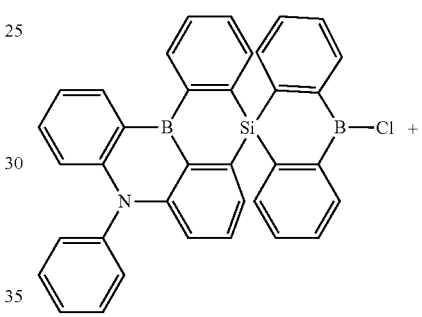

This step differs from step (2) in Example 5 only in that C01 was replaced with C43 in an equimolar amount, and other raw materials and process parameters were the same so that the target product M43 was obtained.

Results of an elemental analysis of Organic Compound M43 (molecular formula $C_{52}H_{34}B_2N_4Si$): theoretical values: C 81.69, H 4.48, B 2.83, N 7.33, Si 3.67; measured values:

C 81.69, H 4.48, B 2.83, N 7.33, Si 3.67. A relative molecular mass obtained through liquid chromatography-mass spectrometry: theoretical value: 764.27; measured value: 764.30.

Example 7

Organic Compound M44 has the following structure:

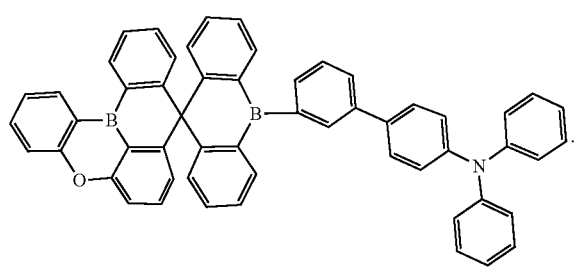

M44

A method for preparing Organic Compound M44 differs from Example 1 only in that C01 in step (2) was replaced with C44

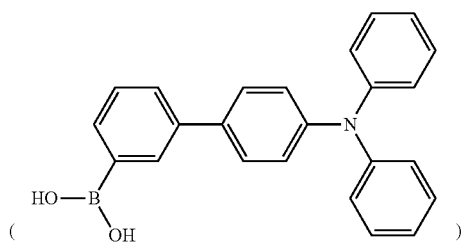

C44 in an equimolar amount, and other raw materials and process parameters were the same so that the target product M44 was obtained.

Results of an elemental analysis of Organic Compound M44 (molecular formula $C_{55}H_{37}B_2NO$): theoretical values: C 88.14, H 4.98, B 2.88, N 1.87, O 2.13; measured values: C 88.14, H 4.98, B 2.88, N 1.87, O 2.13. A relative molecular mass obtained through liquid chromatography-mass spectrometry: theoretical value: 749.31; measured value: 749.32.

Example 8

Organic Compound M45 has the following structure:

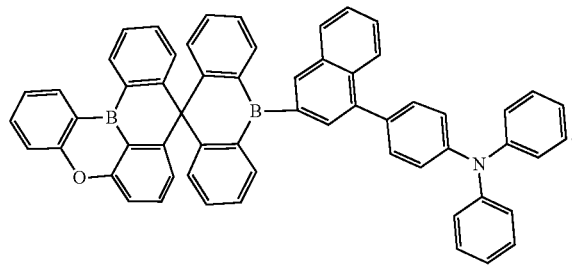

M45

A method for preparing Organic Compound M45 differs from Example 1 only in that C01 in step (2) was replaced with C45

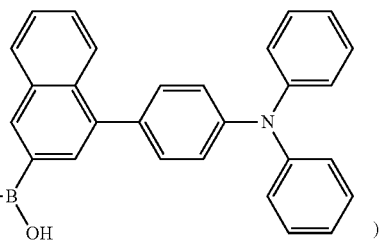

C45 in an equimolar amount, and other raw materials and process parameters were the same so that the target product M45 was obtained.

Results of an elemental analysis of Organic Compound M45 (molecular formula $C_{59}H_{39}B_2NO$): theoretical values: C 88.63, H 4.92, B 2.70, N 1.75, O 2.00; measured values: C 88.63, H 4.92, B 2.70, N 1.75, O 2.0. A relative molecular mass obtained through liquid chromatography-mass spectrometry: theoretical value: 799.32; measured value: 799.34.

Example 9

Organic Compound M117 has the following structure:

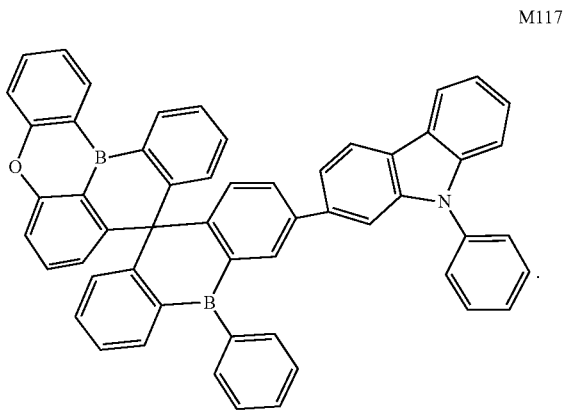 [SMILES: c1ccc(B2c3ccccc3C3(c4ccc(-c5ccc6c7ccccc7n(-c7ccccc7)c6c5)cc42)c2ccccc2B2c4ccccc4Oc4cccc3c42)cc1]

M117

A method for preparing Organic Compound M117 includes the steps below.

(1)

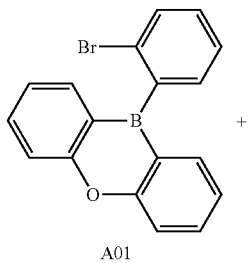

A01

-continued

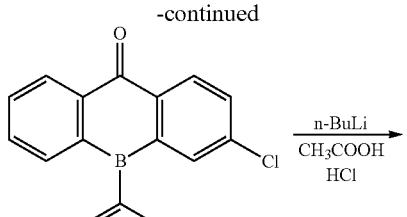
B117

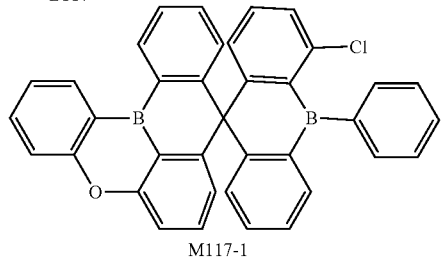
M117-1

Compound A01 (30 mmol) was added to a three-necked flask and dissolved in tetrahydrofuran (200 mL) through stirring. Under nitrogen protection, the solution was cooled to −78° C. Then a 2 M solution of n-BuLi (15 mL) was slowly added dropwise and then the system was stirred for 0.5 h. Then a solution of Compound B117 (30 mmol) in tetrahydrofuran was added dropwise to the reaction solution. After dropping, the reaction solution was warmed to room temperature and stirred for 2 h. A saturated solution of ammonium chloride was added to quench the reaction, water was added and layers were separated, and an organic phase was concentrated to obtain an oily substance. A mixture of acetic acid (100 mL) and HCl (20 mL) was added to the oily substance, and the system was stirred and refluxed for 12 h. The reaction solution was cooled, added with saturated salt solution, extracted with dichloromethane to obtain the organic phase. The organic phase was washed three times with water, evaporated to remove the solvent. The residue was recrystallized from dichloromethane/petroleum ether to obtain Compound M117-1.

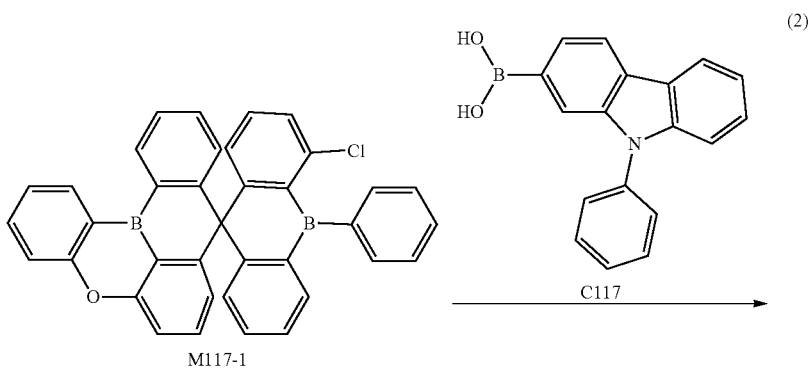

(2)

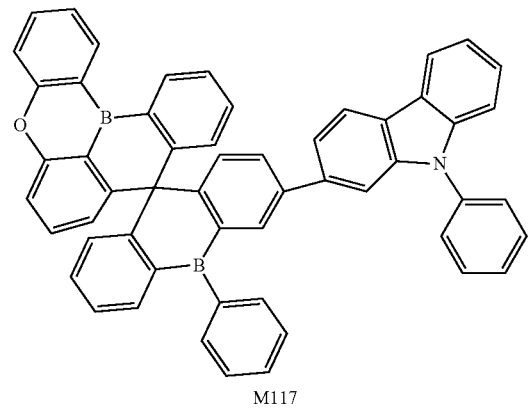
M117

In a 250 mL round-bottom flask, M117-1 (10 mmol), C117 (12 mmol) and Na₂CO₃ (80 mmol) were separately added to the solvent of toluene/EtOH/H₂O (75/25/50, mL) to form a mixed solution. Then Pd(PPh₃)₄ (0.48 mmol) was added to the above mixed solution and the system was refluxed for 20 h in a nitrogen atmosphere to obtain an intermediate. The intermediate was cooled to room temperature, added to water, filtered through a Celite pad, extracted with dichloromethane, washed with water, dried over anhydrous magnesium sulfate, filtered and evaporated. The crude product was purified through silica gel column chromatography to obtain the target product M117.

Results of an elemental analysis of Organic Compound M117 (molecular formula $C_{55}H_{35}B_2NO$): theoretical values: C 88.37, H 4.72, B 2.89, N 1.87, O 2.14; measured values: C 88.37, H 4.72, B 2.89, N 1.87, O 2.14. A relative molecular mass obtained through liquid chromatography-mass spectrometry: theoretical value: 749.29; measured value: 749.28.

Example 10

Organic Compound M118 has the following structure:

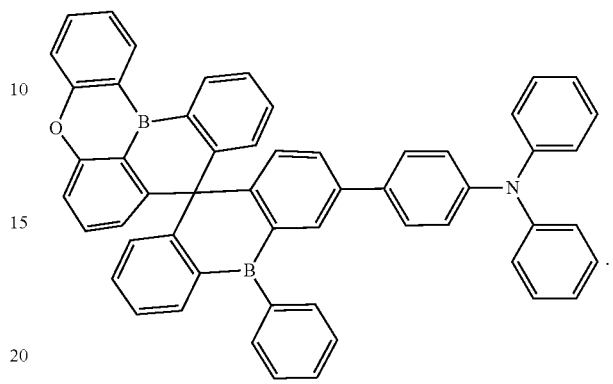

A method for preparing Organic Compound M118 includes the following step:

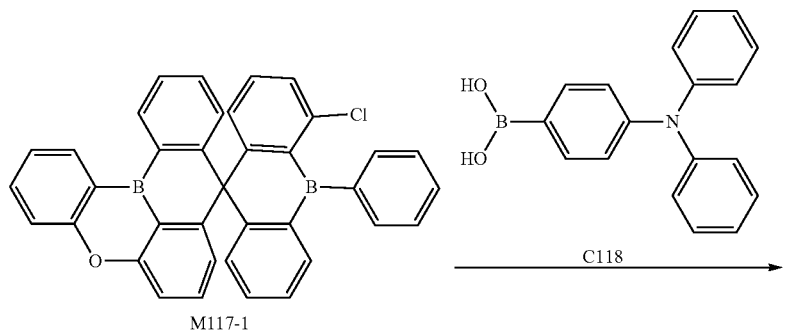

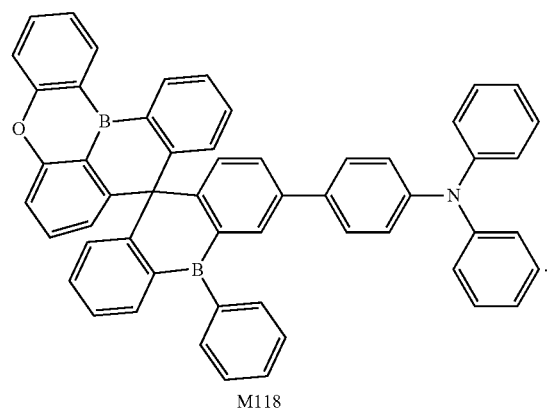

Example 10 differs from Example 9 only in that C117 in step (2) was replaced with C118 in an equimolar amount, and other raw materials and process parameters were the same so that the target product M118 was obtained.

Results of an elemental analysis of Organic Compound M118 (molecular formula $C_{55}H_{37}B_2NO$): theoretical values: C 88.14, H 4.98, B 2.88, N 1.87, O 2.13; measured values: C 88.14, H 4.98, B 2.88, N 1.87, O 2.13. A relative molecular mass obtained through liquid chromatography-mass spectrometry: theoretical value: 749.31; measured value: 749.32.

Simulated Calculations of Compounds

By use of a density-functional theory (DFT), for the organic compounds provided by the present disclosure, the distribution of frontier molecular orbitals (HOMO and LUMO) was optimized and calculated by using a Gaussian 09 package (Gaussian Inc.) at a calculation level of B3LYP/6-31G(d). Moreover, a singlet energy level $E_S$ and a triplet energy level $E_T$ of a molecule of the compound were simulated and calculated based on a time-dependent density-functional theory (TD-DFT), and $\Delta E_{ST}$ was obtained. The results are shown in Table 1.

TABLE 1

| Compound | HOMO (eV) | LUMO (eV) | $E_S$ (eV) | $E_T$ (eV) | $\Delta E_{ST}$ (eV) |
|---|---|---|---|---|---|
| M1 | −1.78 | −5.30 | 2.929 | 2.7979 | 0.1311 |
| M19 | −1.80 | −5.37 | 3.1961 | 2.9138 | 0.2823 |
| M39 | −1.90 | −5.25 | 2.7294 | 2.6546 | 0.0748 |
| M40 | −1.64 | −5.23 | 2.9228 | 2.6677 | 0.2551 |
| M41 | −1.78 | −5.18 | 2.7651 | 2.5903 | 0.1748 |
| M43 | −2.01 | −5.44 | 2.9793 | 2.6836 | 0.2957 |
| M44 | −1.79 | −4.90 | 2.7764 | 2.7188 | 0.0576 |
| M45 | −1.81 | −4.88 | 2.7139 | 2.4623 | 0.2516 |
| M117 | −1.79 | −5.35 | 3.1535 | 2.8544 | 0.2991 |
| M118 | −1.79 | −4.88 | 2.7264 | 2.5697 | 0.1567 |

As can be seen from the results in Table 1, the organic compounds provided by the present disclosure each have a relatively suitable HOMO energy level and LUMO energy level, which is conducive to matching energy levels of compounds in adjacent layers and achieving efficient exciton recombination. Moreover, the organic compounds provided by the present disclosure each have a relatively high $E_S$, a relatively high $E_T$ and a relatively small $\Delta E_{ST}$ (for example, $\Delta E_{ST} \leq 0.30$ eV) and achieves a relatively small energy level difference between a singlet state and a triplet state, which is conducive to reverse intersystem crossing from the triplet energy level to the singlet energy level. The organic compounds are suitable for use as TADF materials to achieve higher luminescence efficiency.

Several application examples of the organic compounds of the present disclosure applied to OLED devices are listed below.

Application Example 1

A structure diagram of an OLED device is shown in the FIGURE. The OLED device includes a substrate 1, an anode 2, a hole injection layer 3, a hole transport layer 4, an electron blocking layer 5, a light-emitting layer 6, a hole blocking layer 7, an electron transport layer 8, an electron injection layer 9 and a cathode 10 which are stacked in sequence. An arrow in the FIGURE represents a direction of light emission.

The OLED device is prepared through steps described below.

(1) A glass substrate 1 with an indium tin oxide (ITO) anode 2 (with a thickness of 100 nm) was sonicated in isopropanol and deionized water for 30 min separately, and cleaned under ozone for about 10 min. The cleaned glass substrate 1 was installed onto a vacuum deposition device.

(2) Compound a was deposited by means of vacuum evaporation on the ITO anode 2 as a hole injection layer 3 with a thickness of 10 nm.

(3) Compound b was deposited by means of vacuum evaporation on the hole injection layer 3 as a hole transport layer 4 with a thickness of 40 nm.

(4) Compound c was deposited by means of vacuum evaporation on the hole transport layer 4 as an electron blocking layer 5 with a thickness of 10 nm.

(5) A light-emitting host compound d and Organic Compound M1 (a guest material) provided in Example 1 were co-deposited at a doping ratio of 10% (mass ratio) by means of vacuum evaporation on the electron blocking layer 5 as a light-emitting layer 6 with a thickness of 30 nm.

(6) Compound e was deposited by means of vacuum evaporation on the light-emitting layer 6 as a hole blocking layer 7 with a thickness of 10 nm.

(7) Compound f was deposited by means of vacuum evaporation on the hole blocking layer 7 as an electron transport layer 8 with a thickness of 30 nm.

(8) Compound h (LiF) was deposited by means of vacuum evaporation on the electron transport layer 8 as an electron injection layer 9 with a thickness of 2 nm.

(9) An aluminum electrode was deposited by means of vacuum evaporation on the electron injection layer 9 as a cathode 10 with a thickness of 100 nm so that the OLED device was obtained.

The compounds used in the OLED device have the following structures:

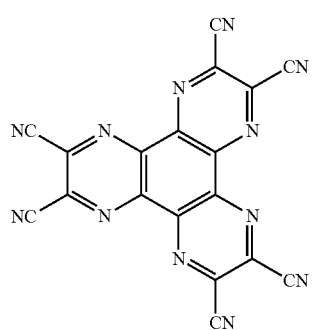

Compound a

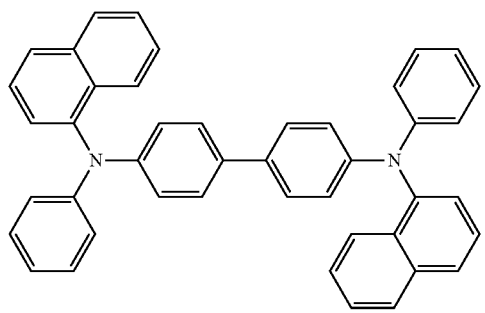

Compound b

-continued

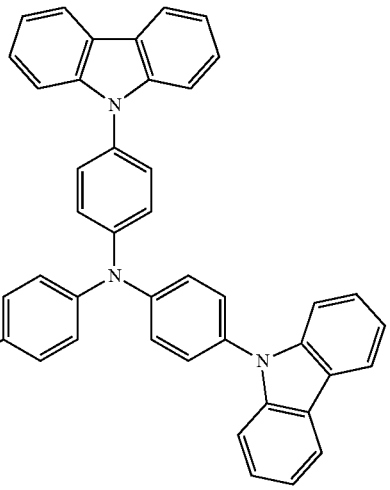

Compound c

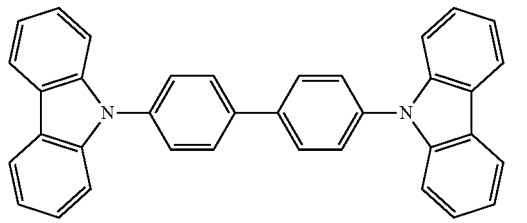

Compound d

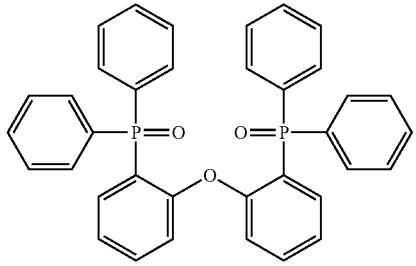

Compound e

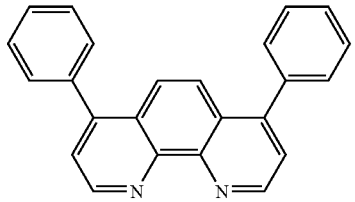

Compound f

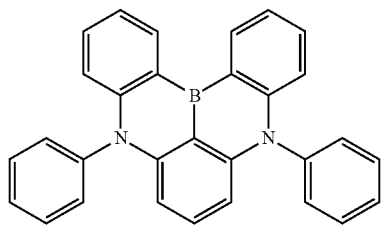

Comparative Compound

Application Examples 2 to 13 and Comparative Example 1

An OLED device in each of Application Examples 2 to 13 and Comparative Example 1 differs from that in Application Example 1 only in that Organic Compound M1 in step (5) was replaced with a respective compound shown in Table 2 in an equivalent amount, and other layer structures, materials and preparation methods were the same as those in Application Example 1.

Performance Evaluation of OLED Devices

Currents were measured using a Keithley 2365A digital nanovoltmeter at different voltages for the OLED devices and then divided by a light-emitting area so that the current densities of the OLED devices at different voltages were obtained. The luminance and radiant energy flux density of the OLED devices at different voltages were tested using a Konicaminolta CS-2000 spectrometer. According to the current densities and luminance of the OLED device at different voltages, a turn-on voltage and current efficiency (CE, Cd/A) at the same current density (10 mA/cm$^2$) were obtained, where VON was a turn-on voltage under the luminance of 1 Cd/m$^2$. A lifetime LT95 was obtained by measuring time taken for the OLED device to reach 95% of initial luminance (under a condition of 50 mA/cm$^2$). The specific data are shown in Table 2.

TABLE 2

| OLED Device | Guest Material of Light-emitting Layer | $V_{ON}$ (V) | CE (Cd/A) | LT95 (h) |
|---|---|---|---|---|
| Application Example 1 | M1 | 4.08 | 12.0 | 45 |
| Application Example 2 | M19 | 4.14 | 11.3 | 42 |
| Application Example 3 | M39 | 4.11 | 11.9 | 47 |
| Application Example 4 | M40 | 4.10 | 11.7 | 40 |
| Application Example 5 | M41 | 4.12 | 11.8 | 42 |
| Application Example 6 | M43 | 4.15 | 11.5 | 43 |
| Application Example 7 | M44 | 4.07 | 12.2 | 46 |
| Application Example 8 | M45 | 4.10 | 11.8 | 45 |
| Application Example 9 | M117 | 4.12 | 11.7 | 41 |
| Application Example 10 | M118 | 4.09 | 11.9 | 44 |
| Application Example 11 | M23 | 4.17 | 11.4 | 42 |
| Application Example 12 | M24 | 4.13 | 11.8 | 41 |
| Application Example 13 | M26 | 4.10 | 11.6 | 43 |
| Comparative Example 1 | Comparative Compound | 4.25 | 9.95 | 36 |

As can be seen from the test results in Table 2, the organic compounds provided by the present disclosure are applied to the OLED devices such that the devices each have a relatively low turn-on voltage, relatively high luminescence efficiency and a relatively long lifetime, for example, the working voltage ≤4.15 V, the current efficiency (CE)≥11.3 Cd/A and the lifetime LT95≥40 h. Compared with the device in the comparative example, the OLED device using the organic compound of the present disclosure has a reduced working voltage (turn-on voltage) and significantly improved luminescence efficiency. This may result from a relatively twisted structure of the organic compound of the present disclosure so that the organic compound has a relatively small overlap between the HOMO energy level and the LUMO energy level and a relatively small energy level difference $\Delta E_{ST}$, which achieves efficient reverse intersystem crossing (RISC), causes more triplet excitons to cross to a singlet state for fluorescence emission, and achieves higher luminescence efficiency. Moreover, B-containing units of the organic compound of the present disclosure are joined to form a spiro ring, which improves molecular stability and the stability of the device. The joined spiro ring reduces a degree of stacking among molecules, which is conducive to reducing concentration quenching. The organic compound of the present disclosure has excellent thermal stability and film stability and is more stable when the OLED device is working. Therefore, the organic compound is conducive to preparing the OLED device and extending the lifetime of the OLED device.

The applicant states that although the organic compound and the application thereof of the present disclosure are described through the preceding examples, the present disclosure is not limited to the preceding process steps, which means that the implementation of the present disclosure does not necessarily depend on the preceding process steps. Those skilled in the art are to understand that any improvements made to the present disclosure, equivalent substitutions of selected raw materials, additions of adjuvant ingredients, selections of specific manners or the like in the present disclosure all fall within the protection scope and the disclosure scope of the present disclosure.

What is claimed is:

1. An organic compound having a structure represented by Formula I:

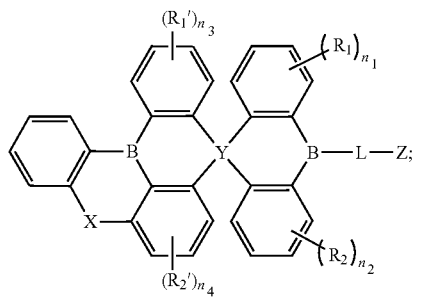

Formula I wherein X is selected from O, S, $NR_3$, $CR_4R_5$ or $SiR_6R_7$;
wherein Y is C or Si;
wherein L is selected from any one of a single bond, substituted or unsubstituted C6-C30 arylene or substituted or unsubstituted C3-C30 heteroarylene;
wherein Z is selected from any one of substituted or unsubstituted C6-C30 aryl, substituted or unsubstituted C3-C30 heteroaryl, substituted or unsubstituted C6-C30 arylamine, or substituted or unsubstituted C6-C30 heteroarylamine;
wherein $R_1$, $R_2$, $R_1'$ and $R_2'$ are each independently selected from any one of deuterium, halogen, cyano, substituted or unsubstituted C1-C30 linear or branched alkyl, substituted or unsubstituted C3-C30 cycloalkyl, C1-C30 alkoxy, substituted or unsubstituted C6-C30 aryl, substituted or unsubstituted C3-C30 heteroaryl, substituted or unsubstituted C6-C30 arylamine, or substituted or unsubstituted C6-C30 heteroarylamine;
wherein $R_3$, $R_4$, $R_5$, $R_6$ and $R_7$ are each independently selected from any one of hydrogen, deuterium, substituted or unsubstituted C1-C30 linear or branched alkyl, substituted or unsubstituted C6-C30 aryl, or substituted or unsubstituted C3-C30 heteroaryl;

wherein $n_1$, $n_2$ and $n_3$ are each independently selected from an integer from 0 to 4; and
wherein $n_4$ is selected from an integer from 0 to 3.

2. The organic compound according to claim 1, wherein the substituted substituents in L, Z, $R_1$, $R_2$, $R_1'$, $R_2'$, $R_3$, $R_4$, $R_5$, $R_6$ and $R_7$ are each independently selected from at least one of deuterium, halogen, cyano, unsubstituted or halogenated C1-C10 linear or branched alkyl, C3-C10 cycloalkyl, unsubstituted or halogenated C1-C10 alkoxy, C6-C20 aryl, C2-C20 heteroaryl, or C6-C20 arylamine.

3. The organic compound according to claim 1, wherein L is selected from a single bond, any one of the following groups, or any one of the following groups substituted with a substituent:

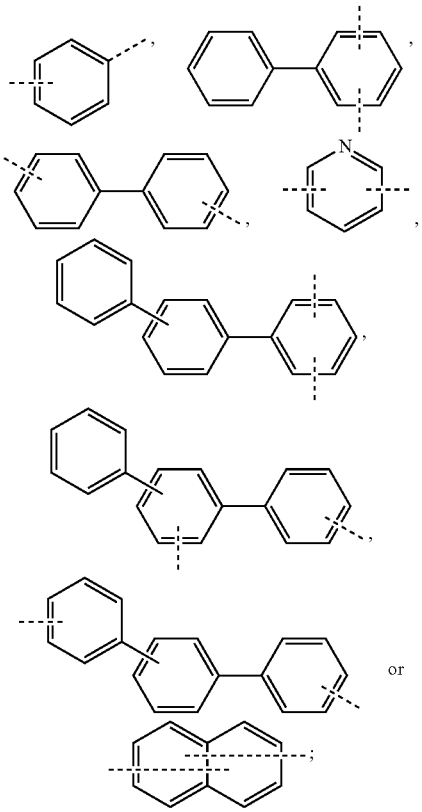

wherein the dashed line represents a linkage site of the group; and
wherein the substituents are each independently selected from at least one of deuterium, C1-C10 linear or branched alkyl, C3-C10 cycloalkyl, C1-C10 alkoxy, C6-C20 aryl, C2-C20 heteroaryl, or C6-C20 arylamine.

4. The organic compound according to claim 1, wherein Z is selected from any one of the following groups, or any one of the following groups substituted with a substituent:

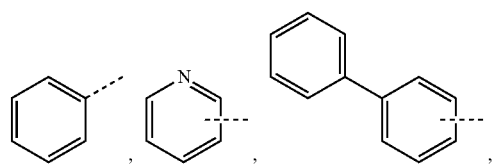

-continued

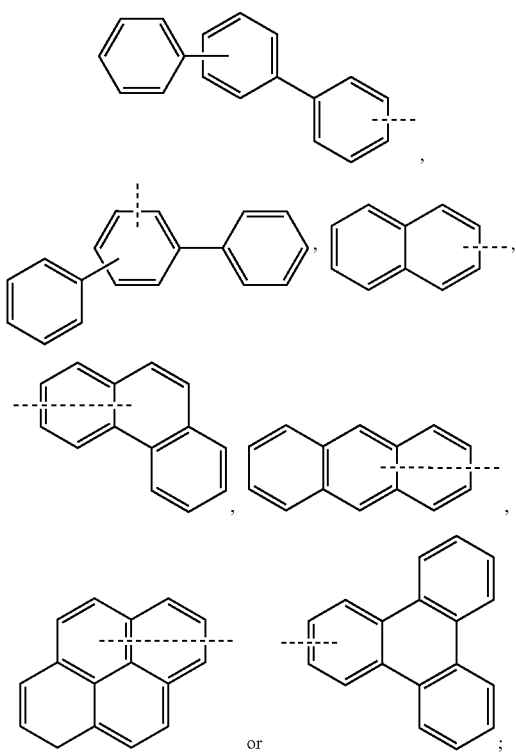

wherein the dashed line represents a linkage site of the group; and wherein the substituents are selected from at least one of deuterium, halogen, cyano, unsubstituted or halogenated C1-C10 linear or branched alkyl, C3-C10 cycloalkyl, unsubstituted or halogenated C1-C10 alkoxy, C6-C20 aryl, C2-C20 heteroaryl, or C6-C20 arylamine.

5. The organic compound according to claim 1, wherein Z is selected from any one of the following groups:

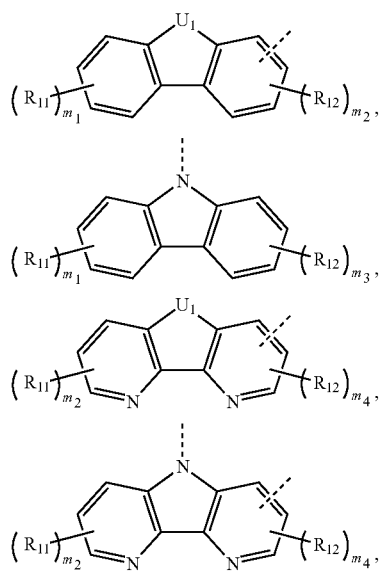

-continued wherein the dashed line represents a linkage site of the group;

wherein $U_1$ and $U_2$ are each independently selected from O, S, $NR_{14}$, $CR_{15}R_{16}$ or $SiR_{17}R_{18}$;

wherein $R_{11}$ and $R_{12}$ are each independently selected from any one of deuterium, halogen, cyano, unsubstituted or halogenated C1-C1 linear or branched alkyl, C3-C10 cycloalkyl, unsubstituted or halogenated C1-C10 alkoxy, C6-C20 aryl, C2-C20 heteroaryl, or C6-C20 arylamine;

wherein $R_{13}$, $R_{14}$, $R_{15}$, $R_{16}$, $R_{17}$ and $R_{18}$ are each independently selected from any one of hydrogen, deuterium, halogen, cyano, unsubstituted or halogenated C1-C10 linear or branched alkyl, C3-C10 cycloalkyl, unsubstituted or halogenated C1-C10 alkoxy, C6-C20 aryl, C2-C20 heteroaryl, or C6-C20 arylamine;

wherein $R_{15}$ and $R_{16}$ are not linked or linked by a chemical bond to form a ring, and $R_{17}$ and $R_{18}$ are not linked or linked by a chemical bond to form a ring;

wherein $m_1$ and $m_3$ are each independently selected from an integer from 0 to 4;

wherein $m_2$ is selected from an integer from 0 to 3; and wherein $m_4$ is selected from an integer from 0 to 2.

6. The organic compound according to claim 5, wherein Z is selected from any one of the following groups, or any one of the following groups substituted with a substituent:

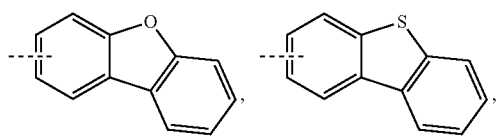

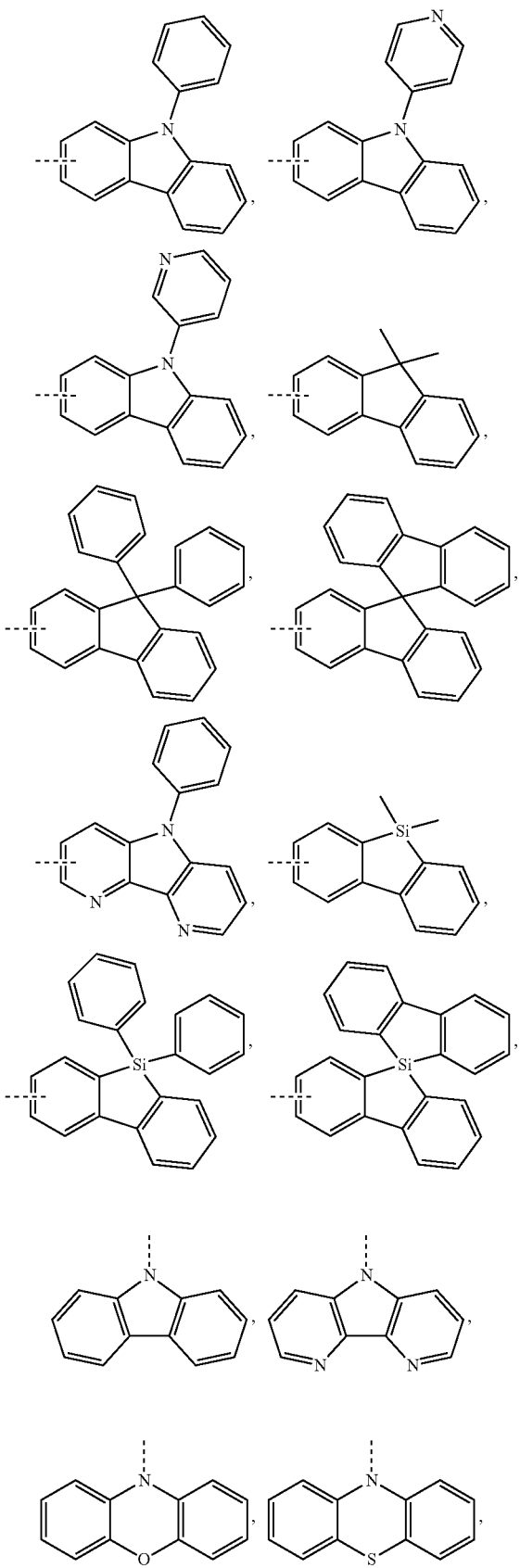

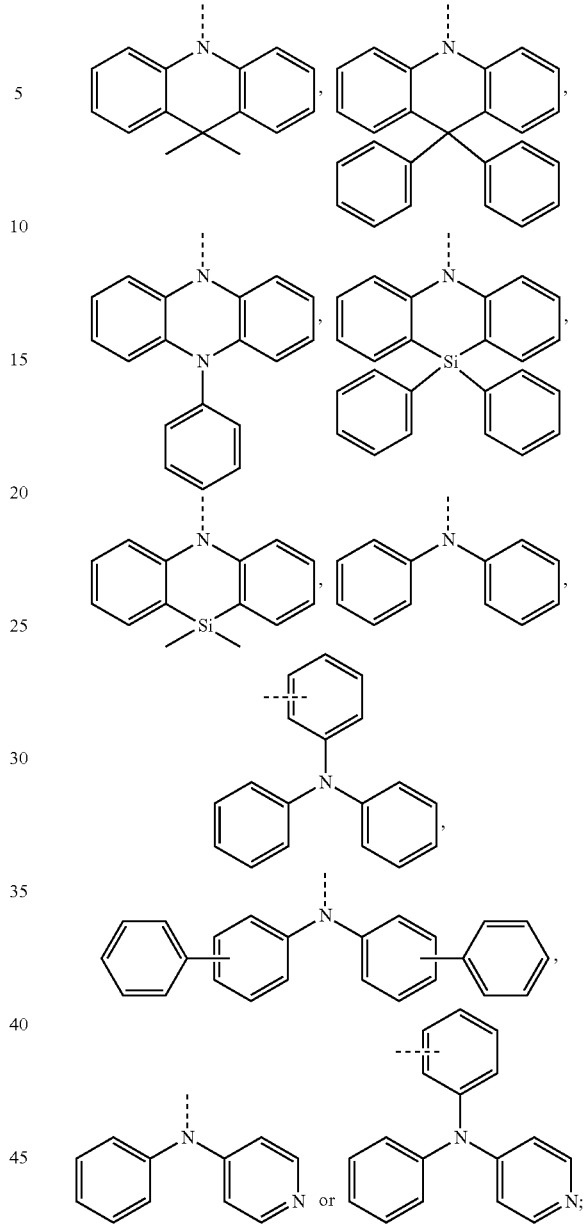

wherein the dashed line represents a linkage site of the group; and wherein the substituents are selected from at least one of deuterium, C1-C10 linear or branched alkyl, C3-C10 cycloalkyl, C1-C10 alkoxy, C6-C20 aryl, C2-C20 heteroaryl, or C6-C20 arylamine.

7. The organic compound according to claim 1, wherein $R_1$, $R_2$, $R_1'$ and $R_2'$ are each independently selected from any one of deuterium, halogen, cyano, C1-C10 linear or branched alkyl, C1-C10 alkoxy, substituted or unsubstituted C6-C20 aryl, substituted or unsubstituted C3-C20 heteroaryl, substituted or unsubstituted C6-C20 arylamine or substituted or unsubstituted C6-C20 heteroarylamine; and wherein the substituted substituents in $R_1$, $R_2$, $R_1'$ and $R_2'$ are each independently selected from at least one of deuterium, C1-C10 linear or branched alkyl, C3-C10 cycloalkyl, C1-C10 alkoxy, C6-C20 aryl, C2-C20 heteroaryl, or C6-C20 arylamine.

8. The organic compound according to claim 7, wherein R₁, R₂, R₁' and R₂' are each independently selected from any one of the following groups:

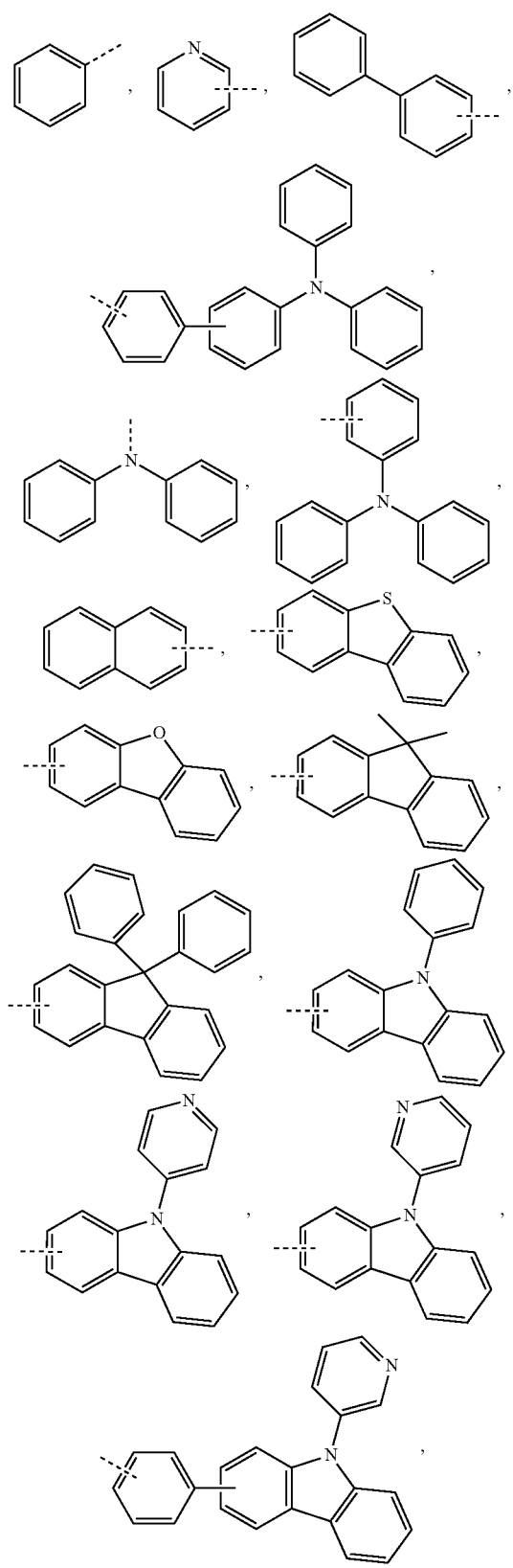

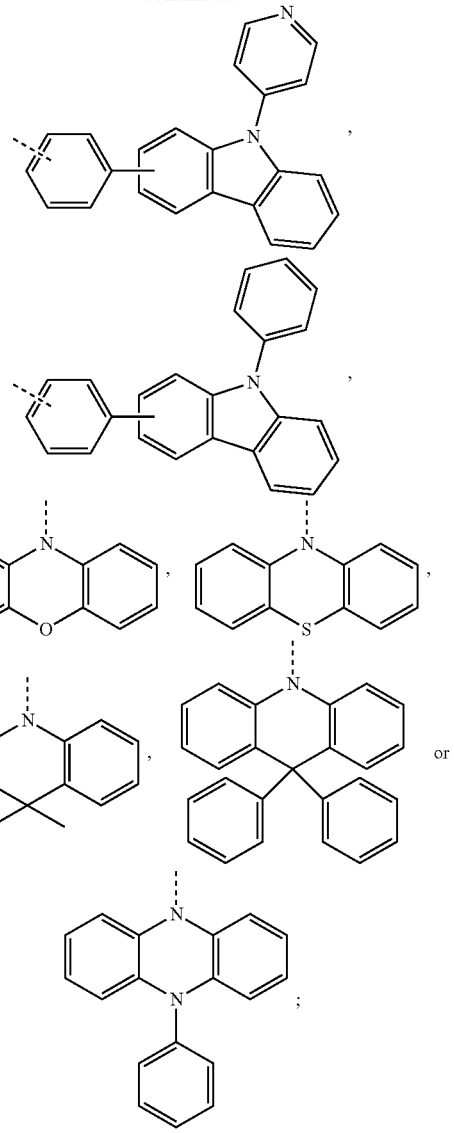

wherein the dashed line represents a linkage site of the group.

9. The organic compound according to claim 1, wherein R₃, R₄, R₅, R₆ and R₇ are each independently selected from any one of C1-C10 linear or branched alkyl, substituted or unsubstituted C6-C20 aryl, or substituted or unsubstituted C3-C20 heteroaryl; and
wherein the substituted substituents are each independently selected from at least one of deuterium, C1-C10 linear or branched alkyl, C3-C10 cycloalkyl, C1-C10 alkoxy, C6-C20 aryl, C2-C20 heteroaryl or C6-C20 arylamine.

10. The organic compound according to claim 9, wherein R₃, R₄, R₅, R₆ and R₇ are each independently selected from any one of methyl, phenyl, biphenyl, terphenyl, naphthyl or pyridyl.

11. The organic compound according to claim 1, wherein n₁, n₂, n₃ and n₄ are each independently 0, 1 or 2.

12. The organic compound according to claim 1, wherein the organic compound is selected from any one of the following Compound M1 to Compound M140:

M1
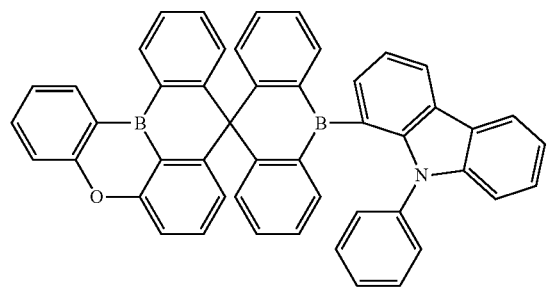
M2
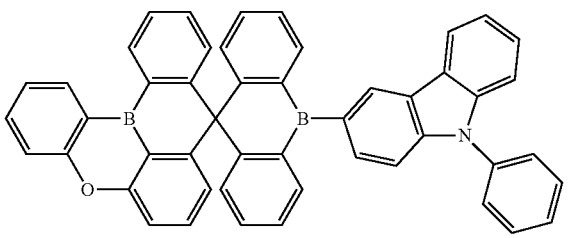
M3
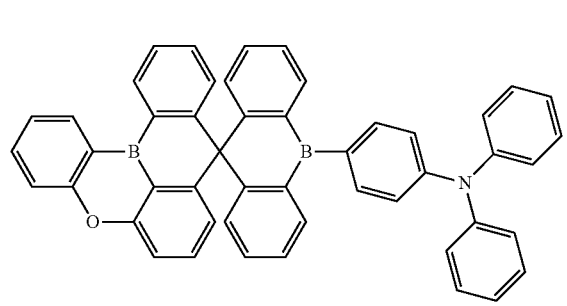
M4
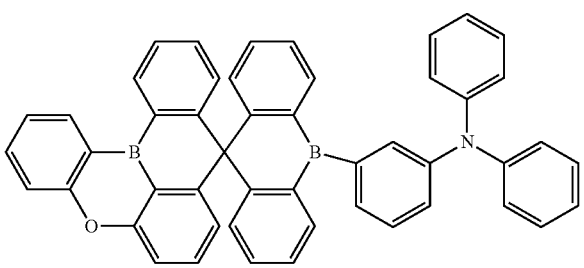
M5
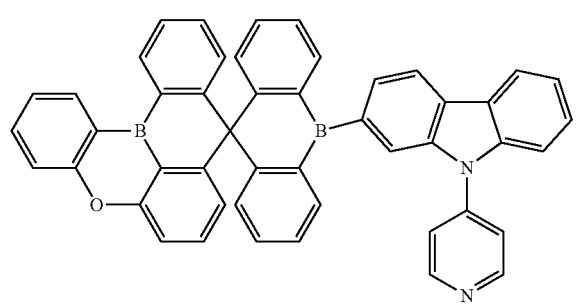
M6
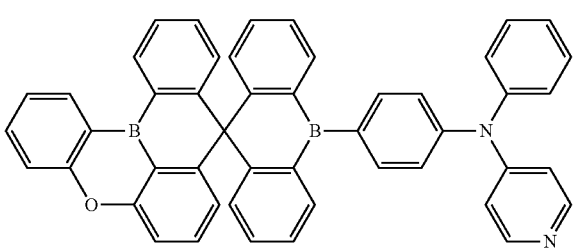
M7
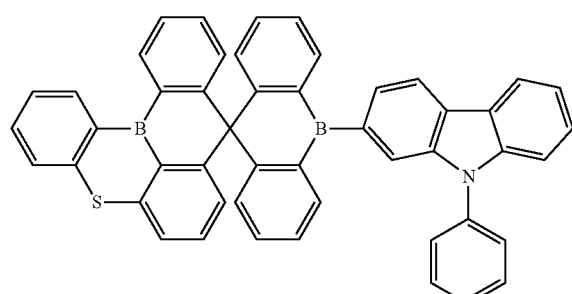
M8
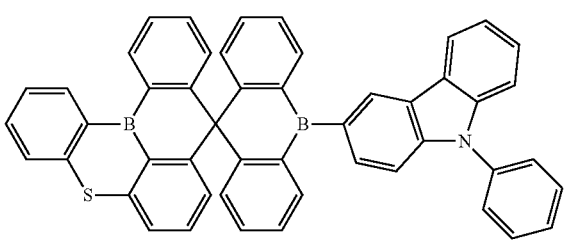
M9
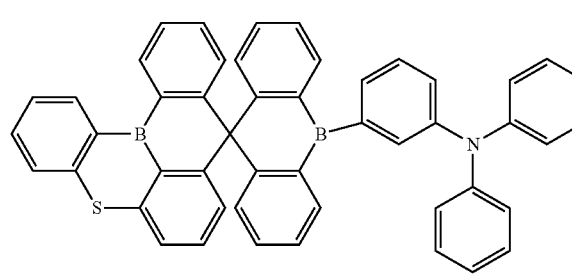
M10
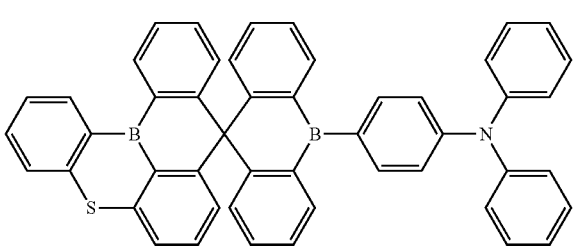

-continued
M11
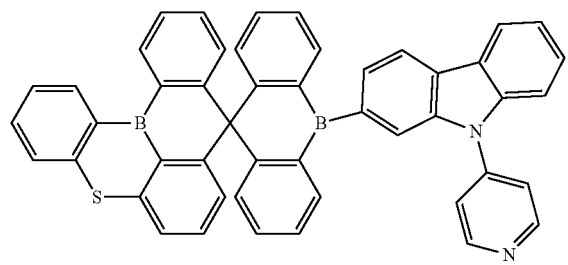
M12
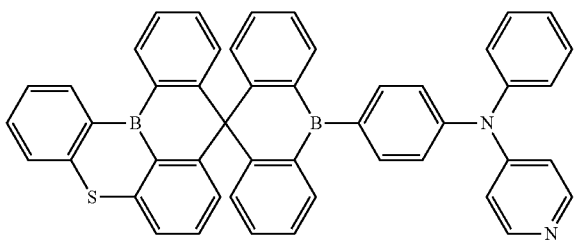
M13
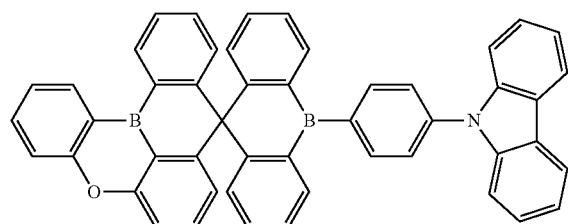
M14
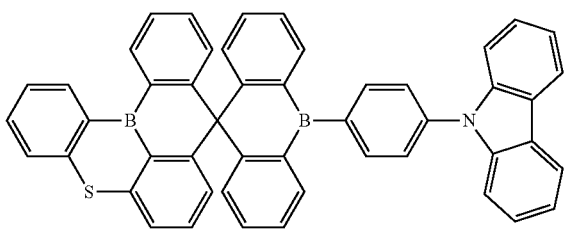
M15
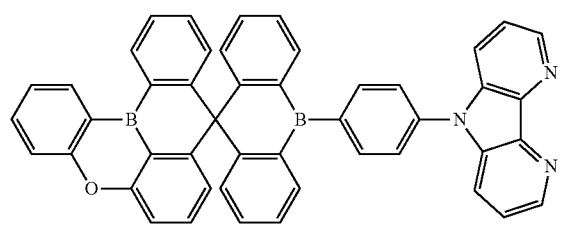
M16
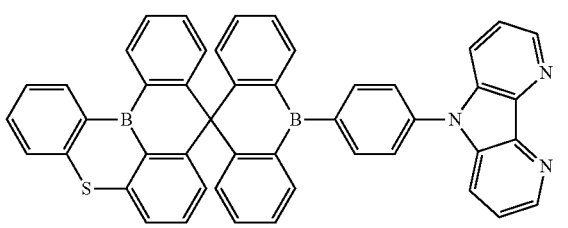
M17
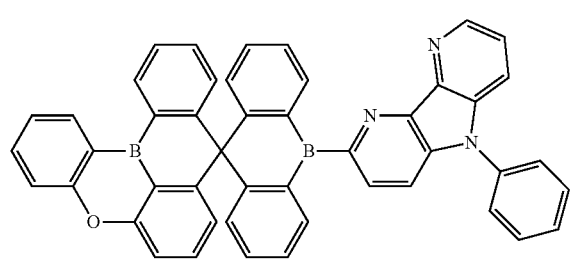
M18
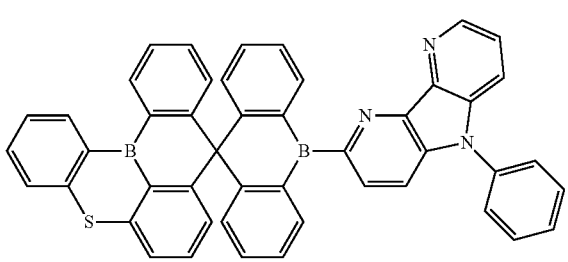
M19
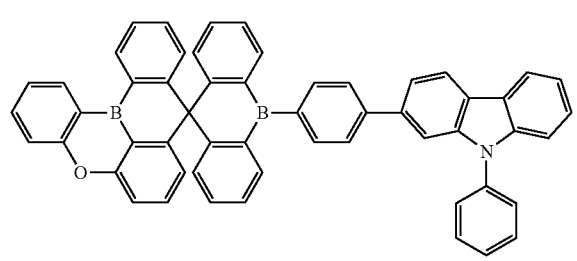
M20
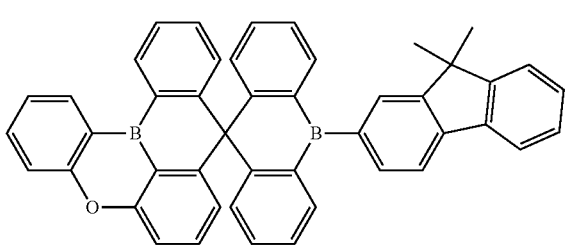
M21
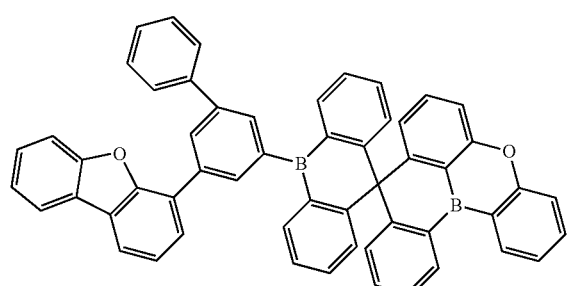
M22
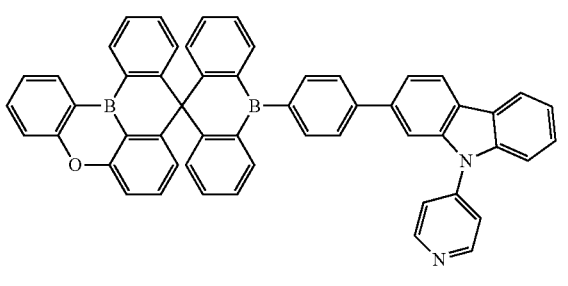

-continued
M23
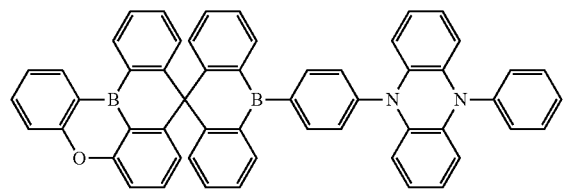
M24
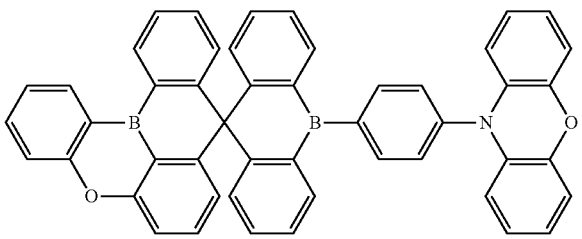
M25
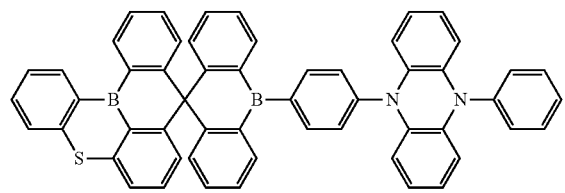
M26
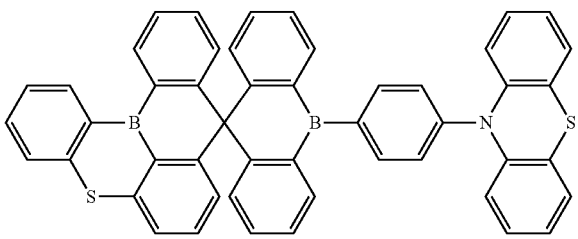
M27
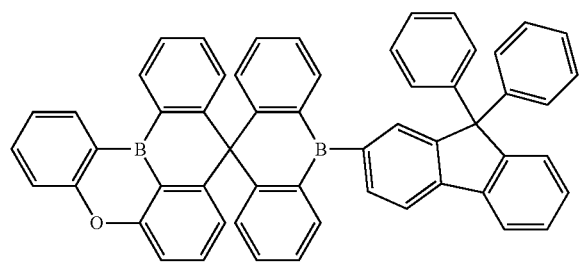
M28
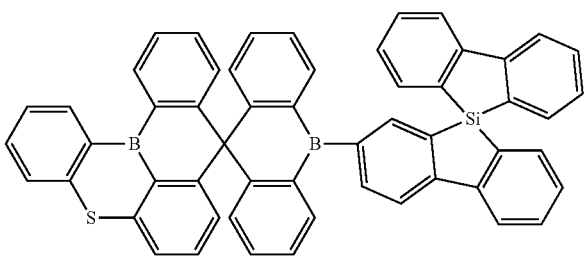
M29
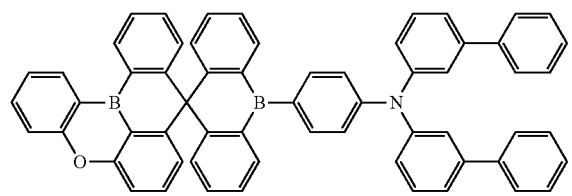
M30
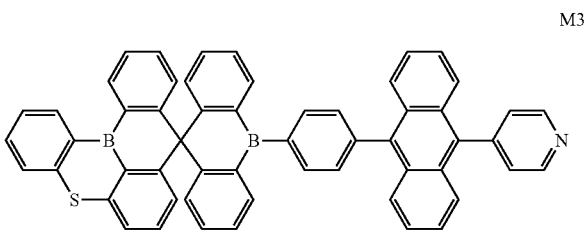
M31
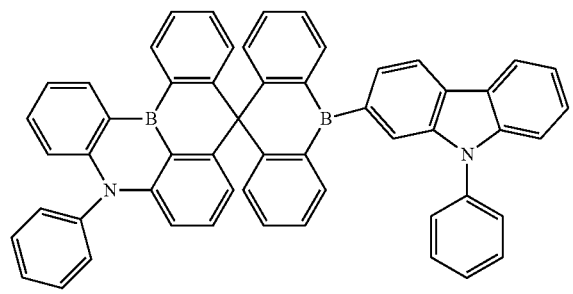
M32
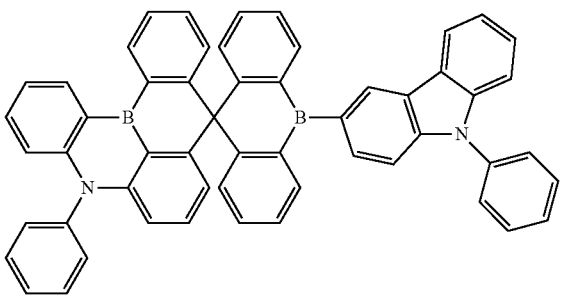

-continued
M33
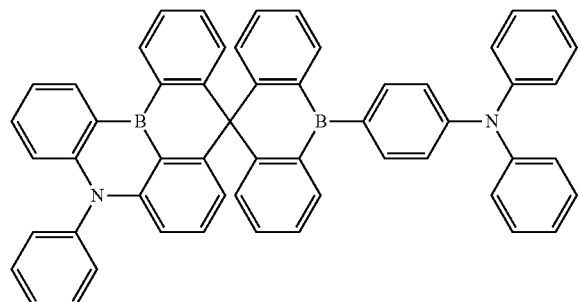
M34
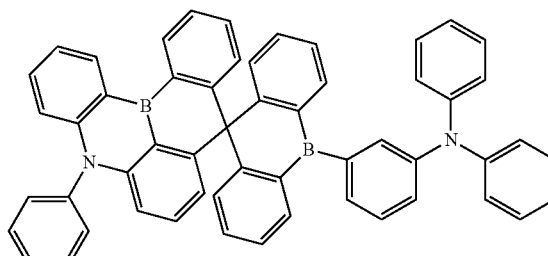
M35
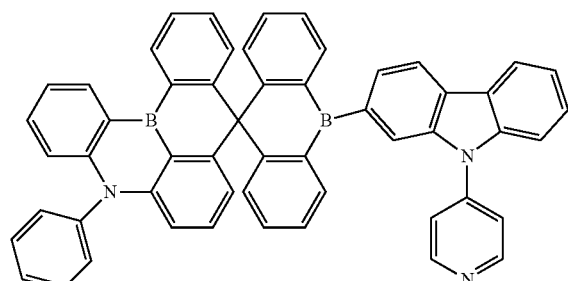
M36
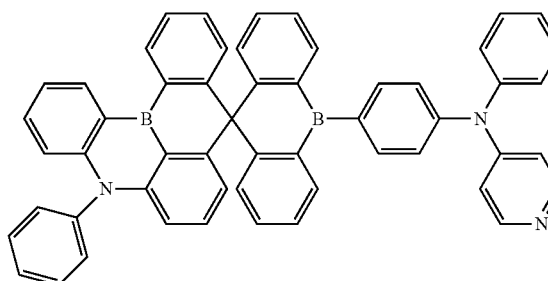
M37
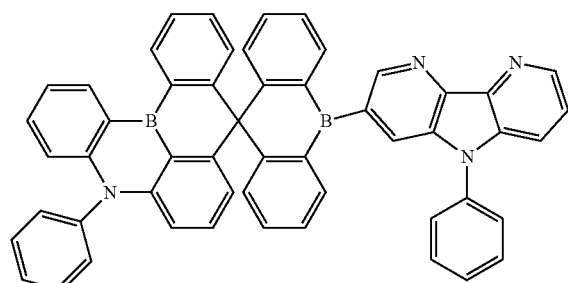
M38
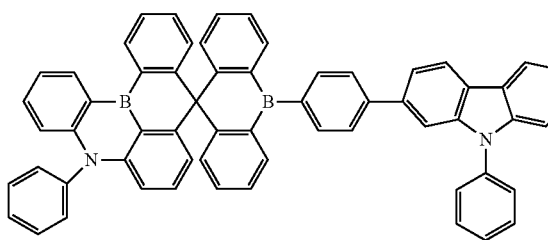
M39
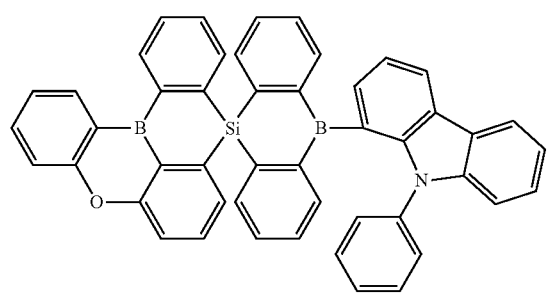
M40
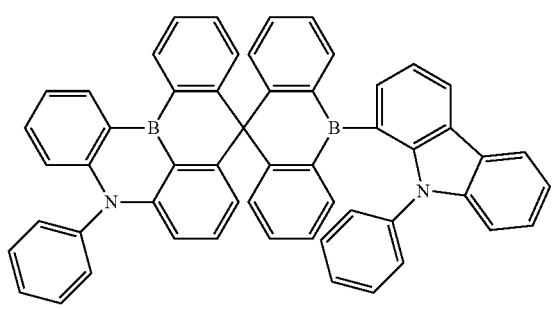
M41
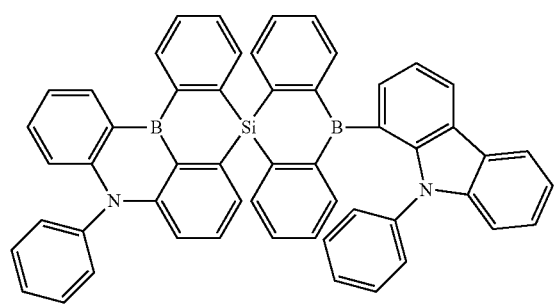

M42
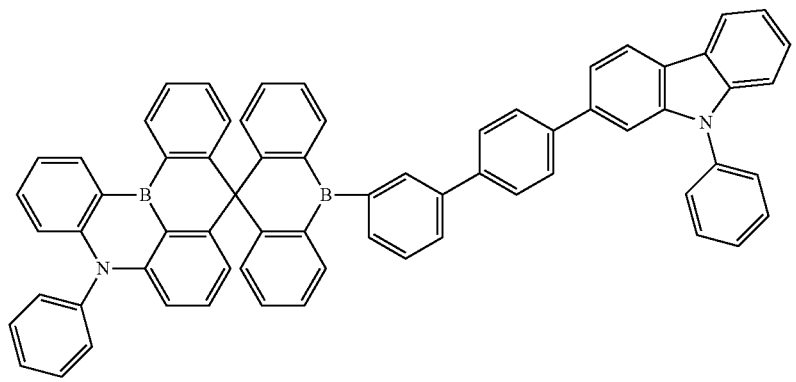
M43
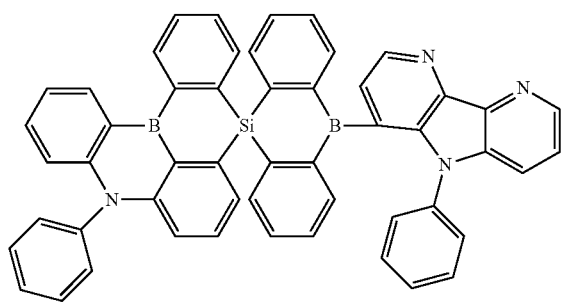
M44
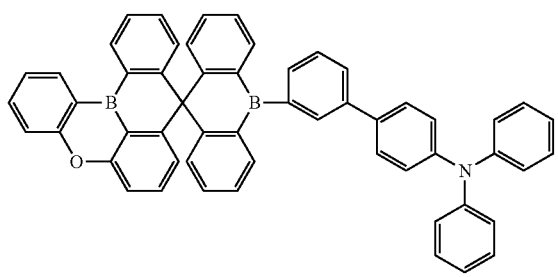
M45
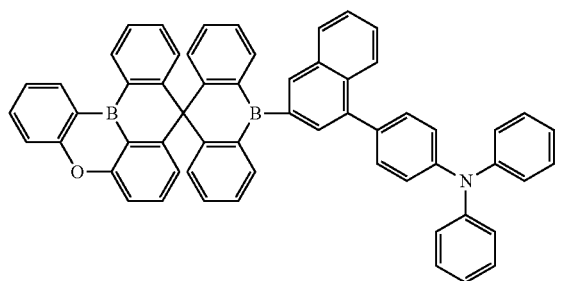
M46
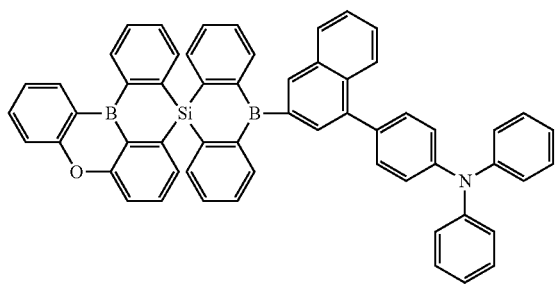
M47
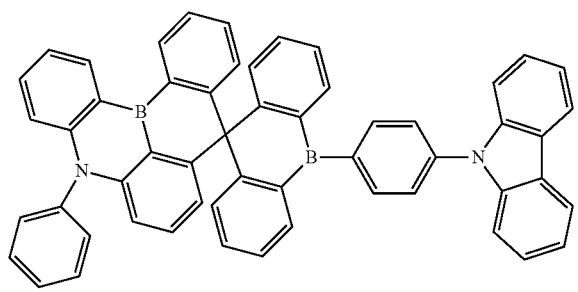
M48
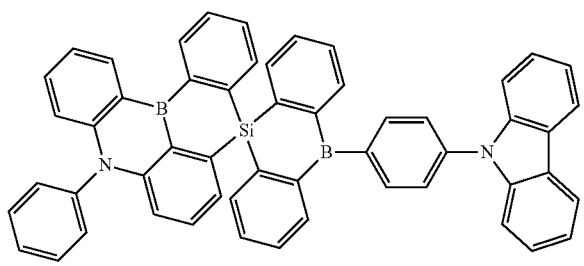
M49
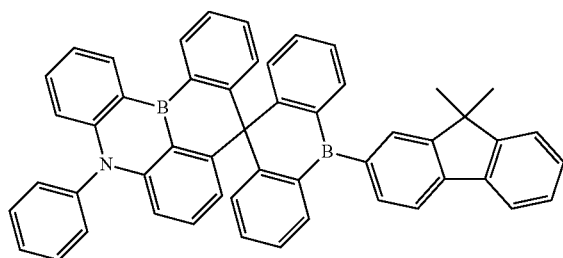
M50
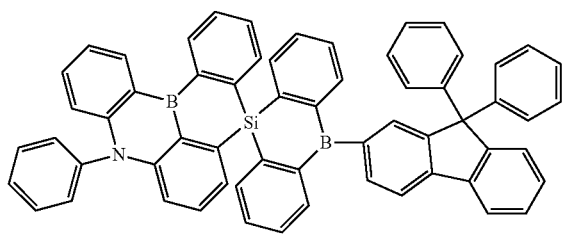

-continued
M51
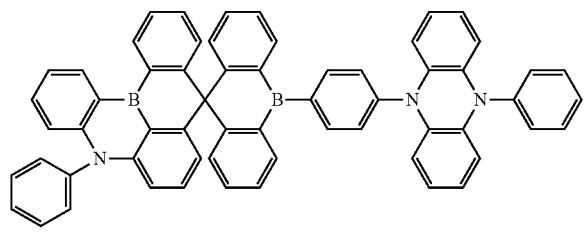
M52
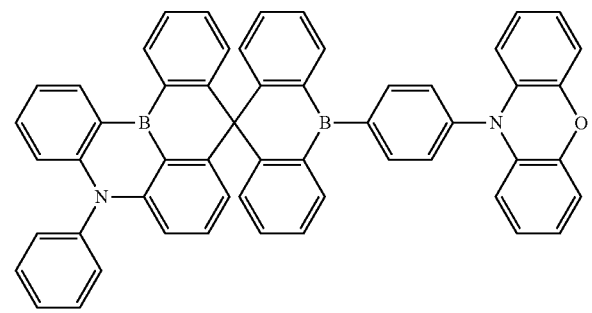
M53
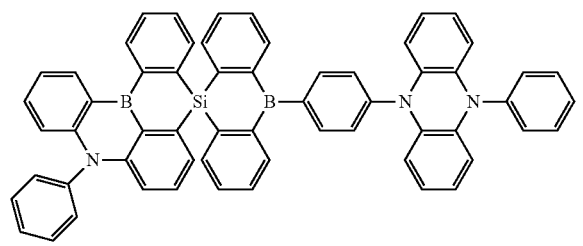
M54
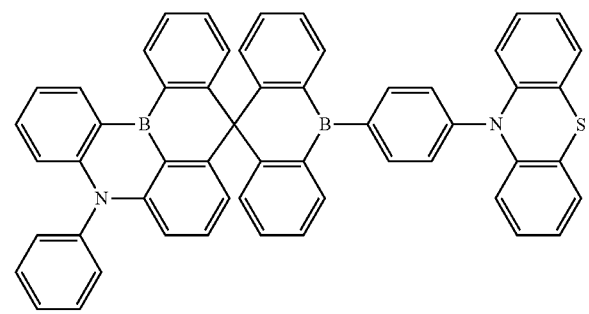
M55
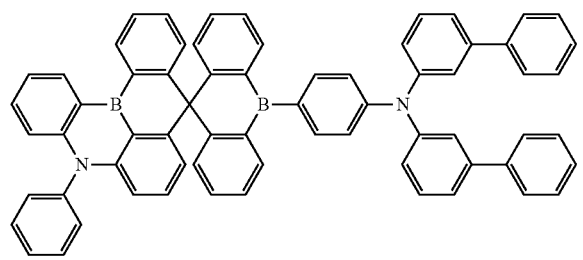
M56
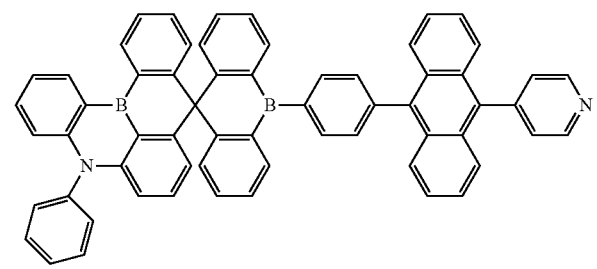
M57
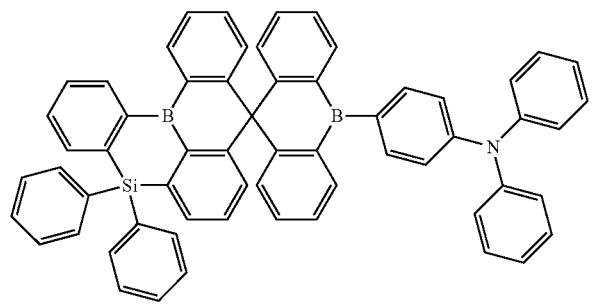
M58
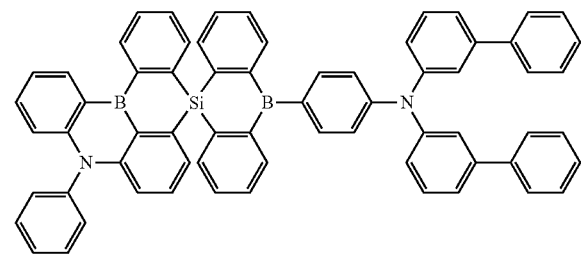
M59
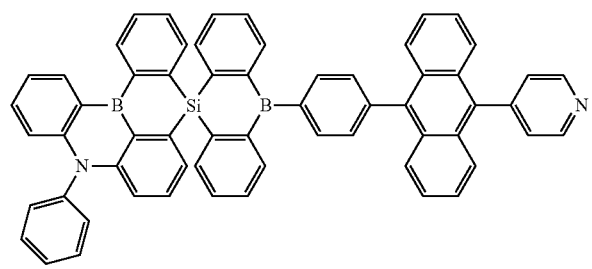
M60
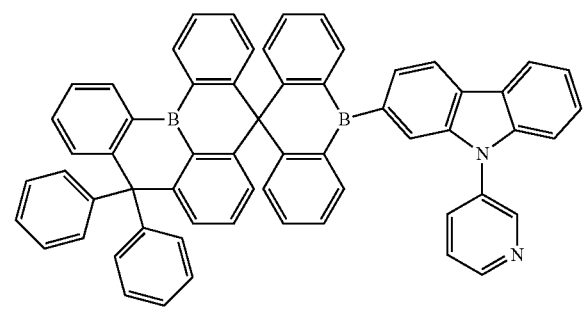

-continued
M61
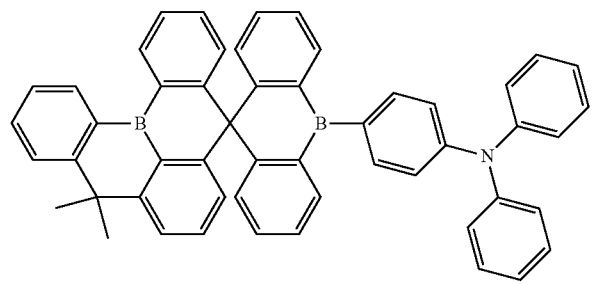
M62
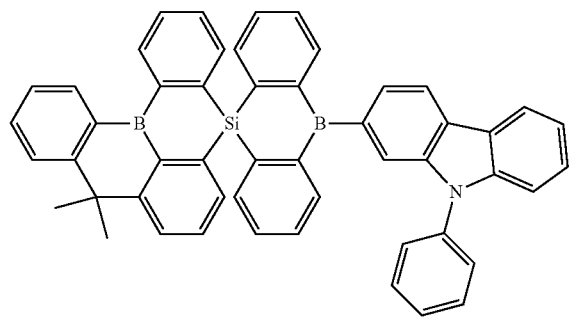
M63
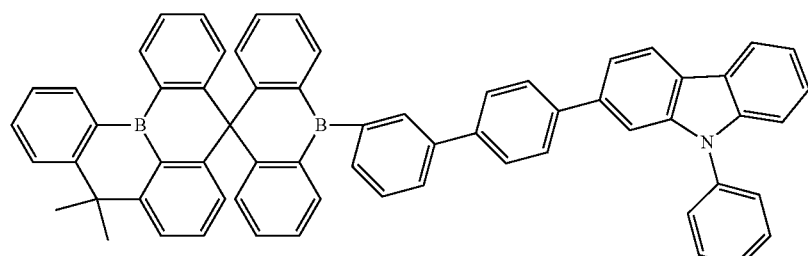
M64
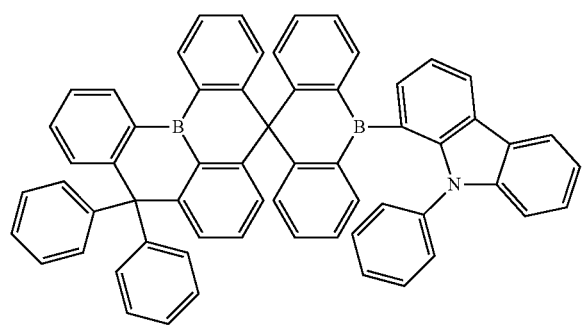
M65
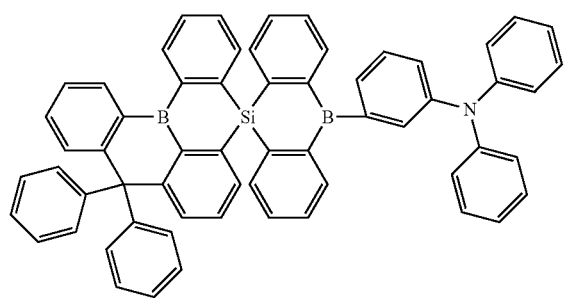
M66
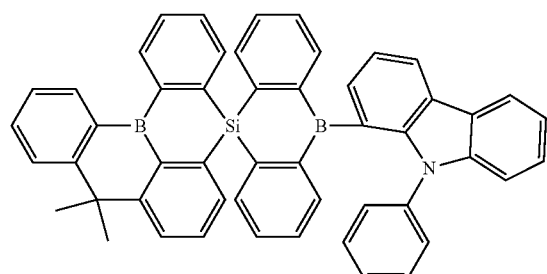
M67
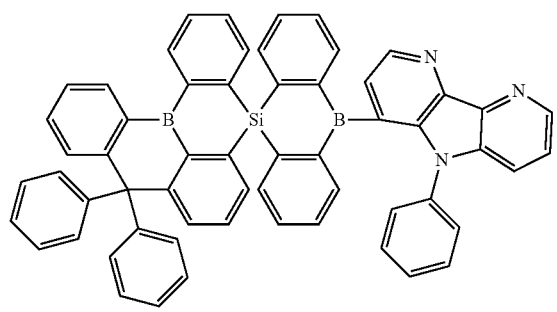
M68
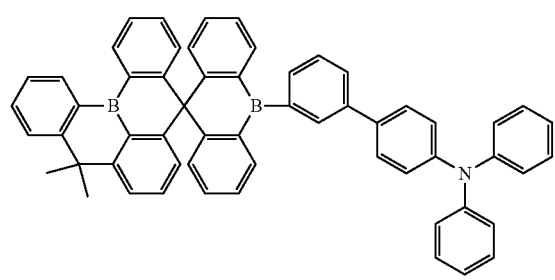
M69
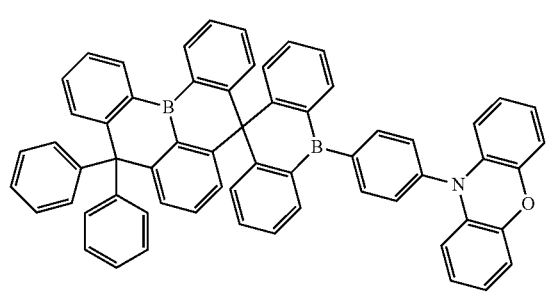

-continued
M70
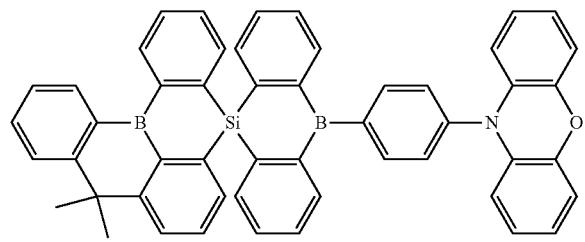
M71
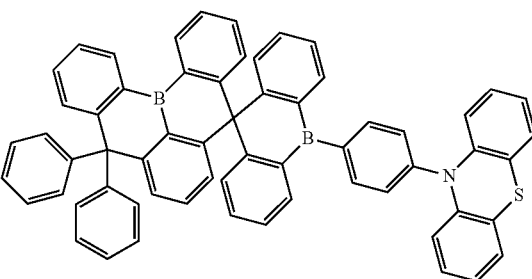
M72
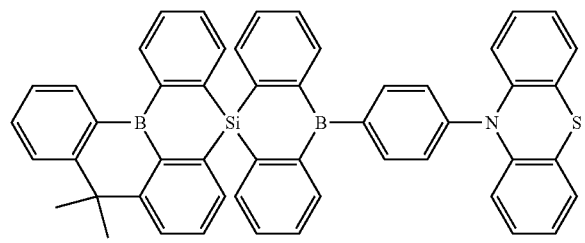
M73
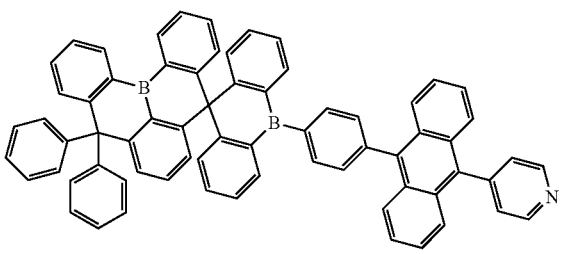
M74
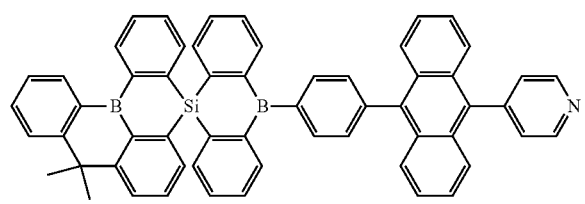
M75
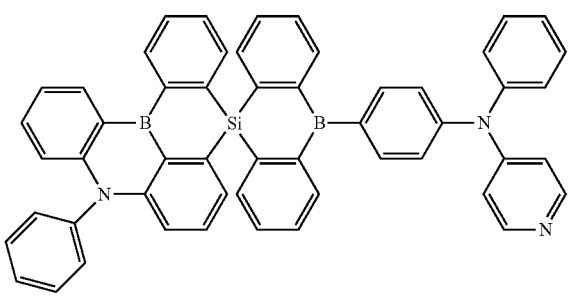
M76
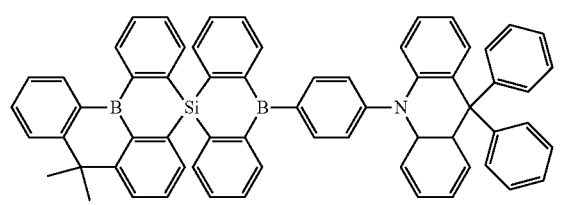
M77
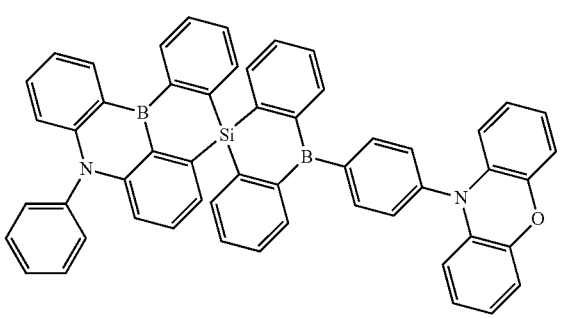
M78
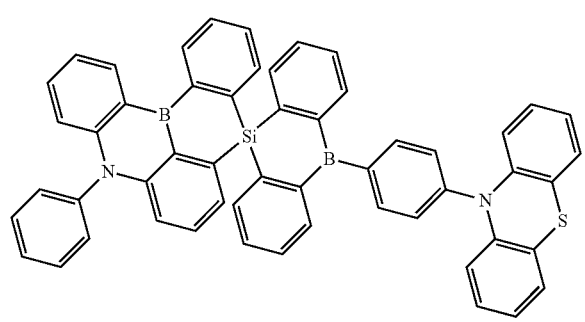
M79
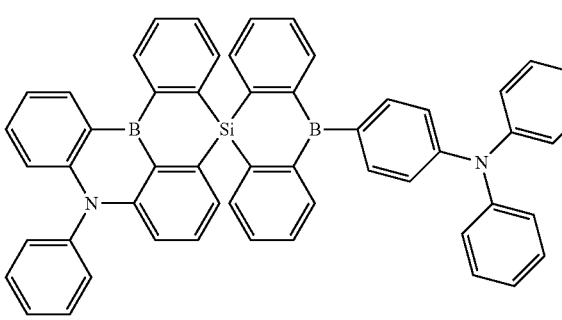

-continued
M80
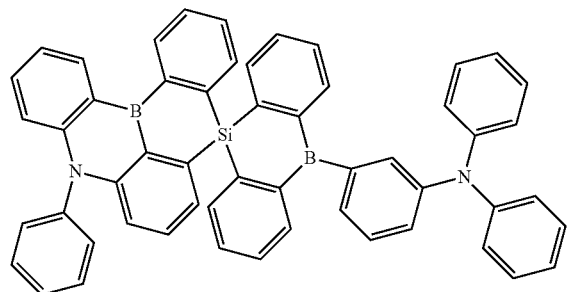
M81
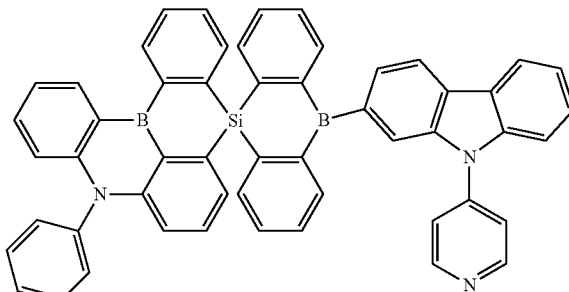
M82
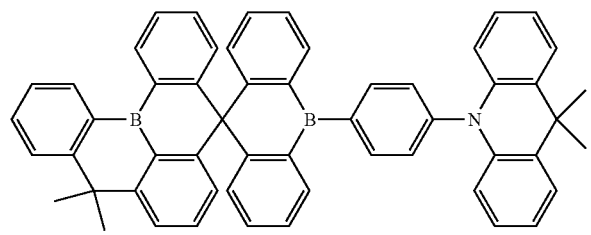
M83
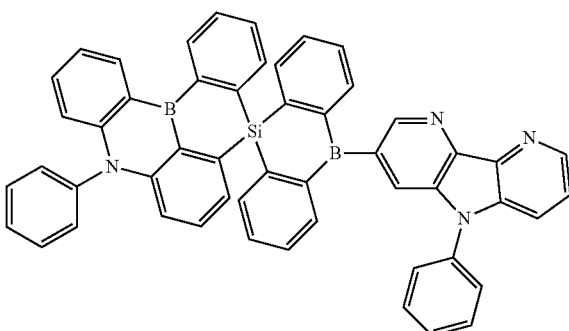
M84
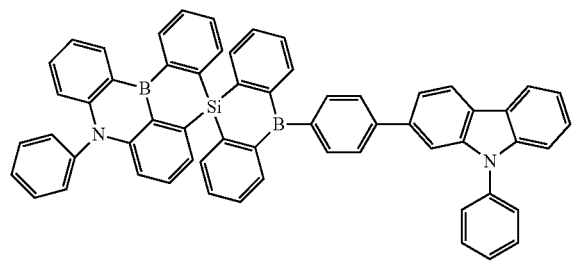
M85
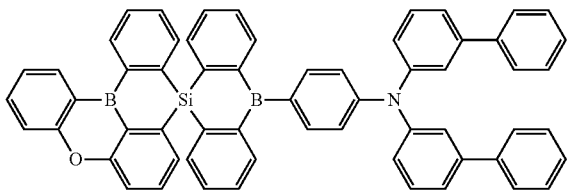
M86
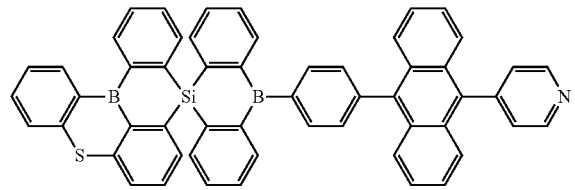
M87
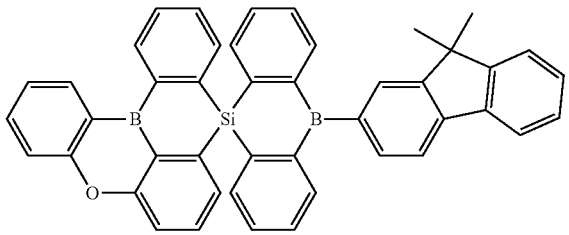
M88
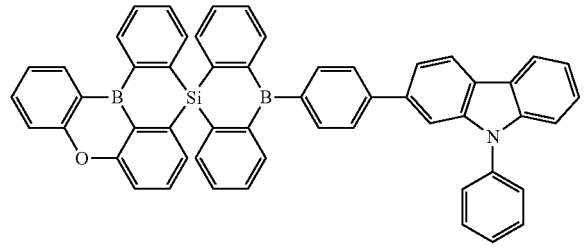
M89
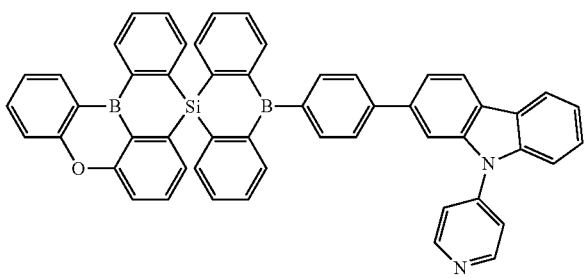

-continued
M90
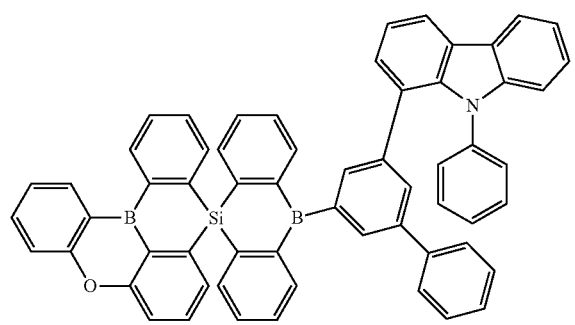
M91
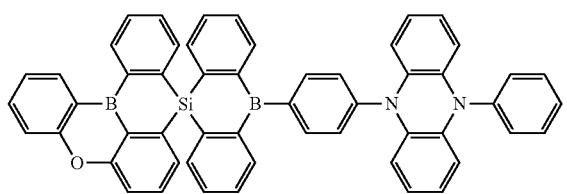
M92
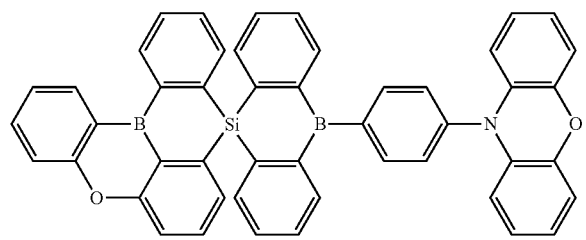
M93
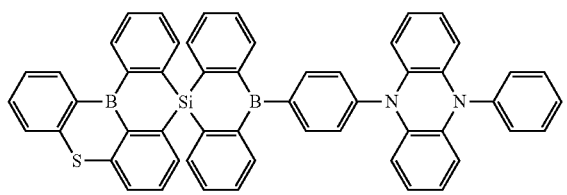
M94
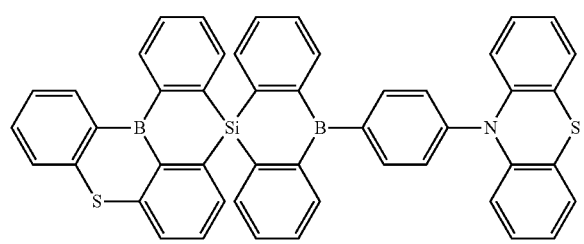
M95
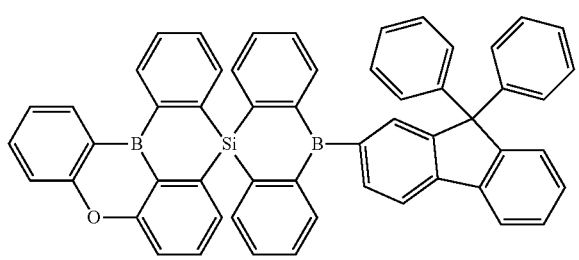
M96
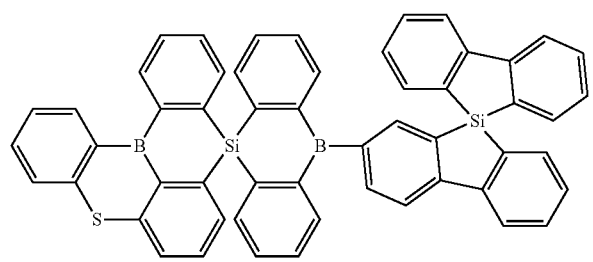
M97
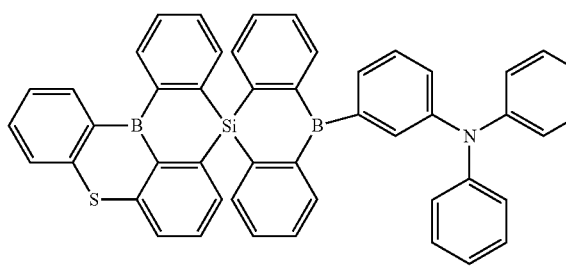
M98
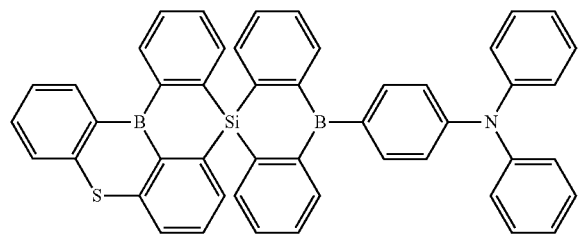
M99
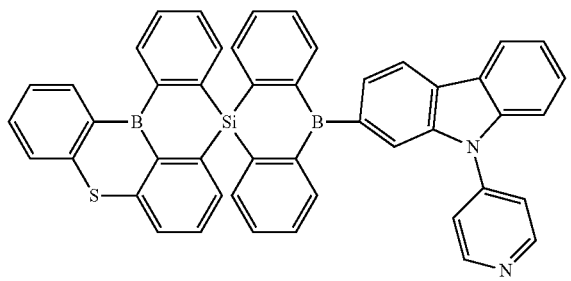

-continued
M100
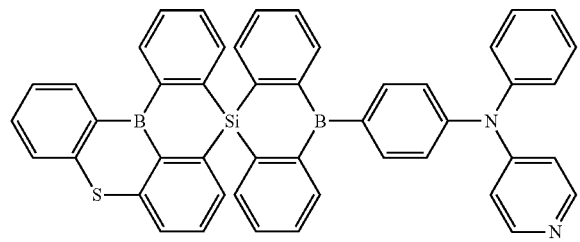
M101
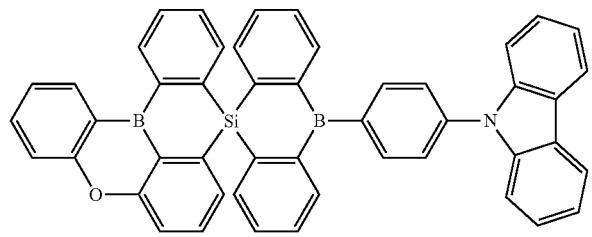
M102
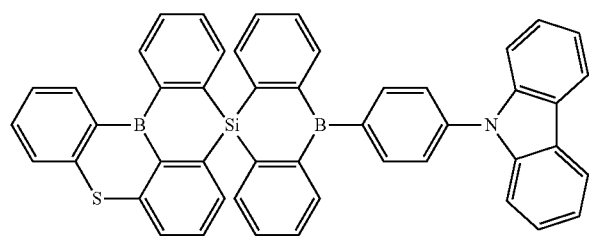
M103
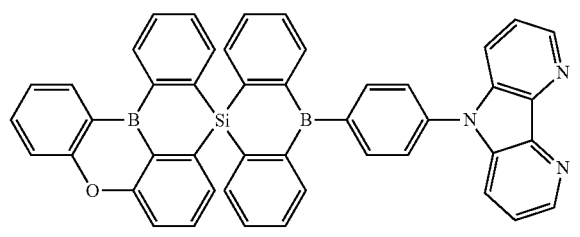
M104
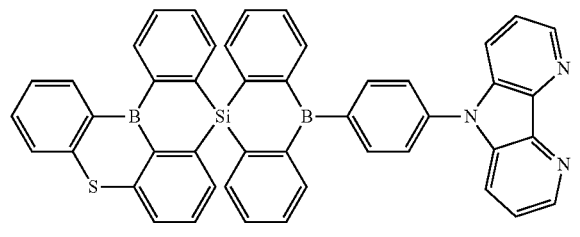
M105
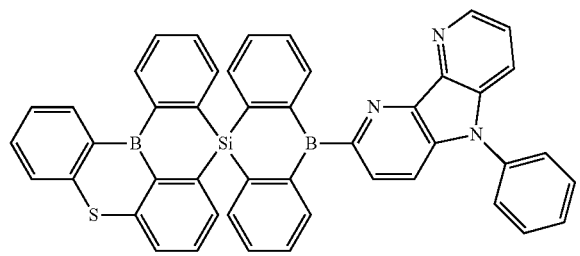
M106
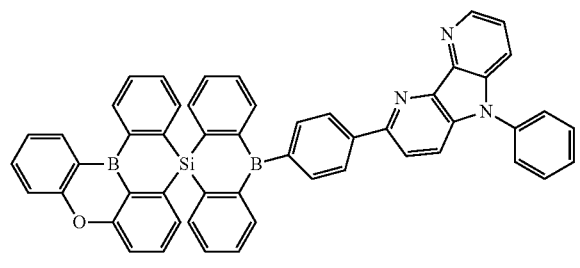
M107
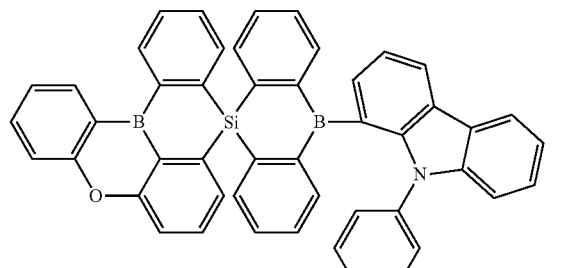
M108
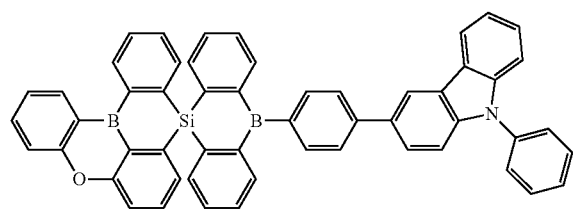
M109
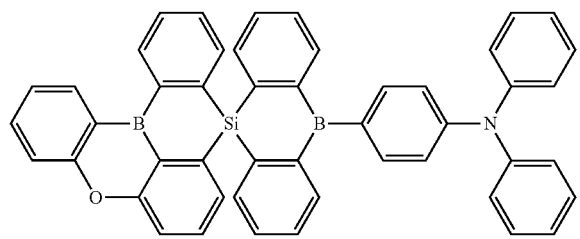

-continued
M110
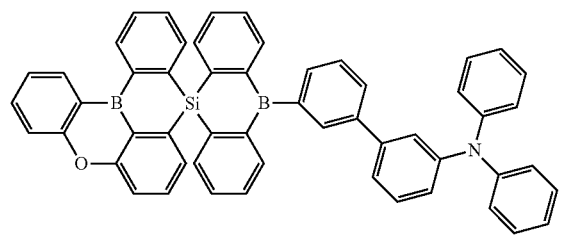
M111
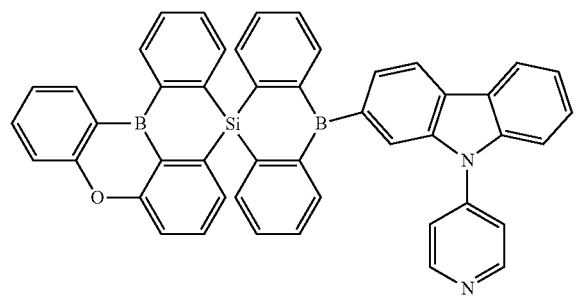
M112
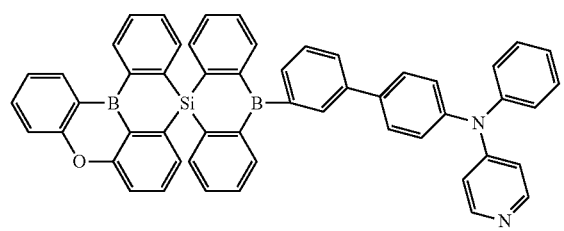
M113
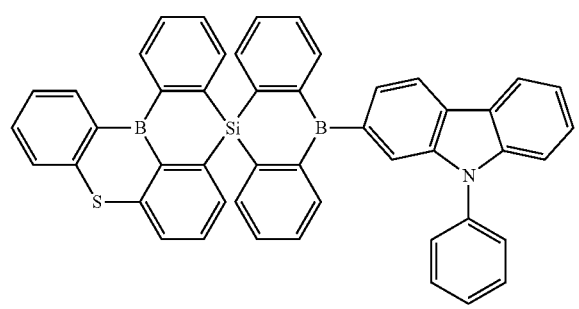
M114
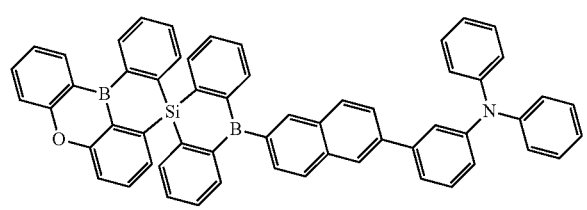
M115
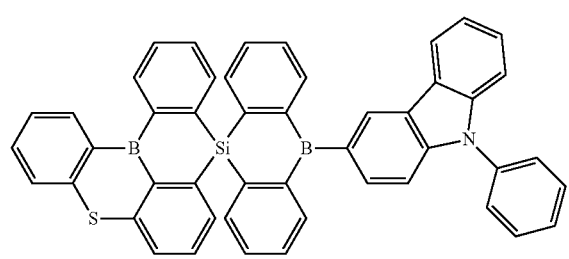
M116
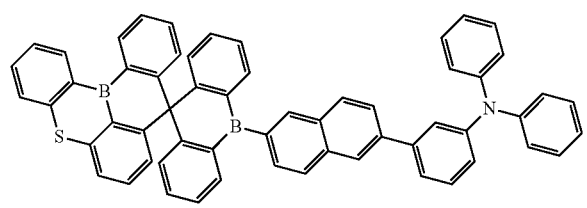
M117
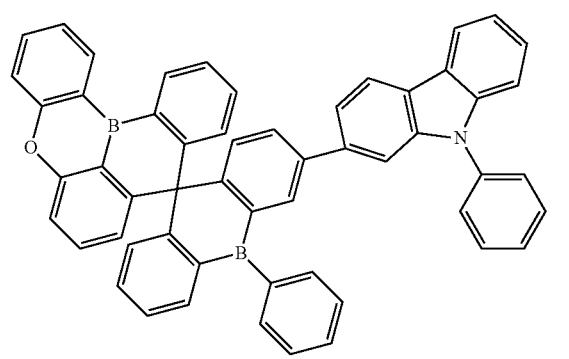

-continued
M118
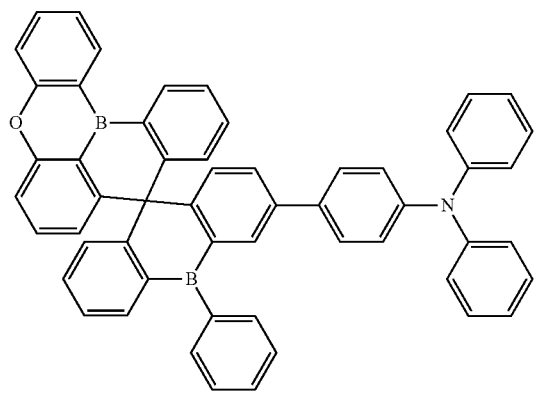
M119
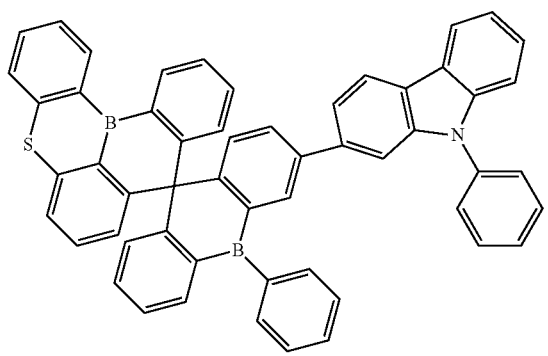
M120
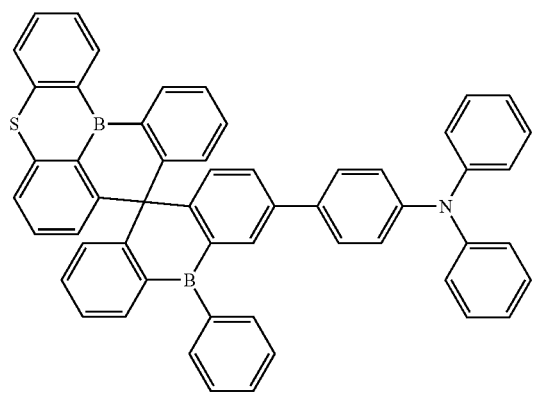
M121
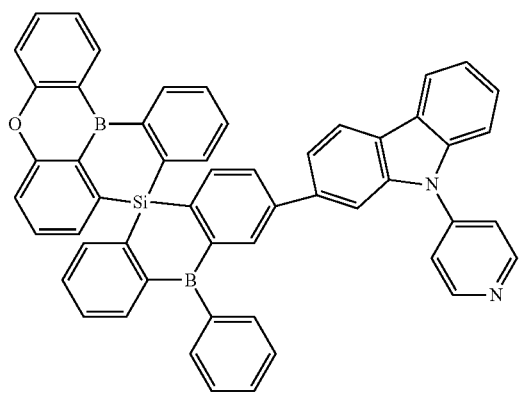
M122
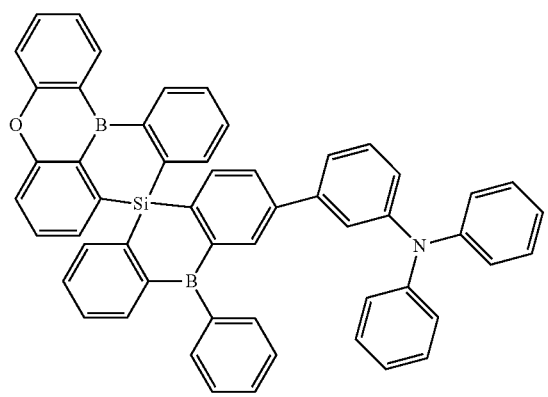
M123
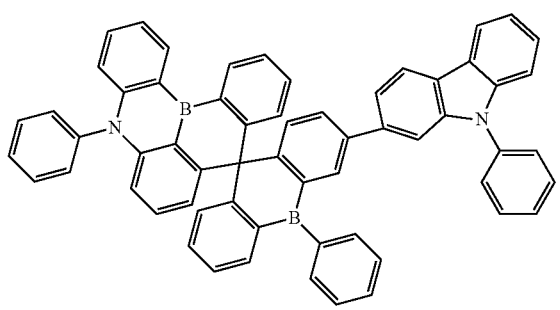
M124
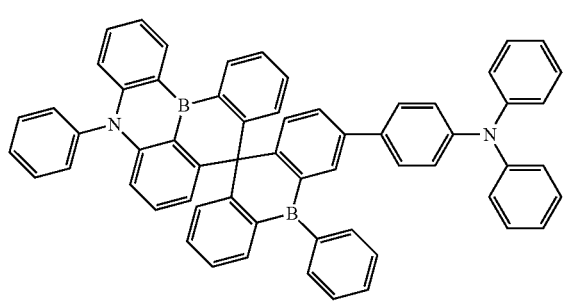
M125
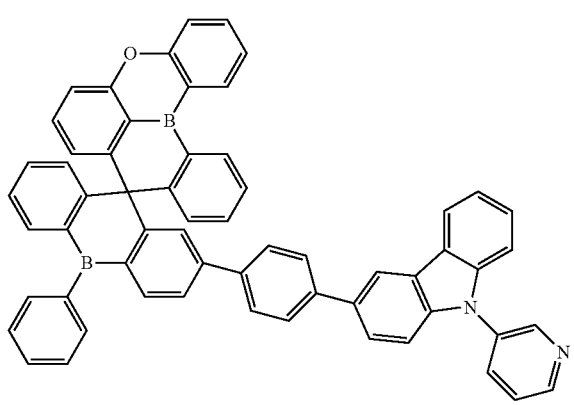

-continued
M126
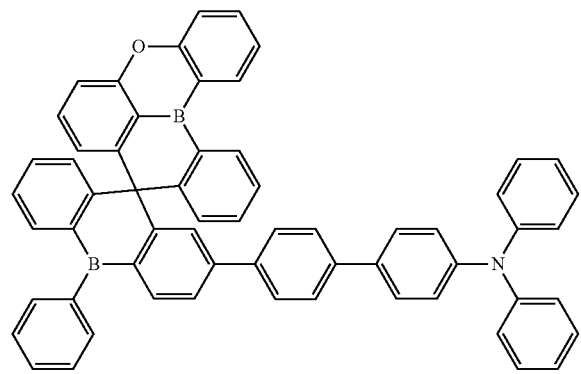
M127
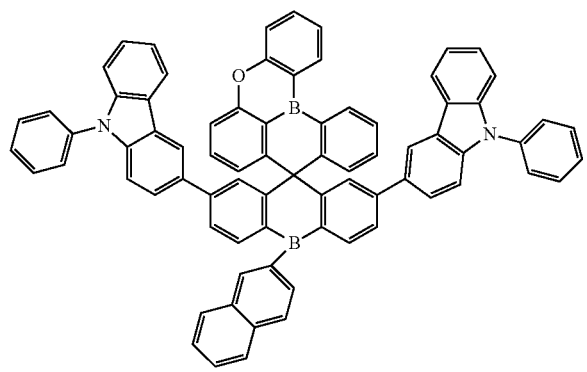
M128
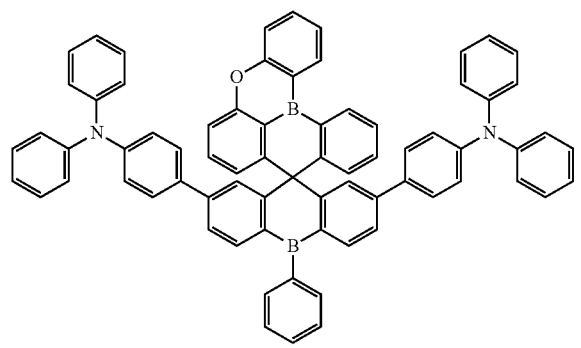
M129
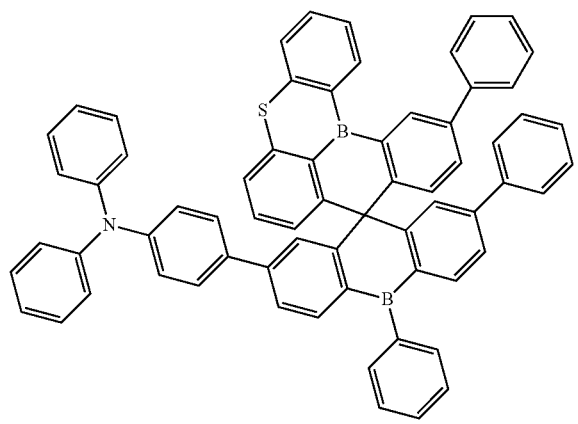
M130
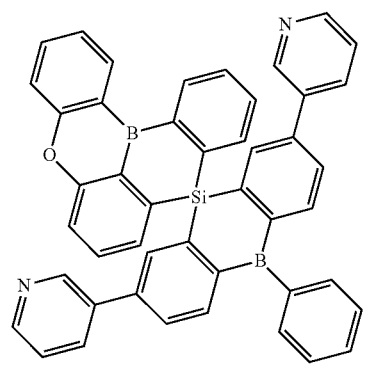
M131
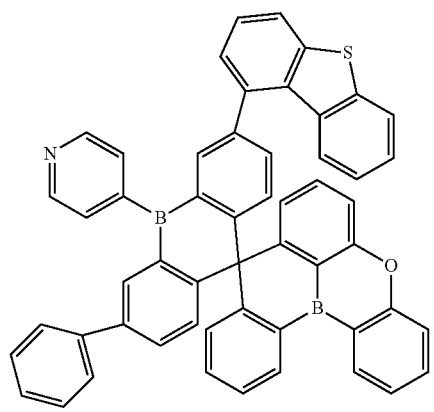

-continued
M132
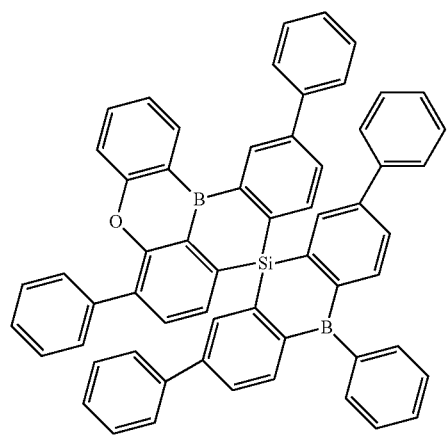
M133
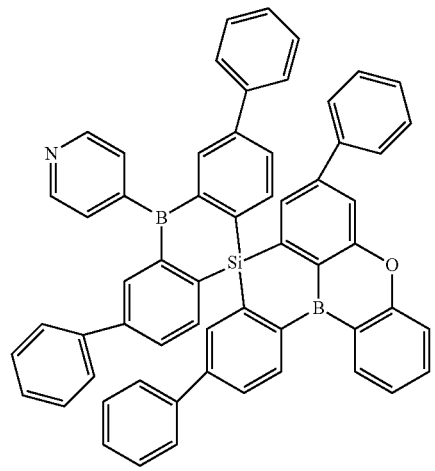
M134
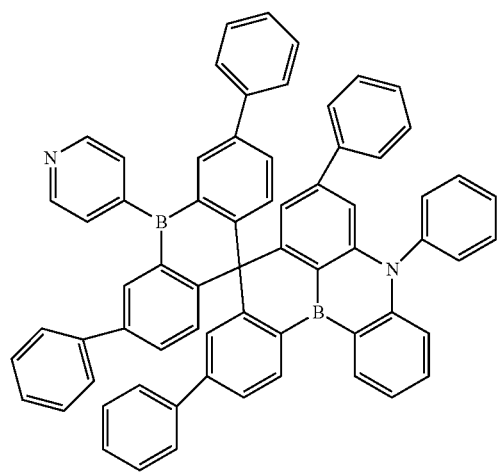
M135
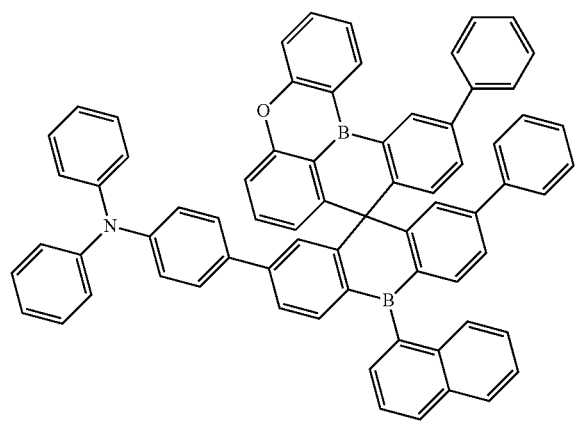
M136
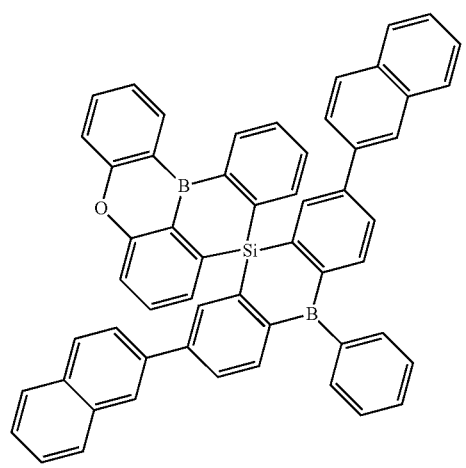
M137
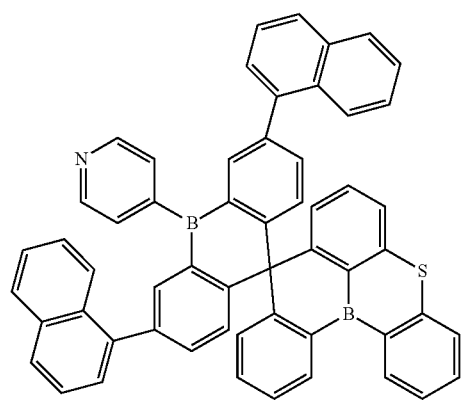

-continued

M138
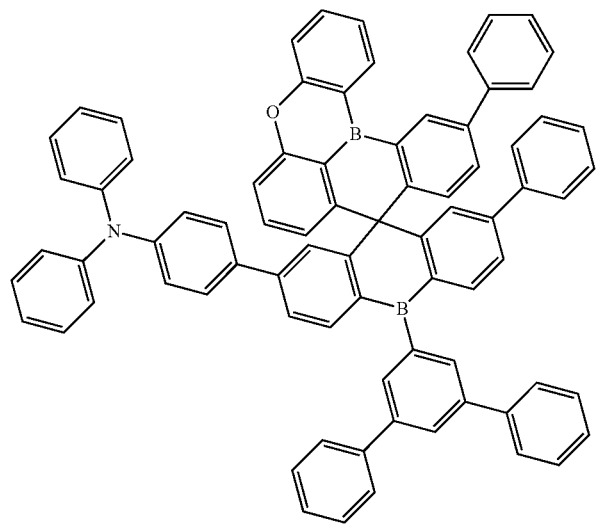

M139
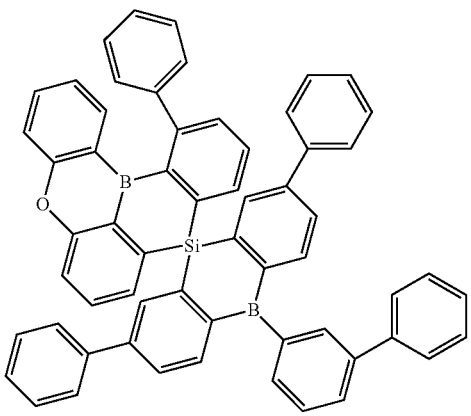

M140
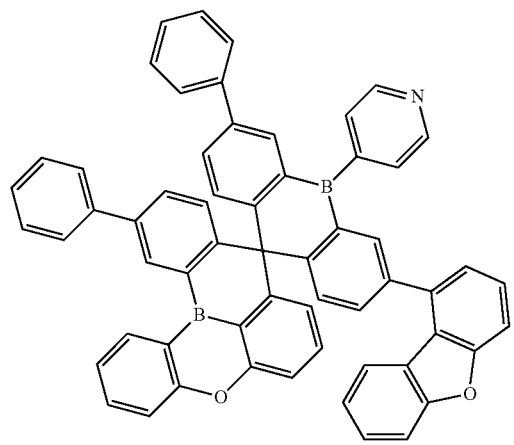

13. An organic light-emitting diode (OLED) device, comprising an anode, a cathode and an organic thin film disposed between the anode and the cathode, wherein the organic thin film comprises the organic compound according to claim 1.

14. The OLED device according to claim 13, wherein the organic thin film comprises a light-emitting layer, wherein the light-emitting layer comprises the organic compound.

15. The OLED device according to claim 14, wherein the organic compound is used as a guest material of the light-emitting layer.

16. A display panel, comprising the OLED device according to claim 13.

* * * * *